United States Patent
Lin et al.

(10) Patent No.: US 12,217,826 B2
(45) Date of Patent: Feb. 4, 2025

(54) MEMORY ARRAY TEST STRUCTURE AND METHOD OF FORMING THE SAME

(71) Applicant: Taiwan Semiconductor Manufacturing Co., Ltd., Hsinchu (TW)

(72) Inventors: Meng-Han Lin, Hsinchu (TW); Sai-Hooi Yeong, Zhubei (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/443,997

(22) Filed: Feb. 16, 2024

(65) Prior Publication Data

US 2024/0194234 A1 Jun. 13, 2024

Related U.S. Application Data

(60) Continuation of application No. 18/302,560, filed on Apr. 18, 2023, now Pat. No. 11,935,624, which is a
(Continued)

(51) Int. Cl.
*G11C 8/08* (2006.01)
*G11C 29/02* (2006.01)
(Continued)

(52) U.S. Cl.
CPC ............... *G11C 8/08* (2013.01); *G11C 29/025* (2013.01); *G11C 29/12* (2013.01); *G11C 29/50* (2013.01);
(Continued)

(58) Field of Classification Search
CPC ......... G11C 8/08; G11C 29/025; G11C 29/12; G11C 29/50; G11C 2029/1202;
(Continued)

(56) References Cited

U.S. PATENT DOCUMENTS 10,679,721 B2   6/2020   Kim et al.
11,195,852 B2  12/2021   Oh et al.
(Continued)

FOREIGN PATENT DOCUMENTS

CN   1117555459 A   10/2020
CN    112786615 A    5/2021
KR    970030578 A    6/1997

*Primary Examiner* — Fernando Hidalgo
(74) *Attorney, Agent, or Firm* — Slater Matsil, LLP

(57) ABSTRACT

A test structure for 3D memory arrays and methods of forming the same are disclosed. In an embodiment, a memory array includes a first word line over a semiconductor substrate and extending in a first direction; a second word line over the first word line and extending in the first direction; a memory film contacting the first word line and the second word line; an oxide semiconductor (OS) layer contacting a first source line and a first bit line, the memory film being between the OS layer and each of the first word line and the second word line; and a test structure over the first word line and the second word line, the test structure including a first conductive line electrically coupling the first word line to the second word line, the first conductive line extending in the first direction.

20 Claims, 55 Drawing Sheets

Related U.S. Application Data division of application No. 17/397,414, filed on Aug. 9, 2021, now Pat. No. 11,657,863.

(60) Provisional application No. 63/211,765, filed on Jun. 17, 2021.

(51) Int. Cl.
   *G11C 29/12* (2006.01)
   *G11C 29/50* (2006.01)
   *H01L 21/822* (2006.01)

(52) U.S. Cl.
   CPC .. *H01L 21/8221* (2013.01); *G11C 2029/1202* (2013.01)

(58) Field of Classification Search
   CPC ....... G11C 29/04; G11C 5/025; G11C 11/223; G11C 2029/0403; G11C 29/54; H01L 21/8221; H10B 43/20; H10B 51/50; H10B 51/10; H10B 51/20; H10B 51/00; H10B 51/30; H10B 51/40
   USPC .......................................................... 365/201
   See application file for complete search history.

(56) References Cited

U.S. PATENT DOCUMENTS

| | | |
|---|---|---|
| 11,362,104 B2 | 6/2022 | Kang et al. |
| 2006/0221690 A1 | 10/2006 | Rehm |
| 2017/0103993 A1 | 4/2017 | Lee et al. |
| 2018/0294277 A1* | 10/2018 | Kim ........................ H10B 43/50 |
| 2020/0035701 A1 | 1/2020 | Huang et al. |
| 2020/0194455 A1 | 6/2020 | Cho et al. |
| 2020/0381035 A1* | 12/2020 | Park ........................ G11C 5/025 |
| 2021/0165602 A1* | 6/2021 | Zhang .................... G06F 3/0655 |
| 2021/0166744 A1* | 6/2021 | Futatsuyama .......... H10B 43/50 |
| 2021/0407845 A1 | 12/2021 | Wang et al. |
| 2022/0051741 A1* | 2/2022 | Choi .................. G11C 29/12015 |
| 2022/0076775 A1* | 3/2022 | Jung .................... G11C 29/025 |
| 2022/0123200 A1* | 4/2022 | Lee ........................ H10N 50/80 |
| 2022/0187365 A1* | 6/2022 | Song ................ G11C 29/12005 |
| 2022/0335994 A1 | 10/2022 | Katoch |
| 2022/0406350 A1 | 12/2022 | Lin et al. |

\* cited by examiner

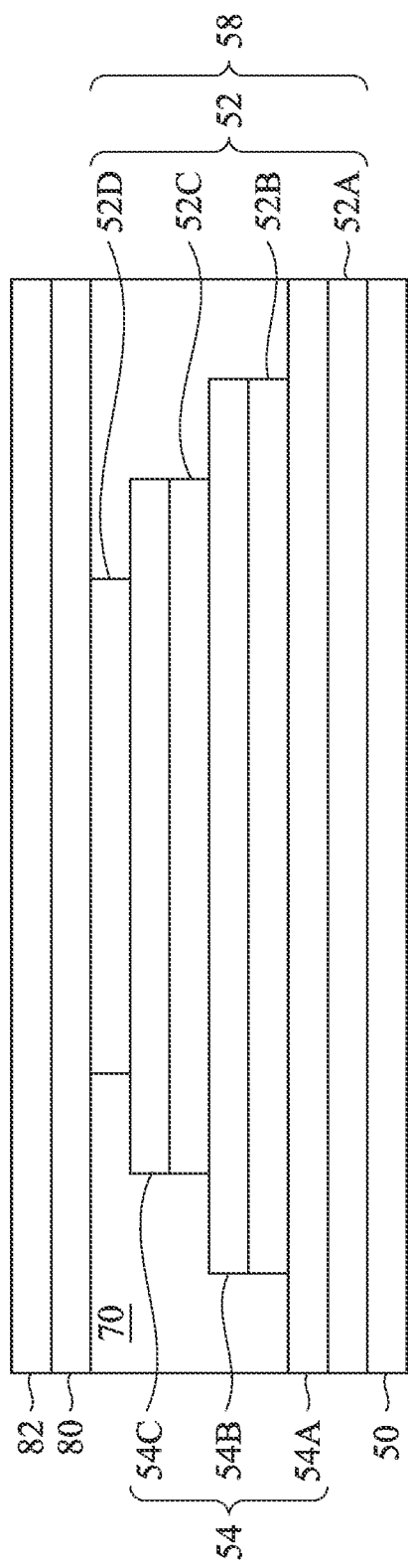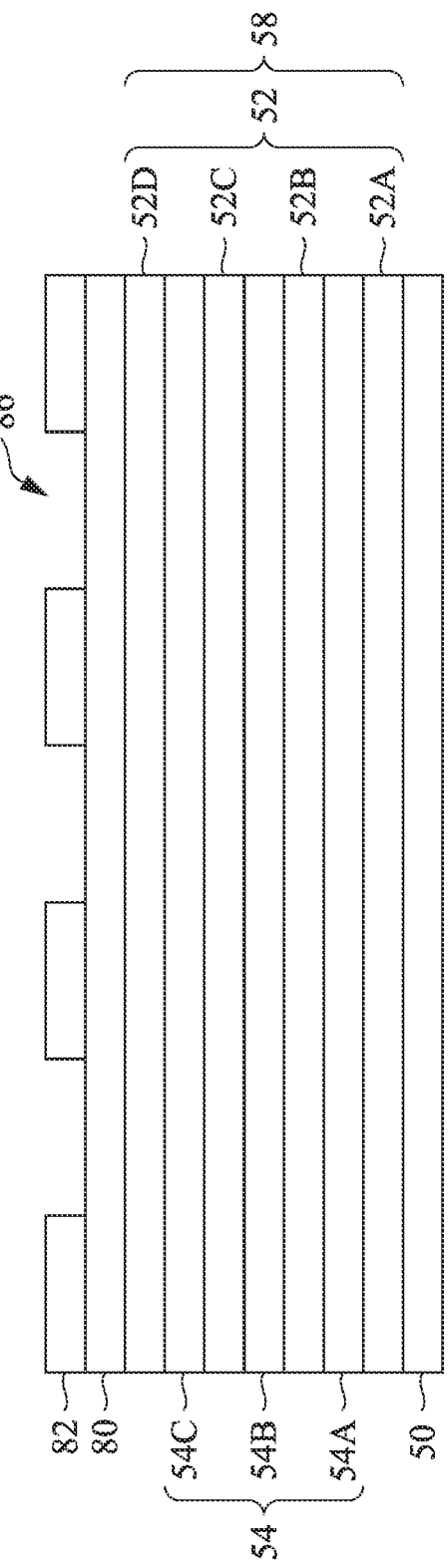

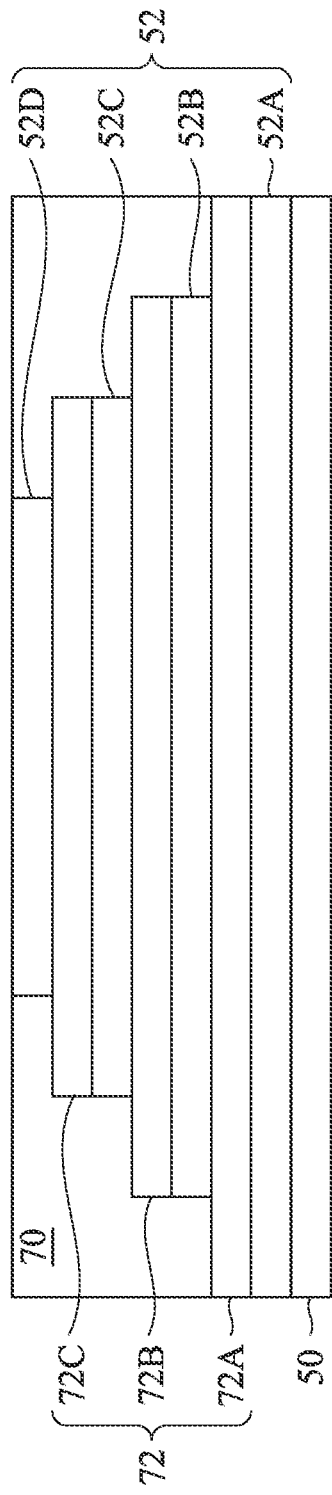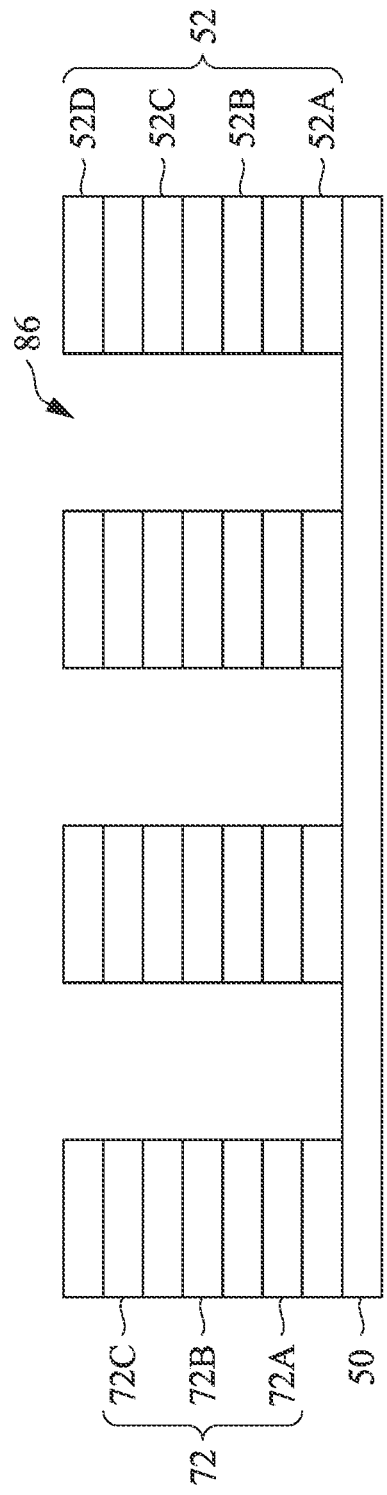
Figure 13B
Figure 13C

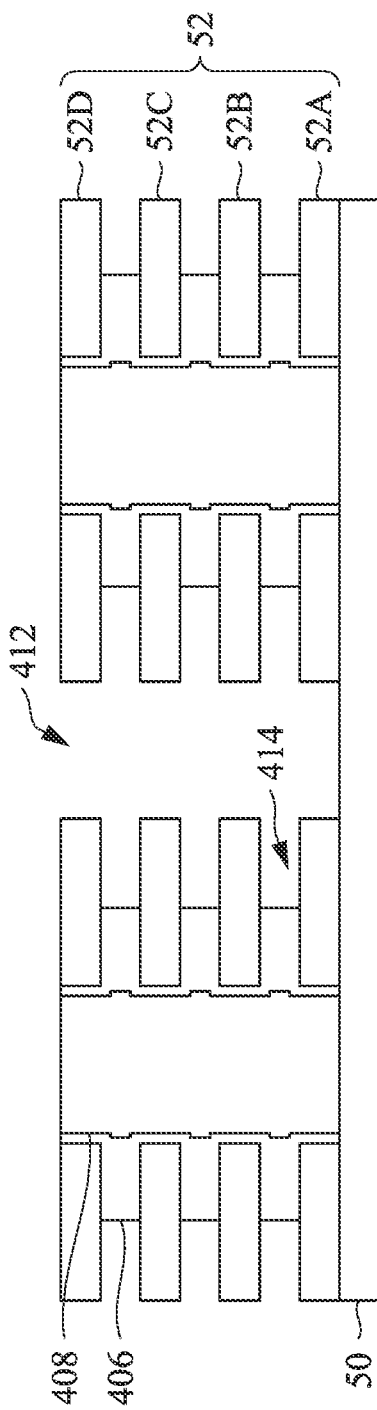
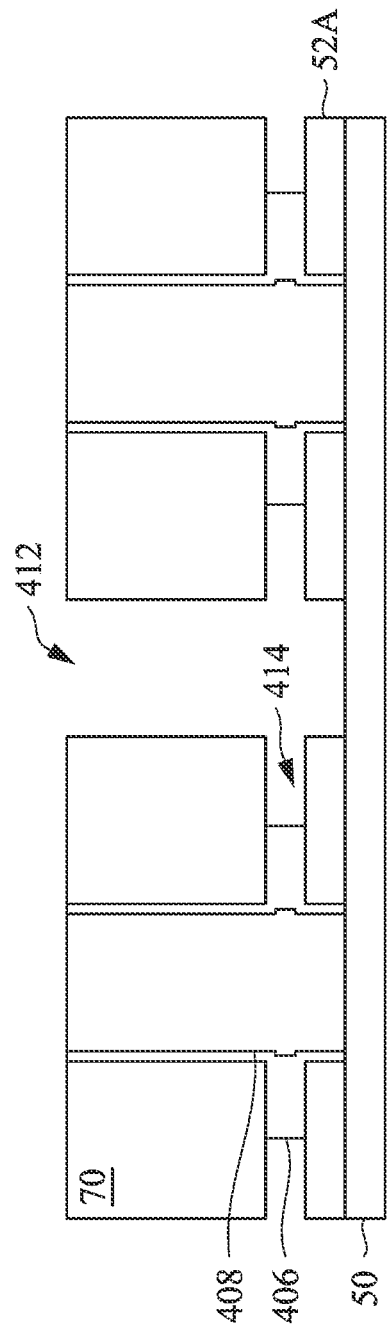
Figure 30A
Figure 30B

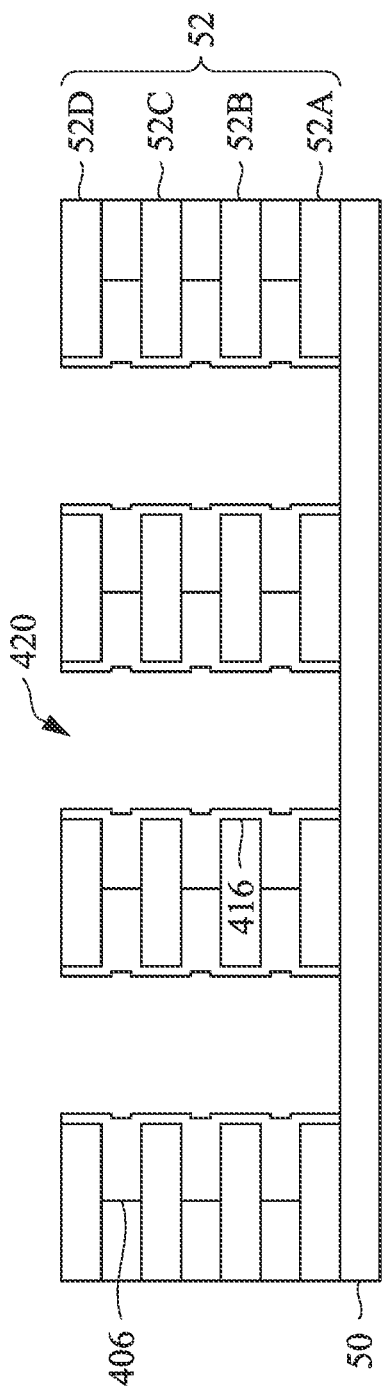
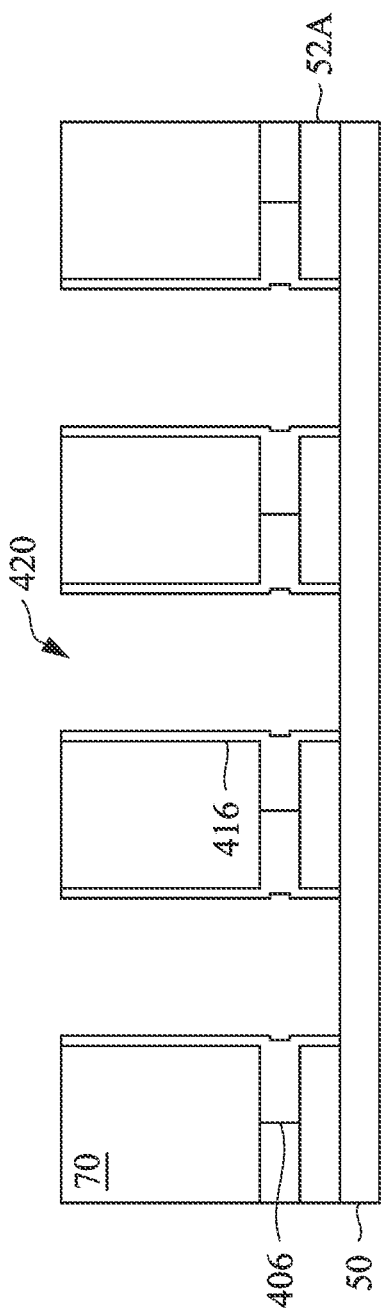

MEMORY ARRAY TEST STRUCTURE AND METHOD OF FORMING THE SAME

PRIORITY CLAIM AND CROSS-REFERENCE

This application is a continuation of U.S. patent application Ser. No. 18/302,560, filed on Apr. 18, 2023, which is a divisional of U.S. patent application Ser. No. 17/397,414, filed on Aug. 9, 2021, now U.S. Pat. No. 11,657,863 issued on May 23, 2023, which claims the benefit of U.S. Provisional Application No. 63/211,765, filed on Jun. 17, 2021, which applications are hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FERAM, or FRAM). Advantages of FERAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 20D, 21A, 21B, 21C, 21D, 22A, 22B, 22C, 23A, 23B, 23C, 24A, 24B, 24C, 24D, 25A, 25B, 25C, 26A, 26B, 27A, 27B, 28A, 28B, 29A, 29B, 30A, 30B, 31A, 31B, 32A, 32B, 33A, 33B, 34A, 34B, and 34C illustrate varying views of manufacturing a semiconductor device including a memory array in accordance with some embodiments.

DETAILED DESCRIPTION

Figure 1A:
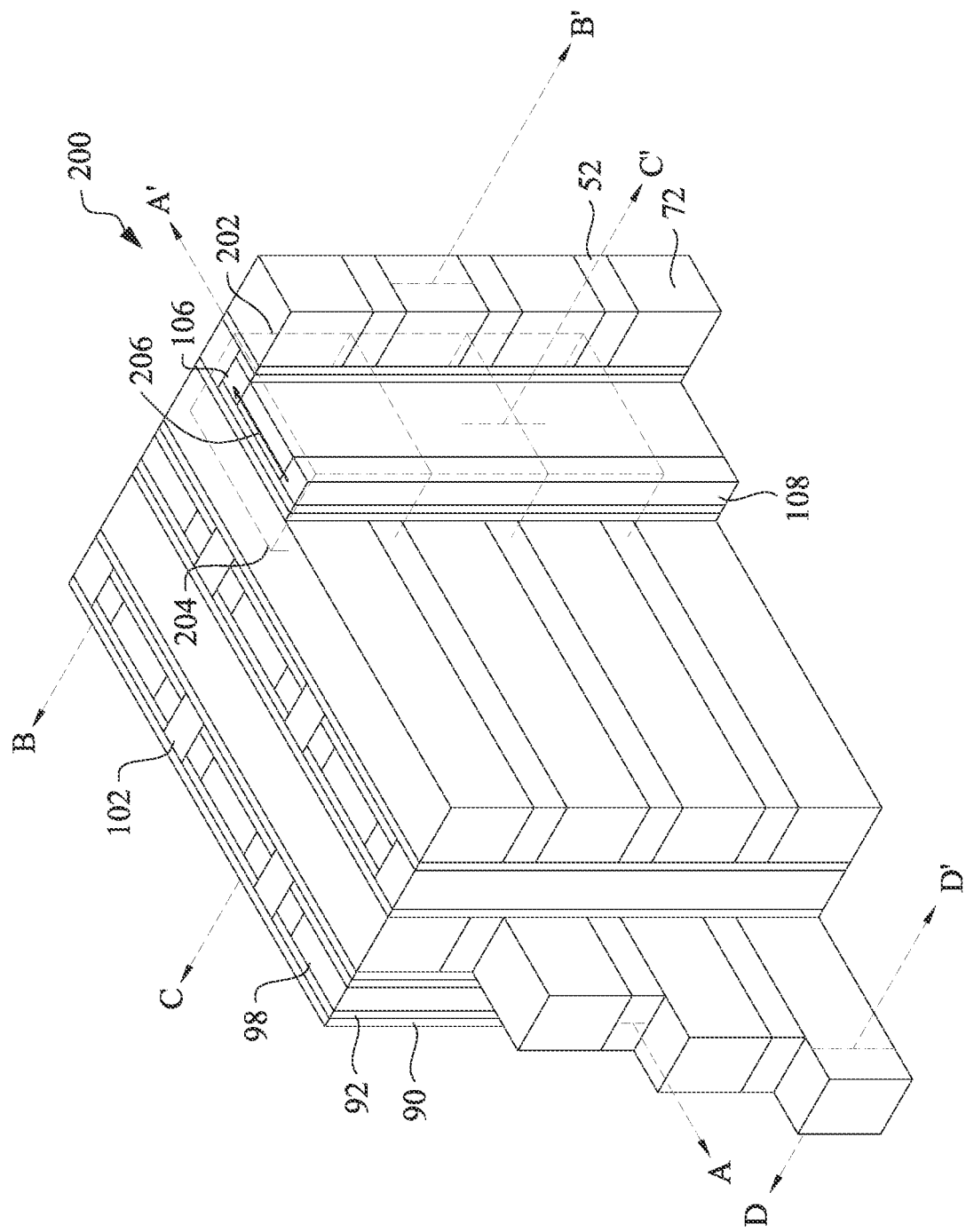
FIGS. 1A and 1B illustrate a perspective view and a circuit diagram of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a test structure for testing connections within a staircase structure for a 3D memory array and a method of forming the same. The 3D memory array includes stacked memory cells, which include word lines extending in a direction parallel to a major surface of an underlying substrate. The word lines are arranged in a staircase structure with respective lengths of the word lines decreasing in a direction away from the substrate. An inter-metal dielectric (IMD) may be formed over the staircase structure and conductive vias may be formed through the IMD and extending to each of the word lines in the staircase structure. The conductive vias may be formed simultaneously using a single mask, which saves time and cost, but may carry a risk of openings for the conductive vias not extending to sufficient depths. As such, a test structure may be formed over the staircase structure to test whether each of the conductive vias has been successfully connected to a respective word line. The test structure includes conductive lines connected to each of the conductive vias, and which interconnect each of the word lines in the staircase structure. Some of the conductive lines extend in a direction parallel to the word lines, and some of the conductive lines extend in a direction perpendicular to the word lines. A voltage bias may be applied to opposite ends of the test structure, through all of the word lines, in order to determine whether all of the conductive vias are successfully connected to the respective word lines. The test structure may be used to screen memory arrays in which conductive vias are not successfully connected to respective word lines, which reduces device defects.

Figure 1B:
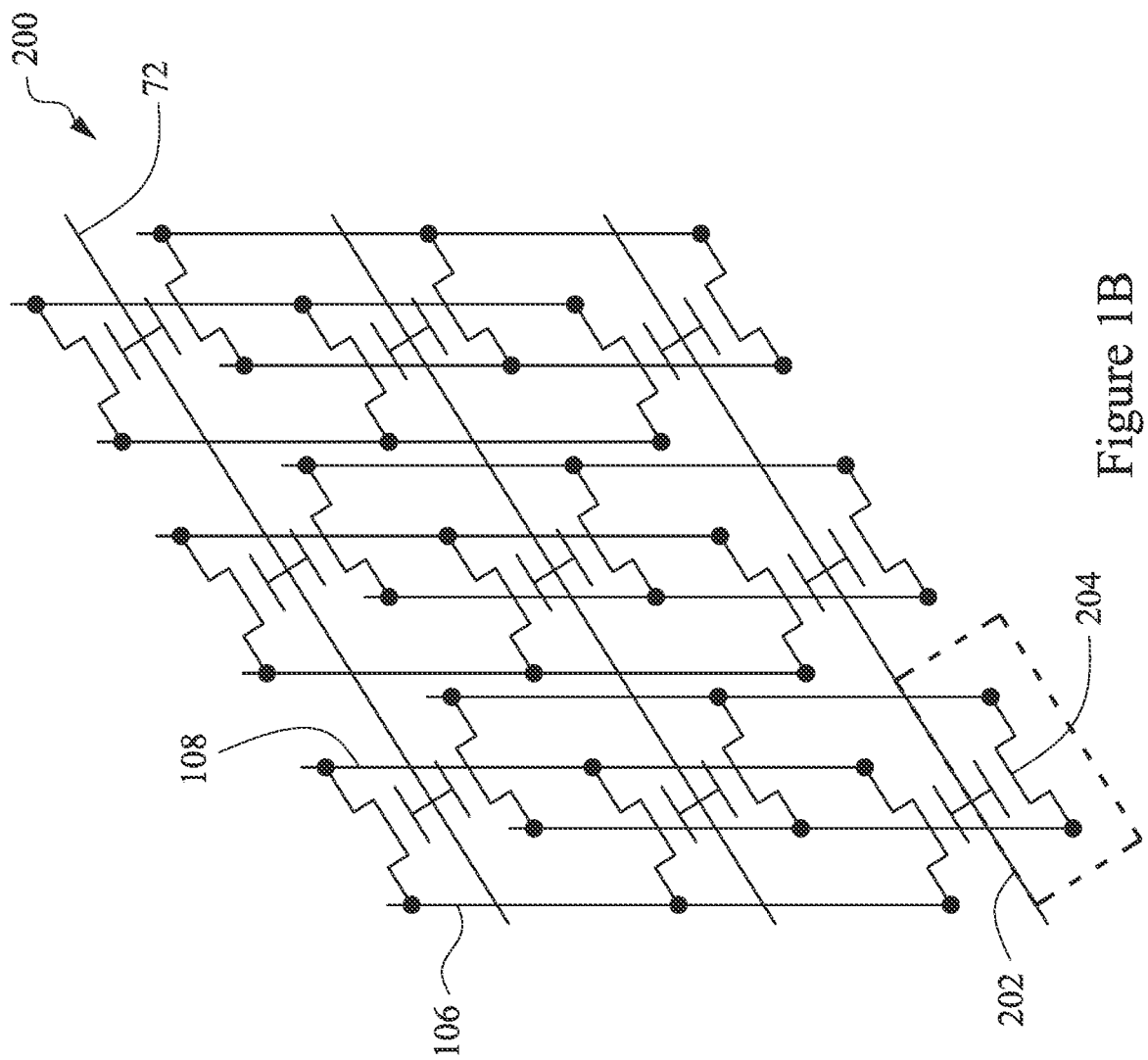

FIGS. 1A and 1B illustrate examples of a memory array 200, according to some embodiments. FIG. 1A illustrates an example of a portion of the memory array 200 in a three-dimensional view. FIG. 1B illustrates a circuit diagram of the memory array 200. The memory array 200 includes a plurality of memory cells 202, which may be arranged in a grid of rows and columns. The memory cells 202 may be further stacked vertically to provide a three-dimensional memory array, thereby increasing device density. The memory array 200 may be disposed in the back end of line (BEOL) of a semiconductor die. For example, the memory array 200 may be disposed in the interconnect layers of the semiconductor die, such as above one or more active devices (e.g., transistors) formed on a semiconductor substrate.

In some embodiments, the memory array 200 is a flash memory array, such as an NOR flash memory array or the like. Each of the memory cells 202 may include a transistor 204 with memory films 90. The memory films 90 may serve as gate dielectrics. In some embodiments, a gate of each transistor 204 is electrically coupled to a respective word line (e.g., a conductive line 72), a first source/drain region of each transistor 204 is electrically coupled to a respective bit line (e.g., a conductive line 106), and a second source/drain region of each transistor 204 is electrically coupled to a respective source line (e.g., a conductive line 108), which electrically couples the second source/drain region to ground. The memory cells 202 in a same horizontal row of the memory array 200 may share a common word line, while the memory cells 202 in a same vertical column of the memory array 200 may share a common source line and a common bit line.

The memory array 200 includes a plurality of vertically stacked conductive lines 72 (e.g., word lines) with first material layers 52 disposed between vertically adjacent ones of the conductive lines 72. The conductive lines 72 extend in a direction parallel to a major surface of an underlying substrate (not separately illustrated in FIGS. 1A and 1B). The conductive lines 72 may have a staircase configuration such that lower conductive lines 72 are longer than and extend longitudinally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72.

The memory array 200 further includes a plurality of conductive lines 106 (e.g., bit lines) and a plurality of conductive lines 108 (e.g., source lines). The conductive lines 106 and the conductive lines 108 may each extend in a direction perpendicular to the conductive lines 72. Dielectric materials 102 are disposed between and isolate adjacent ones of the conductive lines 106 and the conductive lines 108. Pairs of the conductive lines 106 and the conductive lines 108 along with an intersecting conductive line 72 define boundaries of each memory cell 202, and dielectric materials 98 are disposed between and isolate adjacent pairs of the conductive lines 106 and the conductive lines 108. In some embodiments, the conductive lines 108 are electrically coupled to ground. Although FIG. 1A illustrates a particular placement of the conductive lines 106 relative to the conductive lines 108, it should be appreciated that the placement of the conductive lines 106 and the conductive lines 108 may be flipped.

The memory array 200 may also include oxide semiconductor (OS) layers 92. The OS layers 92 may provide channel regions for the transistors 204 of the memory cells 202. For example, when an appropriate voltage (e.g., higher than a respective threshold voltage ($V_{th}$) of a corresponding transistor 204) is applied through a corresponding conductive line 72, a region of the OS layers 92 that intersects the conductive line 72 may allow current to flow from the conductive lines 106 to the conductive lines 108 (e.g., in the direction indicated by arrow 206).

The memory films 90 are disposed between the conductive lines 72 and the OS layers 92, and the memory films 90 may provide gate dielectrics for the transistors 204. In some embodiments, the memory films 90 comprise ferroelectric (FE) materials, such as hafnium oxide, hafnium zirconium oxide, silicon-doped hafnium oxide, or the like. Accordingly, the memory array 200 may be referred to as a ferroelectric random access memory (FERAM) array. Alternatively, the memory films 90 may be multilayer structures, different ferroelectric materials, different types of memory layers (e.g., capable of storing a bit), or the like.

In embodiments in which the memory films 90 comprise FE materials, the memory films 90 may be polarized in one of two different directions. The polarization direction may be changed by applying an appropriate voltage differential across the memory films 90 and generating an appropriate electric field. The polarization may be relatively localized (e.g., generally contained within each boundaries of the memory cells 202) and continuous regions of the memory films 90 may extend across a plurality of memory cells 202. Depending on a polarization direction of a particular region of the memory films 90, a threshold voltage of a corresponding transistor 204 varies and a digital value (e.g., a 0 or a 1) can be stored. For example, when a region of the memory films 90 has a first electrical polarization direction, the corresponding transistor 204 may have a relatively low threshold voltage, and when the region of the memory films 90 has a second electrical polarization direction, the corresponding transistor 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202, a write voltage is applied across a portion of the memory films 90 corresponding to the memory cell 202. The write voltage can be applied, for example, by applying appropriate voltages to a corresponding conductive line 72 (e.g., a corresponding word line) and the corresponding conductive lines 106 and conductive lines 108 (e.g., corresponding bit and source lines). By applying the write voltage across the portion of the memory films 90, a polarization direction of the region of the memory films 90 can be changed. As a result, the corresponding threshold voltage of the corresponding transistor 204 can be switched from a low threshold voltage to a high threshold voltage or vice versa and a digital value can be stored in the memory cell 202. Because the conductive lines 72 intersect the conductive lines 106 and the conductive lines 108, individual memory cells 202 may be selected for the write operation.

To perform a read operation on the memory cell 202, a read voltage (e.g., a voltage between the low and high threshold voltages) is applied to the corresponding conductive line 72 (e.g., the corresponding word line). Depending on the polarization direction of the corresponding region of the memory films 90, the transistor 204 of the memory cell 202 may or may not be turned on. As a result, the corresponding conductive line 106 may or may not be discharged through the corresponding conductive line 108 (e.g., the corresponding source line that is coupled to ground), and the digital value stored in the memory cell 202 can be determined. Because the conductive lines 72 intersect the conductive lines 106 and the conductive lines 108, individual memory cells 202 may be selected for the read operation.

FIG. 1A further illustrates reference cross-sections of the memory array 200 that are used in later figures. Cross-section A-A' is along longitudinal axes of conductive lines 72 and in a direction, for example, parallel to the direction of current flow across the OS layers 92 of the transistors 204. Cross-section B-B' is perpendicular to the cross-section A-A' and the longitudinal axes of the conductive lines 72. The cross-section B-B' extends through the dielectric materials 98 and the dielectric materials 102. Cross-section C-C' is parallel to the cross-section B-B' and extends through the conductive lines 106. Subsequent figures refer to these reference cross-sections for clarity. Cross-section D-D' is parallel to the cross-section B-B' and extends through a staircase structure portion of the conductive lines 72.

FIGS. 2 through 34C are views of intermediate stages in the manufacturing of the memory array 200, in accordance with some embodiments. FIGS. 2, 3, 4, 5, 6, 7, 8, 9, 10, 11B, 12B, 13B, 14B, 15B, 16B, 17B, 18B, 19B, 20B, 21B, 22B, 23B, and 24B are illustrated along reference cross-section A-A' illustrated in FIG. 1A. FIGS. 11C, 12C, 13C, 14C, 15C, 16C, 17C, 18C, 19C, 20C, 21C, 26A, 27A, 28A, 29A, 30A, 31A, 32A, 33A, and 34A are illustrated along reference cross-section B-B' illustrated in FIG. 1A. FIGS. 20D, 21D, and 34C are illustrated along reference cross-section C-C' illustrated in FIG. 1A. FIGS. 22C, 23C, 24C, 26B, 27B, 28B, 29B, 30B, 31B, 32B, 33B, and 34B are illustrated along reference cross-section D-D' illustrated in FIG. 1A. FIGS. 11A, 12A, 13A, 14A, 15A, 16A, 17A, 18A, 19A, 20A, 21A, 22A, 23A, 24A, 25A, and 25C illustrate top-down views. FIGS. 24D, 25B illustrate perspective views.

Figure 2:
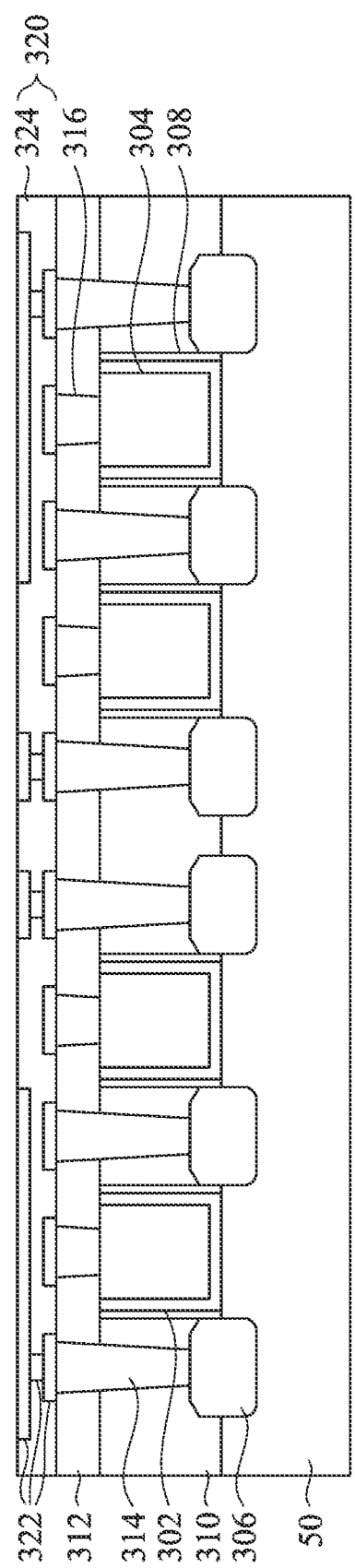

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or a glass substrate. Other substrates, such as multi-layered or gradient substrates may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may comprise fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first ILD 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306. Gate contacts 316 extend through the second ILD 312 and are electrically coupled to the gate electrodes 304. An interconnect structure 320 including one or more stacked dielectric layers 324 and conductive features 322 formed in the one or more dielectric layers 324 is over the second ILD 312, the source/drain contacts 314, and the gate contacts 316. The interconnect structure 320 may be electrically connected to the gate contacts 316 and the source/drain contacts 314 to form functional circuits. In some embodiments, the functional circuits formed by the interconnect structure 320 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits. The transistors, the ILDs, and the interconnect structure 320 formed over the substrate 50 may be omitted from subsequent drawings for the purposes of simplicity and clarity. The substrate 50 along with the transistors (e.g., the source/drain regions 306, the gate dielectric layers 302, and the gate electrodes 304), the gate spacers 308, the first ILD 310, the second ILD 312, and the interconnect structure 320 may be a CMOS under array (CUA), a logic die, or the like.

Figure 3:
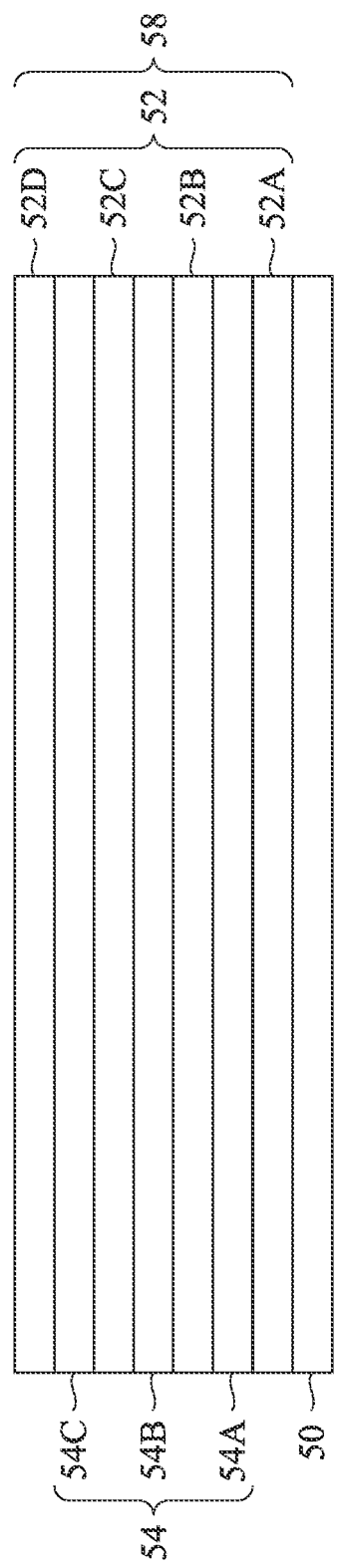

In FIG. 3, a multi-layer stack 58 is formed over the substrate 50. Although the multi-layer stack 58 is illustrated as contacting the substrate 50, any number of intermediate layers may be disposed between the substrate 50 and the multi-layer stack 58. For example, one or more interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B).

The multi-layer stack 58 includes alternating layers of first material layers 52A-52D (collectively referred to as first material layers 52) and second material layers 54A-54C (collectively referred to as second material layers 54). In some embodiments, the second material layers 54 may be patterned in subsequent steps to define conductive lines 72 (e.g., word lines). In embodiments in which the second material layers 54 are patterned to define the conductive lines 72, the second material layers 54 may comprise conductive materials, such as, copper, titanium, titanium nitride, tantalum, tantalum nitride, tungsten, ruthenium, aluminum, cobalt, silver, gold, nickel, chromium, hafnium, platinum, combinations thereof, or the like. The first material layers 52 may comprise insulating materials, such as silicon oxide, silicon nitride, silicon oxynitride, combinations thereof, or the like. In some embodiments, the second material layers 54 may be replaced in subsequent steps by conductive materials, which define the conductive lines 72. In such embodiments, the second material layers 54 may also comprise insulating materials, such as silicon oxide, silicon nitride, silicon oxynitride, combinations thereof, or the like, and may include materials having a high etch selectivity to materials of the first material layers 52. In some embodiments, the first material layers 52 may comprise an oxide, such as silicon oxide, and the second material layers 54 may comprise a nitride, such as silicon nitride. The first material layers 52 and the second material layers 54 may each be formed using, for example, CVD, ALD, physical vapor deposition (PVD), plasma enhanced CVD (PECVD), or the like. Although FIG. 3 illustrates a particular number of the first material layers 52 (e.g., 4) and the second material layers 54 (e.g., 3), other embodiments may include different numbers of the first material layers 52 and the second material layers 54.

Figure 4:
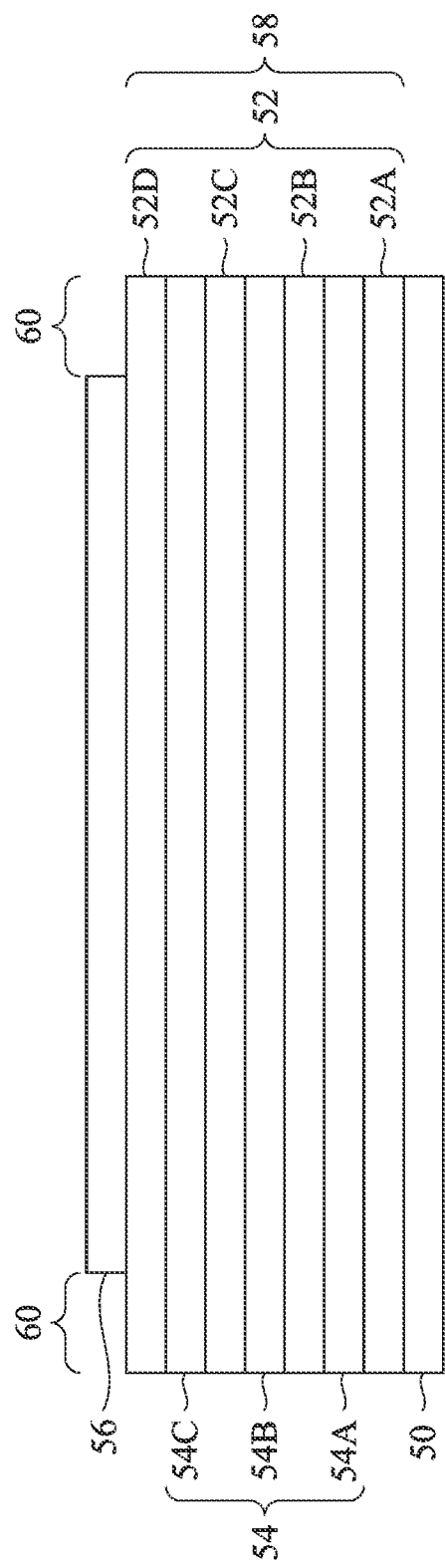
Figure 6:
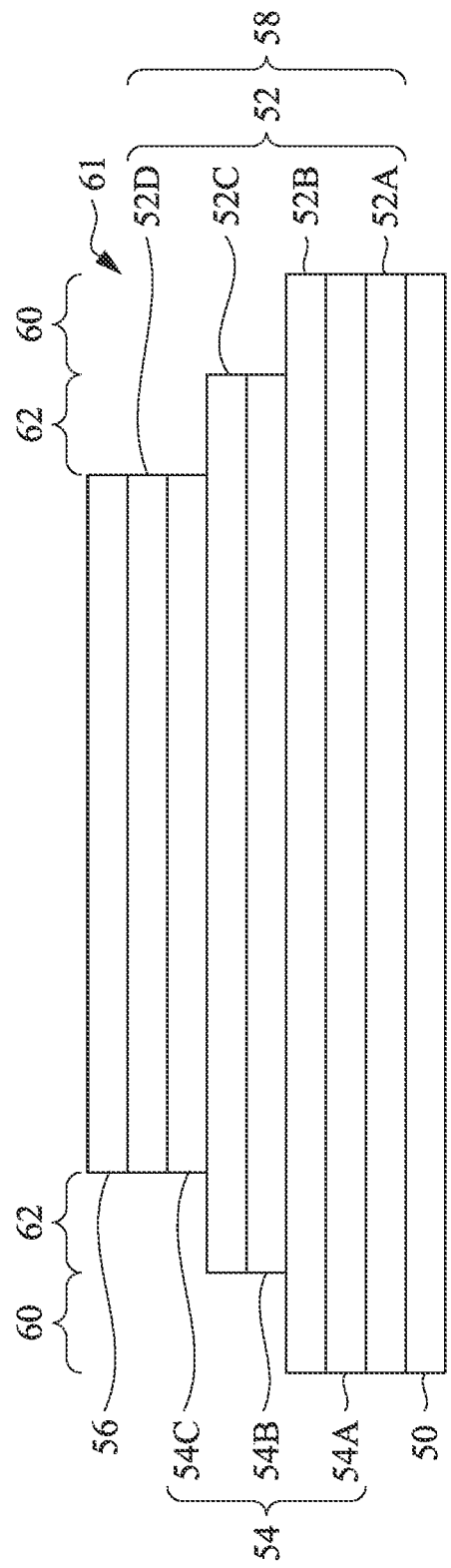
Figure 7:
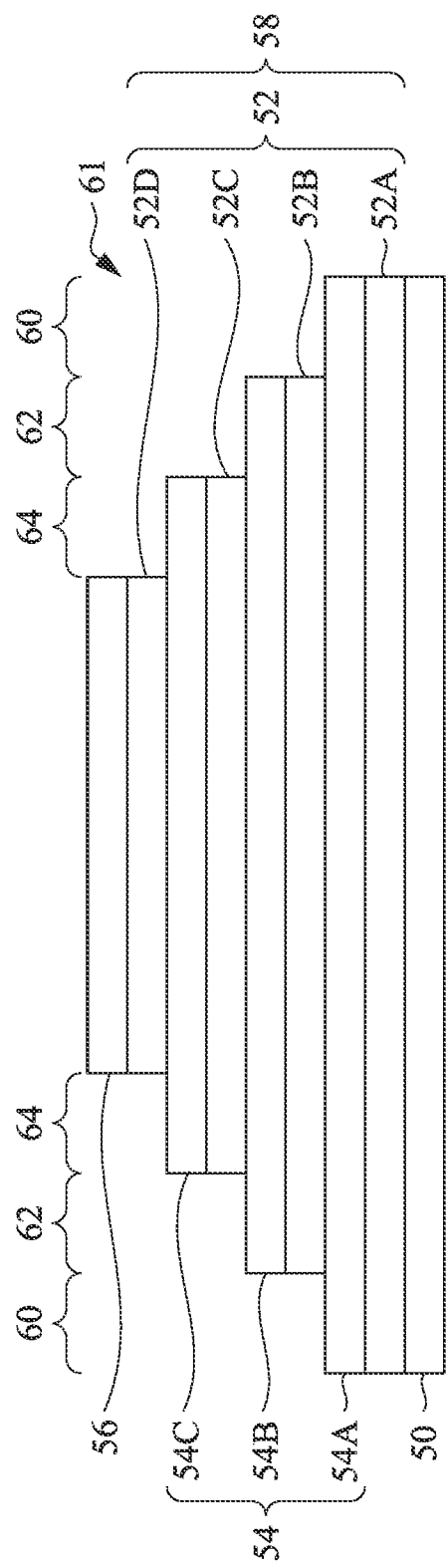
Figure 8:
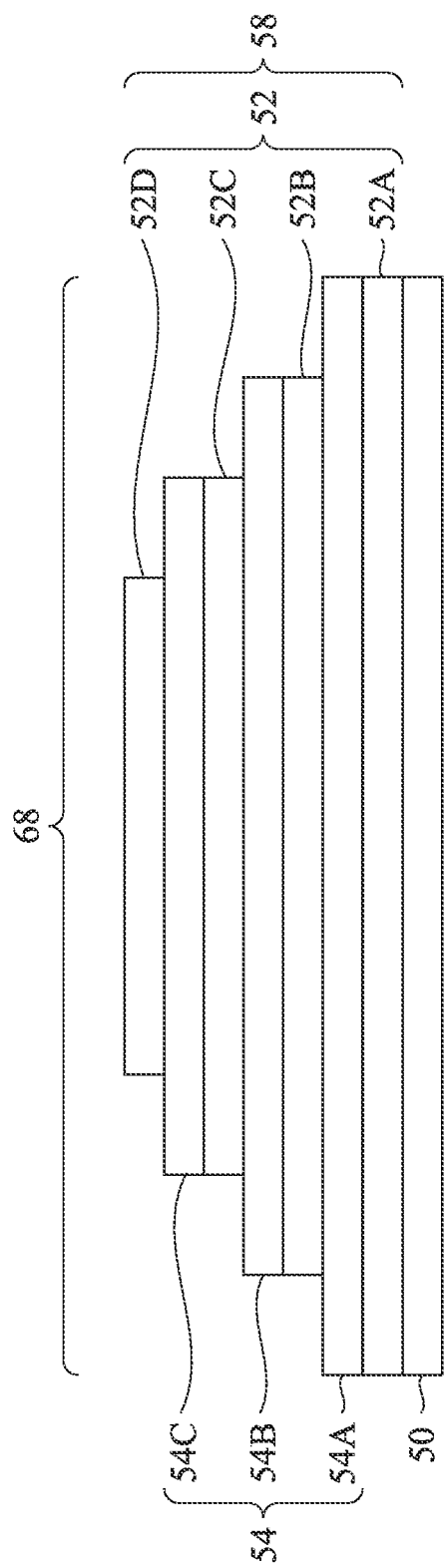

FIGS. 4 through 8 illustrate patterning the multi-layer stack 58 to form a staircase structure 68 (illustrated in FIG. 8). In FIG. 4, a photoresist 56 is formed over the multi-layer stack 58. The photoresist 56 can be formed by using a spin-on technique and can be patterned using acceptable photolithography techniques. Patterning the photoresist 56 may expose the multi-layer stack 58 in a region 60, while masking remaining portions of the multi-layer stack 58. For example, a topmost layer of the multi-layer stack 58 (e.g., the first material layer 52D) may be exposed in the region 60.

Figure 5:
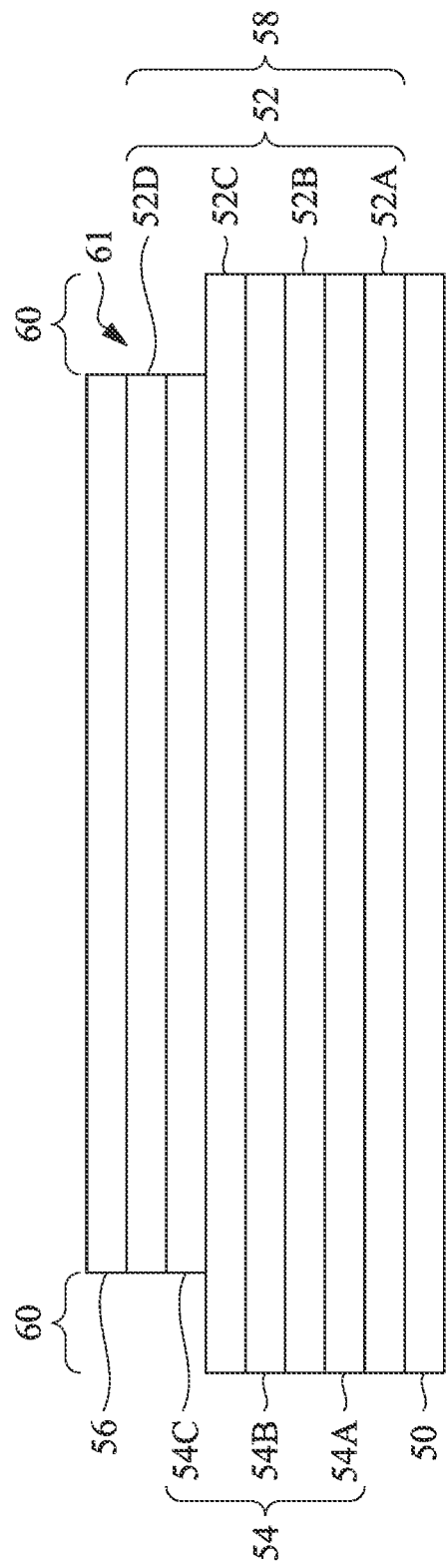

In FIG. 5, the exposed portions of the multi-layer stack 58 in the region 60 are etched using the photoresist 56 as a mask. The etching may be any acceptable etch process, such as wet or dry etching, reactive ion etching (RIE), neutral beam etching (NBE), the like, or a combination thereof. The etching may be anisotropic. The etching may remove portions of the first material layer 52D and the second material layer 54C in the region 60 and define openings 61 along opposite edges of the multi-layer stack 58. Because the first material layers 52 and the second material layers 54 have different material compositions, etchants used to remove exposed portions of these layers may be different. In some embodiments, the second material layer 54C acts as an etch stop layer while etching the first material layer 52D, and the first material layer 52C acts as an etch stop layer while etching the second material layer 54C. As a result, the portions of the first material layer 52D and the second material layer 54C may be selectively removed without removing remaining layers of the multi-layer stack 58, and the openings 61 may be extended to desired depths. Alternatively, a timed etch processes may be used to stop the etching of the openings 61 after the openings 61 reach the desired depths. In the resulting structure, the first material layer 52C is exposed in the region 60.

In FIG. 6, the photoresist 56 is trimmed to expose additional portions of the multi-layer stack 58. The photoresist 56 can be trimmed using acceptable photolithography techniques. As a result of the trimming, a width of the photoresist 56 is reduced, and portions the multi-layer stack 58 in the region 60 and a region 62 are exposed. For example, top surfaces of the first material layer 52D in the region 62 and top surfaces of the first material layer 52C in the region 60 may be exposed.

Exposed portions of the multi-layer stack 58 may then be etched using the photoresist 56 as a mask. The etching may be any suitable etching process, such as wet or dry etching, RIE, NBE, the like, or a combination thereof. The etching process may be anisotropic. The etching may extend the openings 61 further into the multi-layer stack 58. Because the first material layers 52 and the second material layers 54 have different material compositions, etchants used to remove exposed portions of these layers may be different. In some embodiments, the second material layers 54 act as etch stop layers while etching the first material layers 52, and the first material layers 52 act as etch stop layers while etching the second material layers 54. As a result, the portions of the first material layers 52 and the second material layers 54 may be selectively removed without removing remaining layers of the multi-layer stack 58, and the openings 61 may be extended to desired depths. Alternatively, timed etch processes may be used to stop the etching of the openings 61 after the openings 61 reach the desired depths. Further, during the etching process, un-etched portions of the first material layers 52 and the second material layers 54 act as masks for underlying layers, and as a result a previous pattern of the first material layer 52D and the second material layer 54C (see FIG. 5) may be transferred to the underlying first material layer 52C and the underlying second material layer 54B. In the resulting structure, the first material layer 52C is exposed in the region 62 and the first material layer 52B is exposed in the region 60.

In FIG. 7, the photoresist 56 is trimmed to expose additional portions of the multi-layer stack 58. The photoresist 56 can be trimmed using acceptable photolithography techniques. As a result of the trimming, a width of the photoresist 56 is reduced, and portions the multi-layer stack 58 in the region 60, the region 62, and a region 64 are exposed. For example, top surfaces of the first material layer 52D in the region 64, top surfaces of the first material layer 52C in the region 62, and top surfaces of the first material layer 52B in the region 60 may be exposed.

Exposed portions of the multi-layer stack 58 may then be etched using the photoresist 56 as a mask. The etching may be any suitable etching process, such as wet or dry etching, RIE, NBE, the like, or a combination thereof. The etching process may be anisotropic. The etching may extend the openings 61 further into the multi-layer stack 58. The second material layers 54 may act as etch stop layers while etching the first material layers 52. As a result, the portions of the first material layers 52 may be selectively removed without removing underlying portions of the second material layers 54, and the openings 61 may be extended to desired depths. Alternatively, timed etch processes may be used to stop the etching of the openings 61 after the openings 61 reach the desired depths. Further, during the etching process, un-etched portions of the first material layers 52 and the second material layers 54 act as masks for underlying layers, and as a result a previous pattern of the first material layer 52D, the second material layer 54C, the first material layer 52C, and the second material layer 54B (see FIG. 6) may be transferred to the underlying first material layer 52B and the underlying first material layer 52C. In the resulting structure, the second material layer 54C is exposed in the region 64, the second material layer 54B is exposed in the region 62 and the second material layer 54A is exposed in the region 60.

In FIG. 8 the photoresist 56 is removed. The photoresist 56 may be removed by an acceptable ashing or wet strip process. Thus, a staircase structure 68 is formed. The staircase structure 68 comprises a stack of alternating layers of the first material layers 52 and the second material layers 54. As illustrated in FIG. 8, forming the staircase structure 68 allows for portions of each of the second material layers 54A-54C to be exposed from overlying second material layers 54 and first material layers 52. As a result, conductive contacts can be made from above the staircase structure 68 to each of the second material layers 54 in subsequent processing steps.

Figure 9:
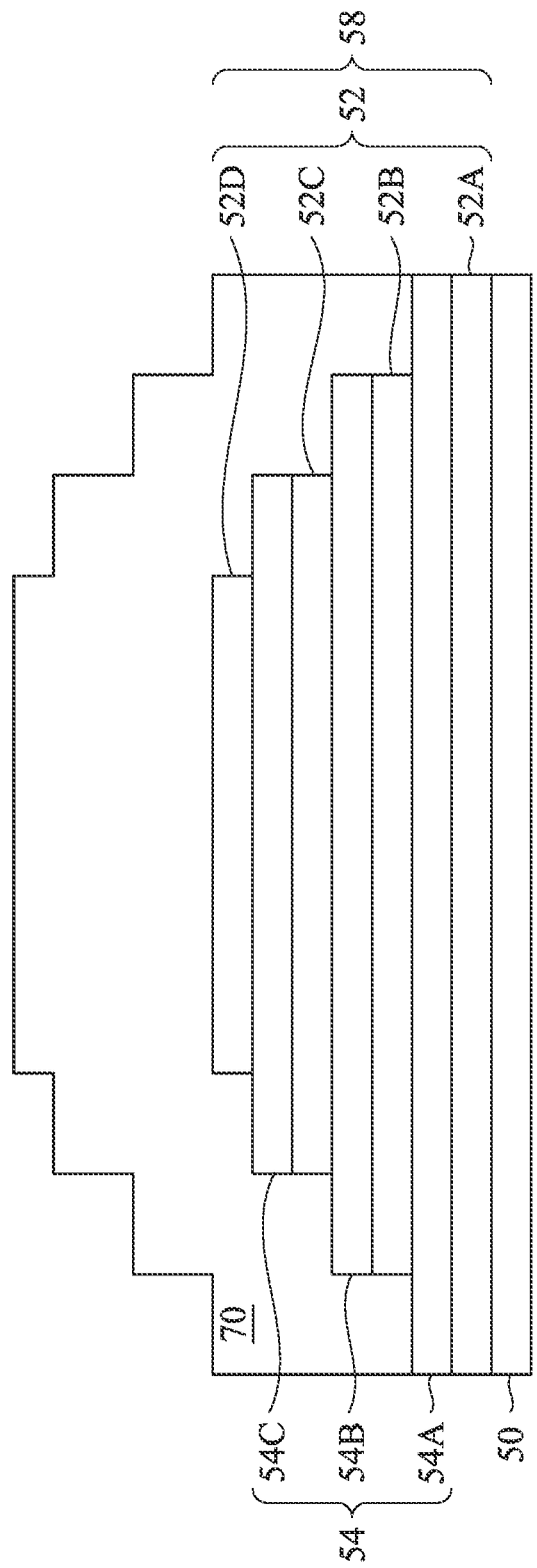

In FIG. 9, an inter-metal dielectric (IMD) 70 is deposited over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 may comprise an oxide (e.g., silicon oxide or the like), a nitride (e.g., silicon nitride or the like), a combination thereof or the like. Other dielectric materials formed by any acceptable process may be used. The IMD 70 extends along sidewalls of the first material layers 52B-52D, sidewalls of the second material layers 54B and 54C, a top surface of the first material layer 52D, and top surfaces of the second material layers 54A-54C.

Figure 10:
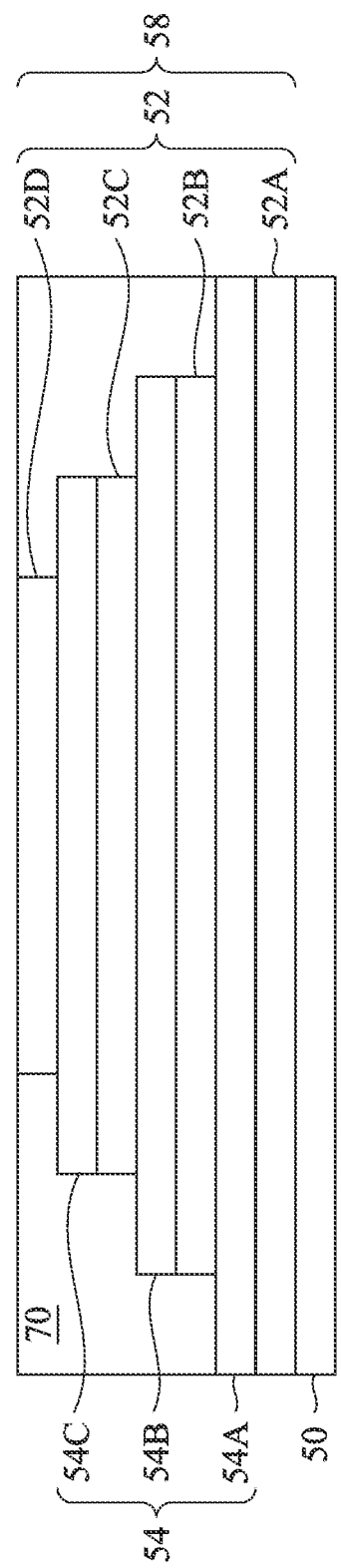

In FIG. 10, a removal process is applied to the IMD 70 to remove excess dielectric material over the multi-layer stack 58. In some embodiments, the removal process may be a planarization process, such as a chemical mechanical polish (CMP), an etch-back process, combinations thereof, or the like. The planarization process exposes the multi-layer stack 58 such that top surfaces of the first material layer 52D and the IMD 70 are level after the planarization process is complete.

In FIGS. 11A through 13C, trenches 86 (illustrated in FIGS. 12A through 13C) are formed in the multi-layer stack 58. This defines conductive lines 72 (illustrated in FIGS. 12A through 13C) from the second material layers 54 in embodiments in which the second material layers 54 include conductive materials. The conductive lines 72 may correspond to word lines in the memory array 200 and the conductive lines 72 may provide gate electrodes for the resulting transistors 204 of the memory array 200. In FIGS. 11A through 19C, figures ending in "A" illustrate a top-down view, figures ending in "B" illustrate a cross-sectional view along line A-A' of FIG. 1A, and figures ending in "C" illustrate a cross-sectional view along line B-B' of FIG. 1A.

Figure 11A:
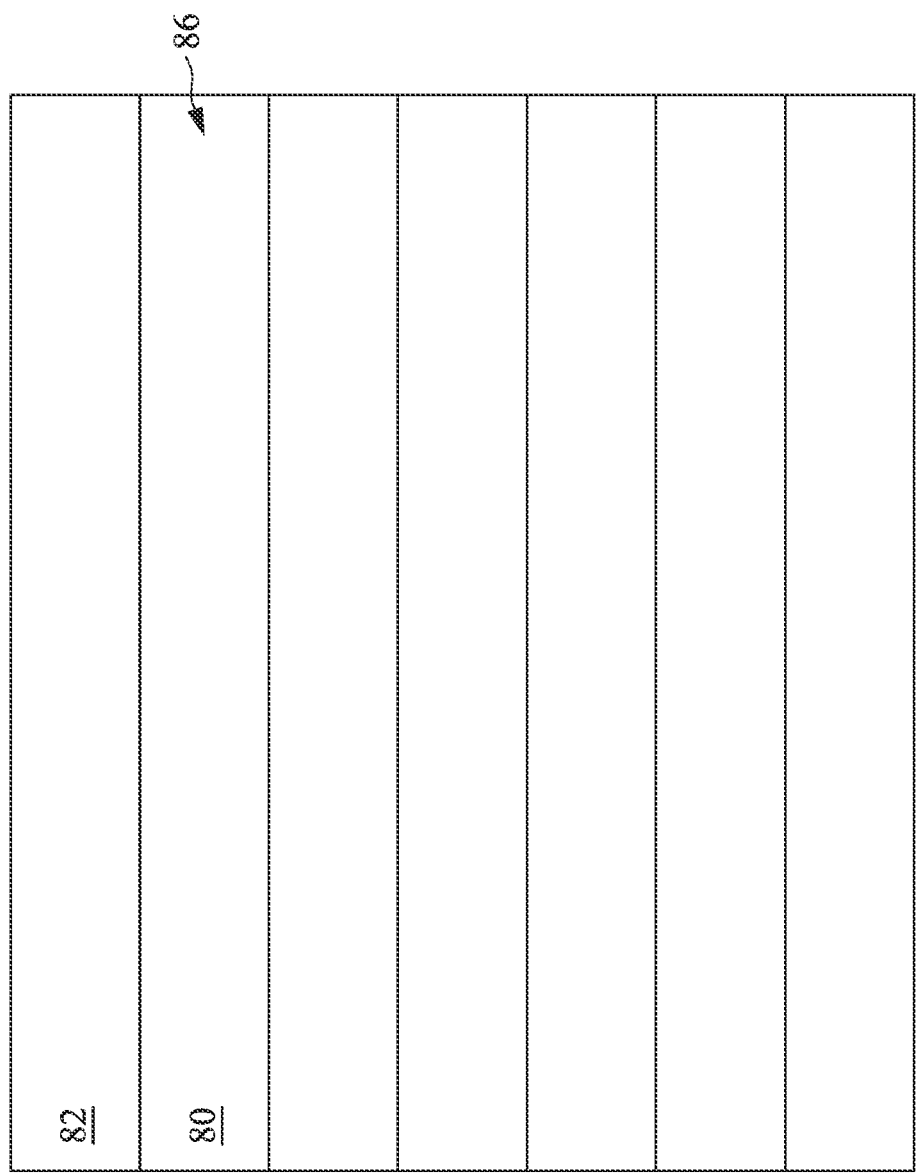

In FIGS. 11A through 11C a hard mask 80 is deposited over the multi-layer stack 58 and the IMD 70. The hard mask 80 may include, for example, silicon nitride, silicon oxynitride, or the like, which may be deposited by CVD, PVD, ALD, PECVD, or the like. The hard mask 80 can be formed by using a spin-on technique and can be patterned using acceptable photolithography techniques. A patterned photoresist 82 is formed over the hard mask 80. The patterned photoresist 82 may be formed by depositing a photosensitive layer over the hard mask 80 using spin-on coating or the like. The photosensitive layer may then be patterned by exposing the photosensitive layer to a patterned energy source (e.g., a patterned light source) and developing the photosensitive layer to remove an exposed or unexposed portion of the photosensitive layer, thereby forming the patterned photoresist 82. Trenches 86, which expose the hard mask 80, are formed extending through the patterned photoresist 82. The pattern of the patterned photoresist 82 corresponds to conductive lines to be formed in the multi-layer stack 58, as will be discussed below with respect to FIGS. 12A through 12C.

Figure 12A:
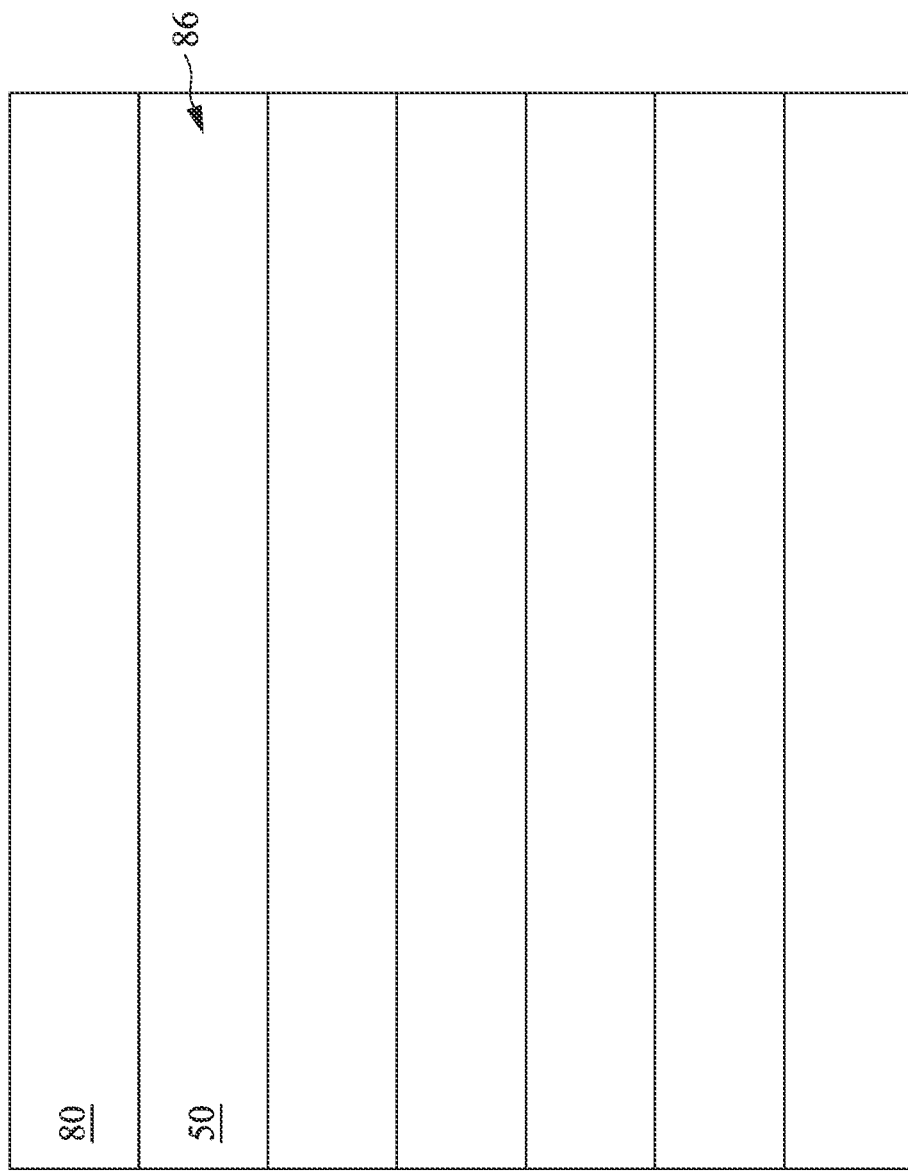
Figure 12B:
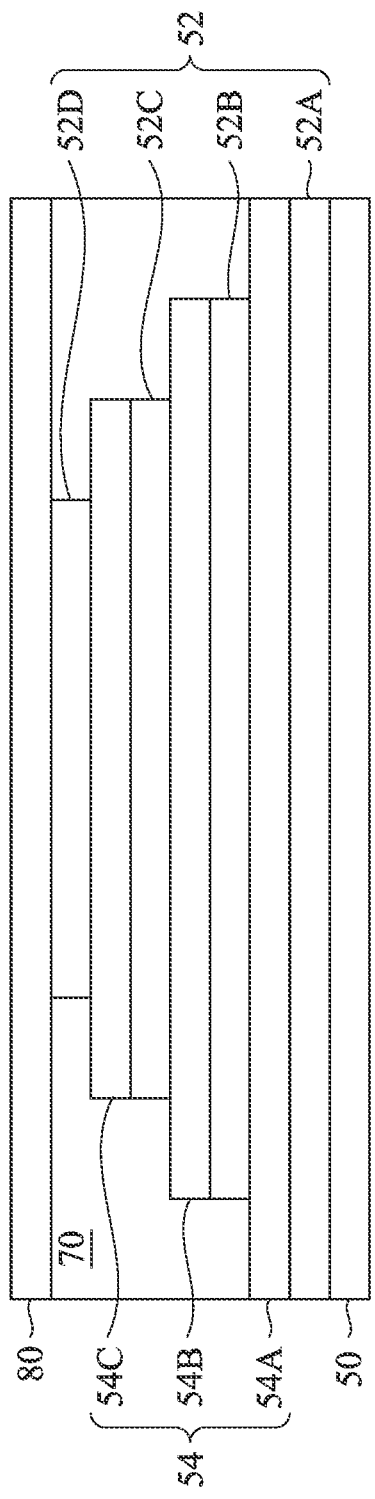
Figure 12C:
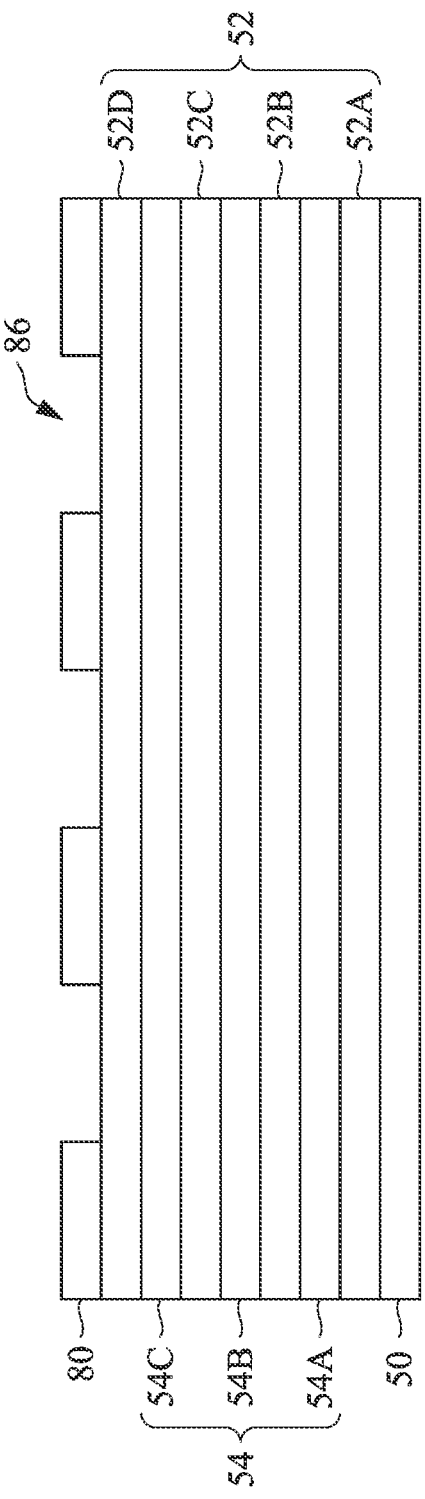

In FIGS. 12A through 12C, the hard mask 80 is patterned using the patterned photoresist 82 as a mask to extend the trenches 86 through the hard mask 80. The hard mask 80 may be patterned using an acceptable etching process, such as wet or dry etching, RIE, NBE, the like, or a combination thereof. The etching may be anisotropic. Thus, the trenches 86 are extended through the hard mask 80 and expose the multi-layer stack 58. The patterned photoresist 82 may then be removed by an acceptable process, such as a wet etching process, a dry etching process, a combination thereof, or the like.

Figure 13A:
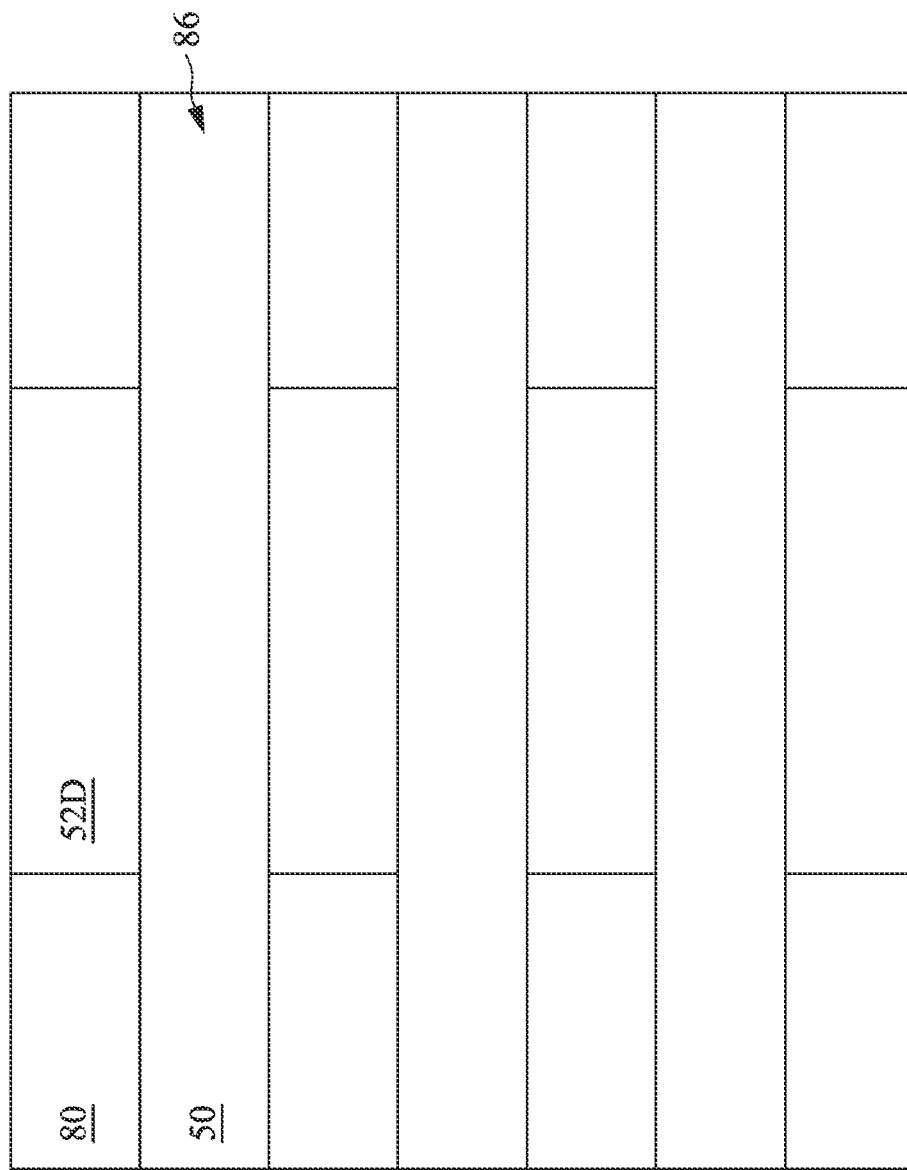

In FIGS. 13A through 13C, the multi-layer stack 58 is patterned using the hard mask 80 as a mask to extend the trenches 86 through the multi-layer stack 58, exposing the substrate 50. The multi-layer stack 58 may be patterned using one or more acceptable etching processes, such as wet or dry etching, RIE, NBE, the like, or a combination thereof. The etching processes may be anisotropic. Thus, the trenches 86 are extended through the multi-layer stack 58. Etching the second material layers 54A-54C forms conductive lines 72A-72C (e.g., word lines, collectively referred to as conductive lines 72) from each respective layer of the second material layers 54. The trenches 86 separate adjacent conductive lines 72 and portions of the first material layers 52 from one another. Further in FIGS. 13A through 13C, the hard mask 80 may be removed by an acceptable process, such as a wet etching process, a dry etching process, a planarization process, combinations thereof, or the like.

Figure 14A:
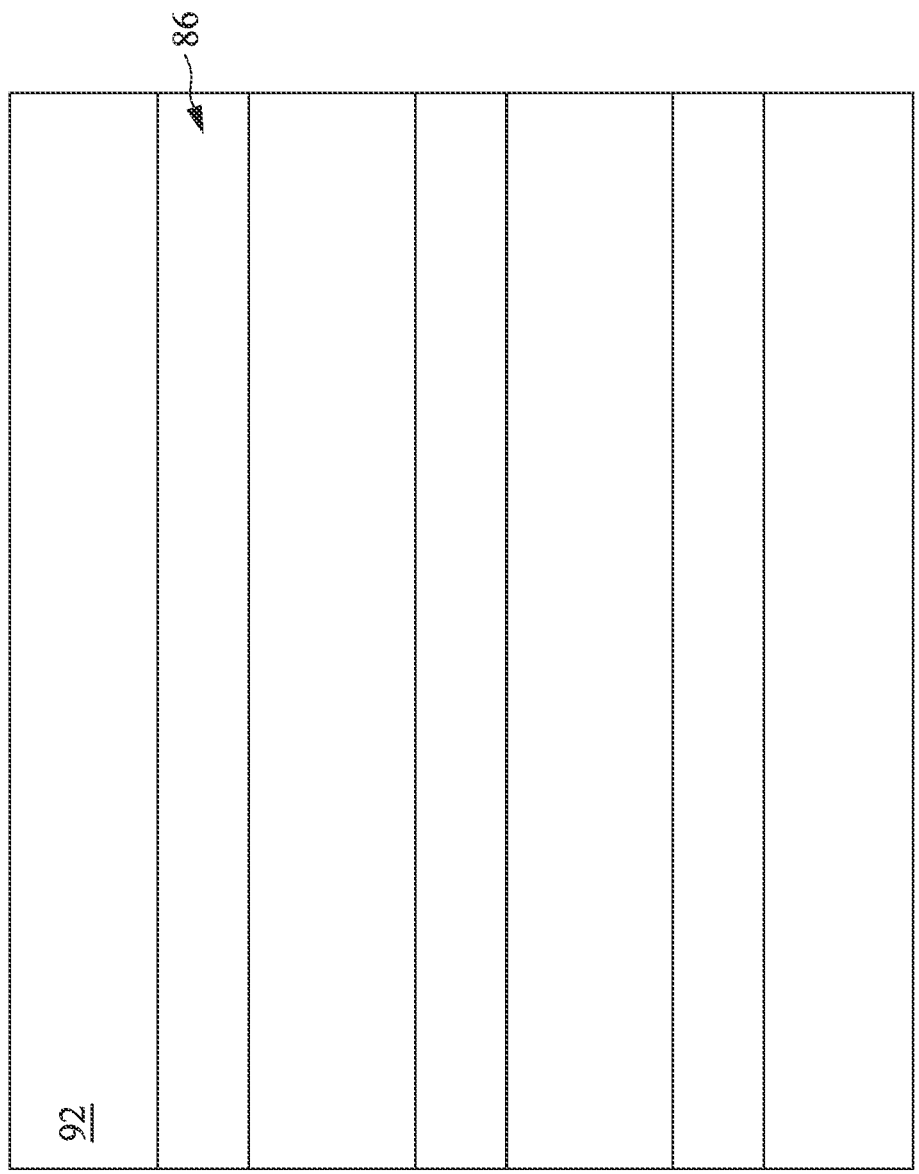
Figure 14B:
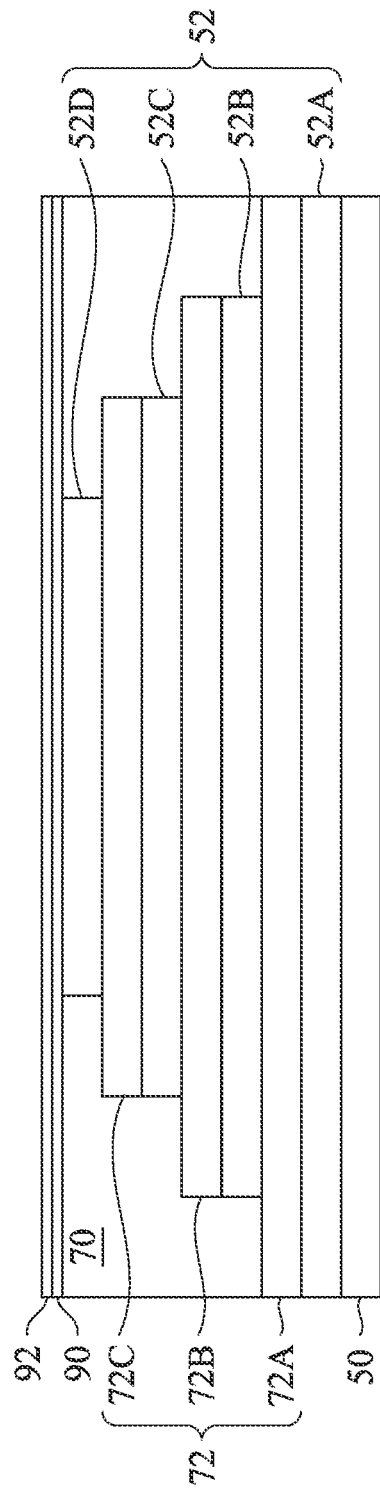
Figure 14C:
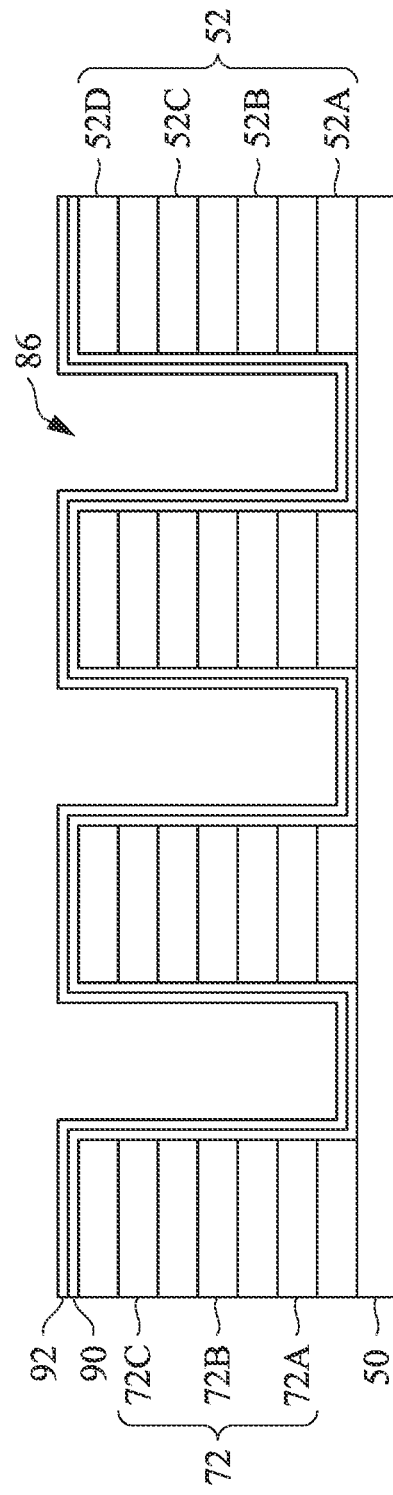

FIGS. 14A through 17C illustrate forming and patterning channel regions for the transistors 204 (see FIGS. 1A and 1B) in the trenches 86. In FIGS. 14A through 14C, a memory film 90 and an OS layer 92 are deposited in the trenches 86. The memory film 90 may be deposited conformally in the trenches 86 along sidewalls of the conductive lines 72, the first material layers 52, and the IMD 70 and along top surfaces of the first material layer 52D and the IMD 70. The memory film 90 may be deposited by CVD, PVD, ALD, PECVD, or the like.

The memory film 90 may provide gate dielectrics for the transistors 204 formed in the memory array 200. The memory film 90 may comprise a material that is capable of switching between two different polarization directions by applying an appropriate voltage differential across the memory film 90. The memory film 90 may be a high-k dielectric material, such as a hafnium (Hf) based dielectric material or the like. In some embodiments, the memory film 90 comprises a ferroelectric (FE) material, such as hafnium oxide, hafnium zirconium oxide, silicon-doped hafnium oxide, or the like. In some embodiments, the memory film 90 may comprise different ferroelectric materials or different types of memory materials. In some embodiments, the memory film 90 may be a multilayer memory structure comprising a layer of $SiN_x$ between two $SiO_x$ layers (e.g., an ONO structure).

The OS layer 92 is conformally deposited in the trenches 86 over the memory film 90. The OS layer 92 comprises materials suitable for providing channel regions for the transistors 204 (see FIGS. 1A and 1B). For example, the OS layer 92 may include zinc oxide (ZnO), indium tungsten oxide (InWO), indium gallium zinc oxide (InGaZnO, IGZO), indium zinc oxide (InZnO), indium tin oxide (ITO), polycrystalline silicon (poly-Si), silicon (Si), amorphous silicon (a-Si), combinations thereof, or the like. The OS layer 92 may be deposited by CVD, PVD, ALD, PECVD, or the like. The OS layer 92 may extend along sidewalls and bottom surfaces of the trenches 86 over the memory film 90.

Figure 15A:
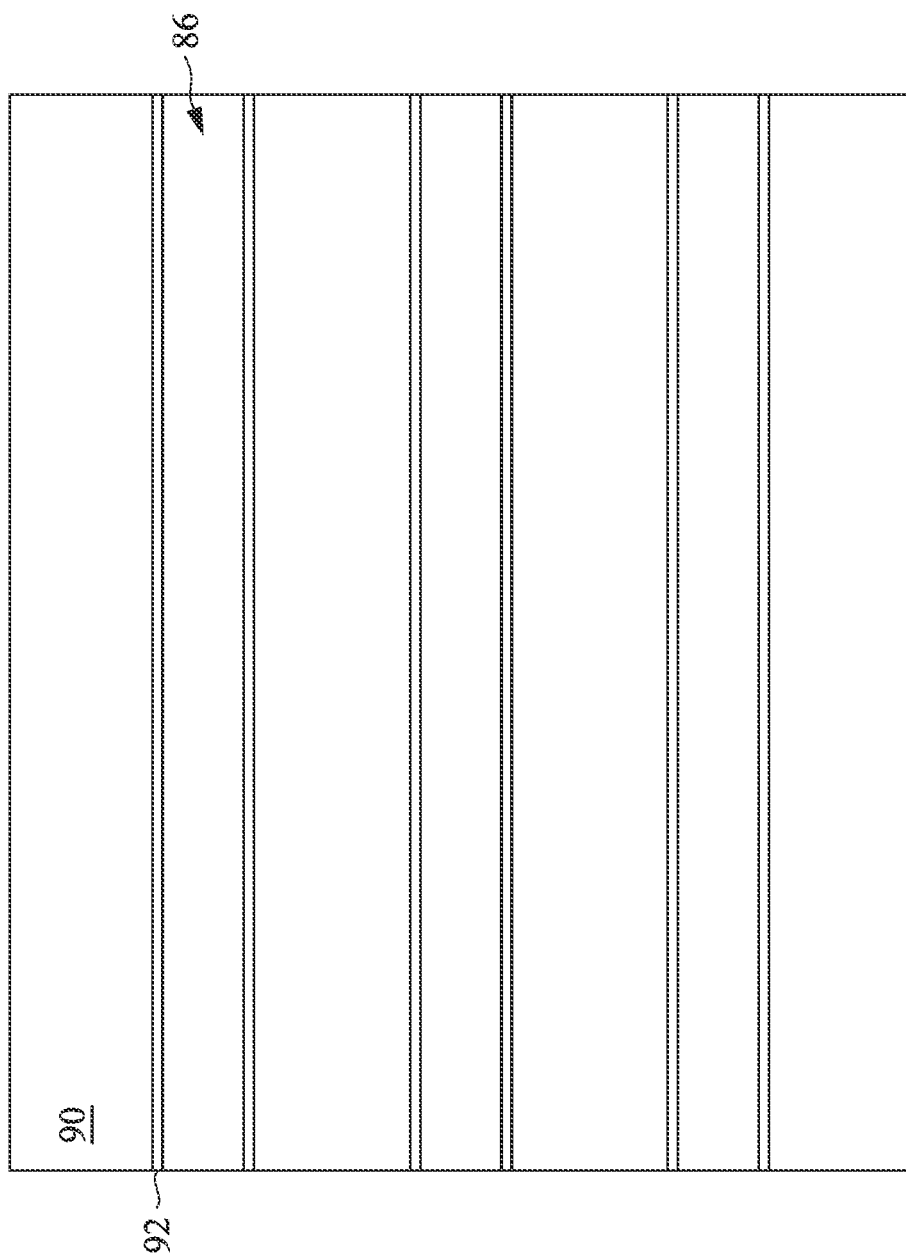
Figure 15B:
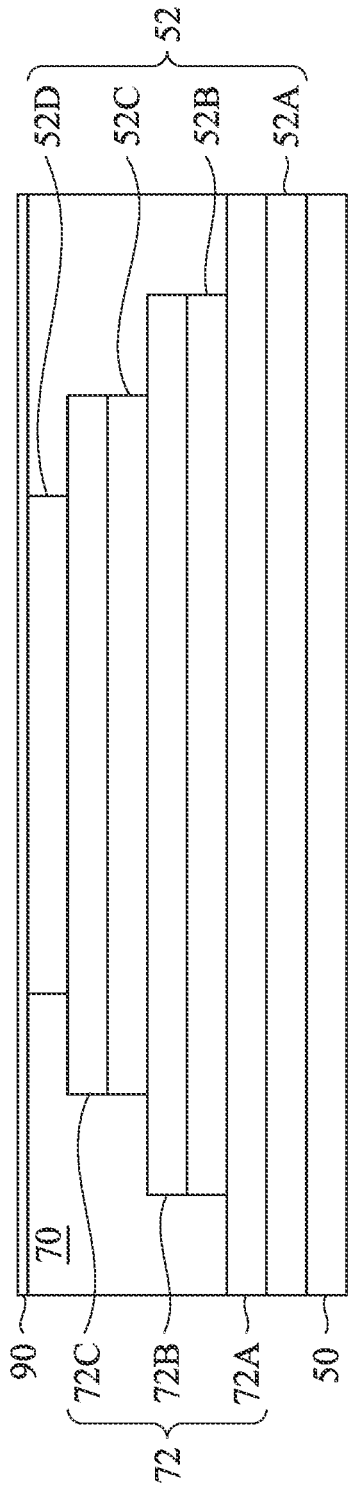
Figure 15C:
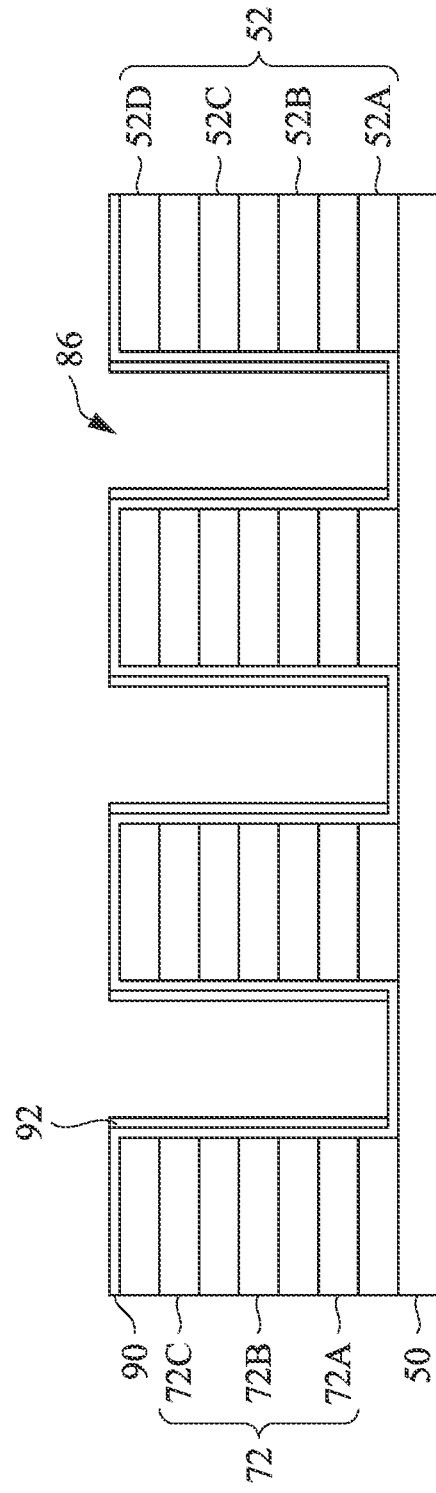

In FIGS. 15A through 15C, the OS layer 92 is etched using a suitable etch process, such as an anisotropic etch process, which separates the OS layer 92 into a plurality of OS layers 92. Horizontal portions of the OS layer 92, such as portions of the OS layer 92 extending along top surfaces of the memory film 90, may be removed, while vertical portions of the OS layer 92, such as portions of the OS layer 92 extending along side surfaces of the memory film 90, remain. The suitable etch process may be any acceptable etch process, such as wet or dry etching, RIE, NBE, the like, or a combination thereof.

Figure 16A:
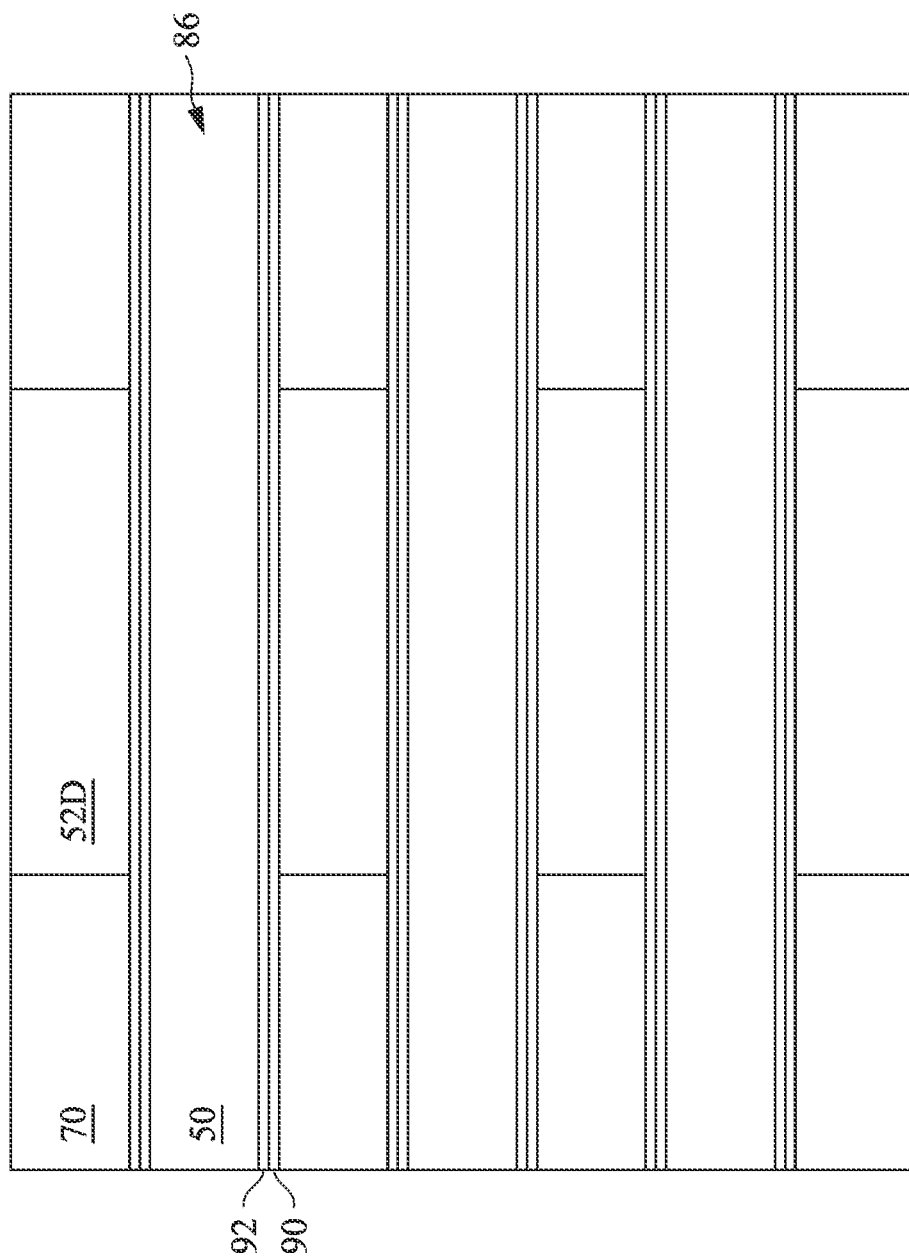
Figure 16B:
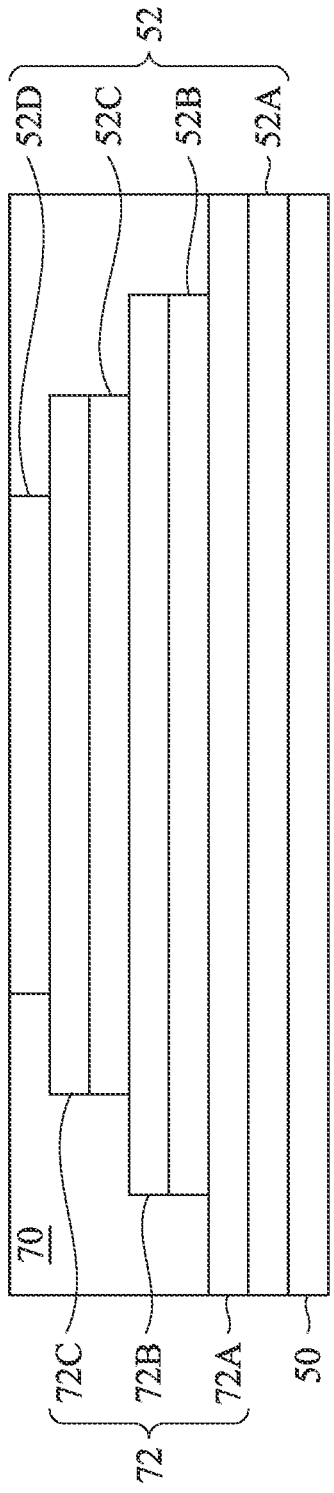
Figure 16C:
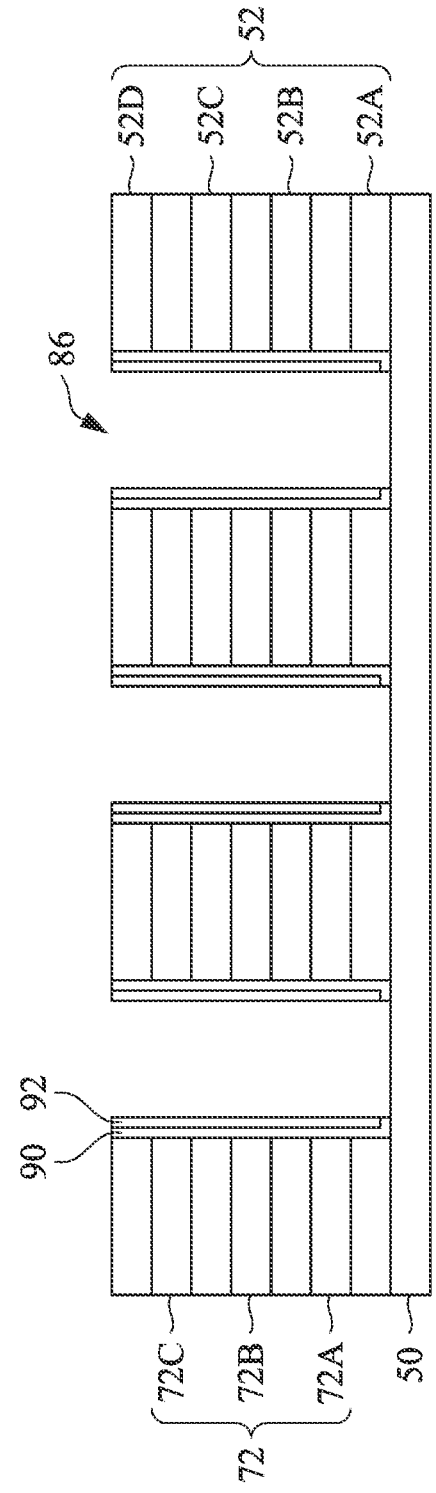

In FIGS. 16A through 16C, the memory film 90 is etched using a suitable etch process, such as an anisotropic etch process, which separates the memory film 90 into a plurality of memory films 90. Horizontal portions of the memory film 90, such as portions of the memory film 90 extending along top surfaces of the substrate 50 and the first material layer 52D, may be removed, while vertical portions of the memory film 90, such as portions of the memory film 90 extending along side surfaces of the conductive lines 72, the first material layers 52, and the IMD 70, remain. The suitable etch process may be any acceptable etch process, such as wet or dry etching, RIE, NBE, the like, or a combination thereof. The OS layers 92 may mask portions of the memory film 90 during the etch process, such that the memory films 90 are L-shaped following the etch process.

Figure 17A:
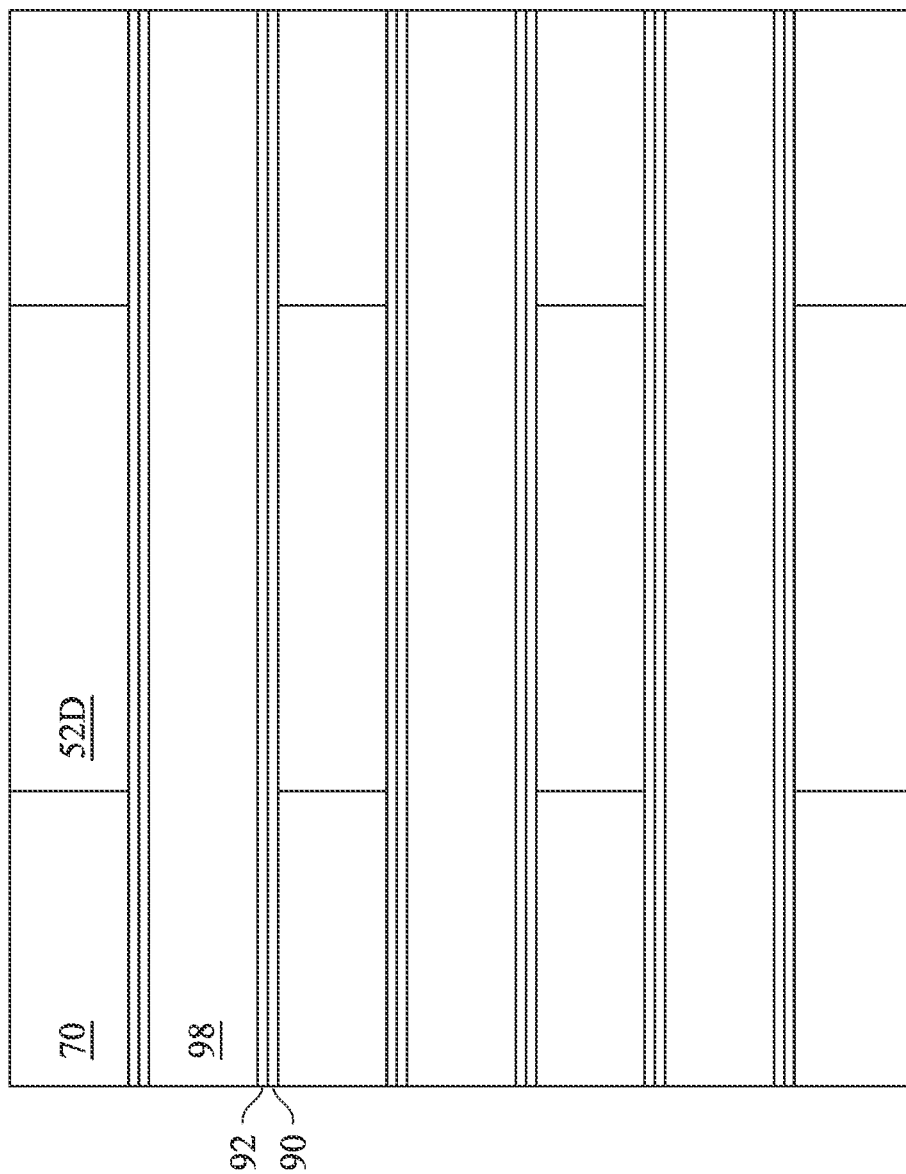
Figure 17B:
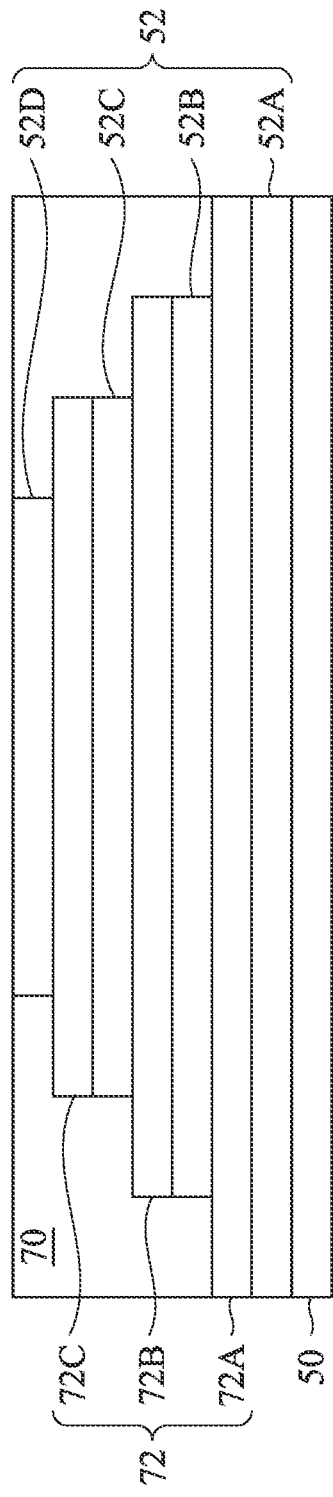
Figure 17C:
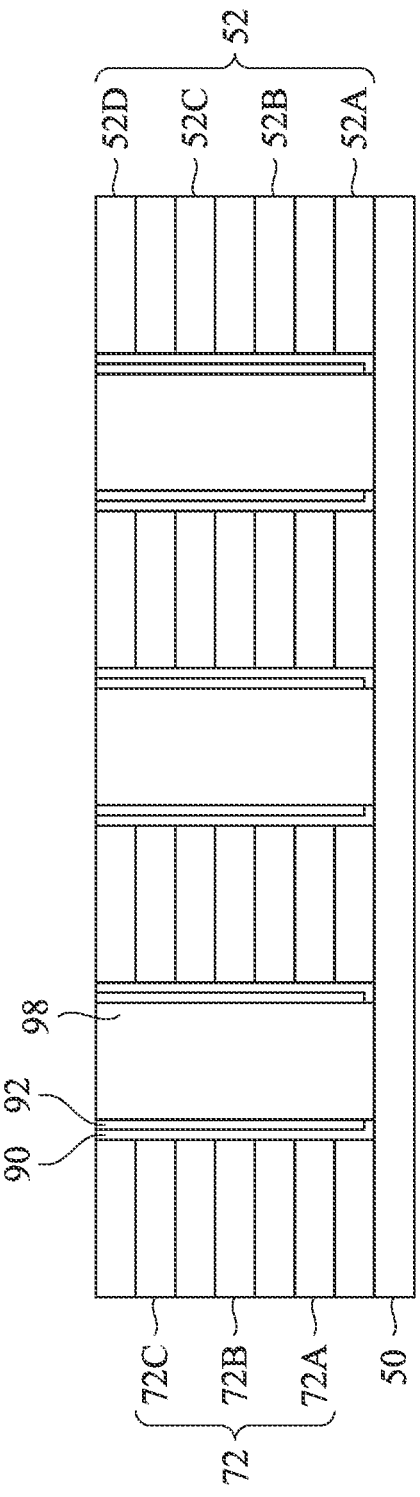

In FIGS. 17A through 17C, dielectric materials 98 are deposited to fill remaining portions of the trenches 86. The dielectric materials 98 may include, for example, silicon oxide, silicon nitride, silicon oxynitride, or the like, which may be deposited by CVD, PVD, ALD, PECVD, or the like. A removal process is applied to the dielectric materials 98, the OS layers 92, and the memory films 90 to remove excess materials over the conductive lines 72, the first material layers 52, and the IMD 70. In some embodiments, a planarization process such as a CMP, an etch-back process, combinations thereof, or the like may be utilized. The planarization process exposes top surfaces of the IMD 70 and the first material layer 52D such that top surfaces of the first material layer 52D, the IMD 70, the memory films 90, the OS layers 92, and the dielectric materials 98 are level with one another after the planarization process is complete.

FIGS. 18A through 21D illustrate intermediate steps of manufacturing dielectric materials 102, conductive lines 106 (e.g., bit lines), and conductive lines 108 (e.g., source lines) in the memory array 200. The conductive lines 106 and the conductive lines 108 may extend in a direction perpendicular to the conductive lines 72 such that individual memory cells 202 of the memory array 200 may be selected for read and write operations.

Figure 18A:
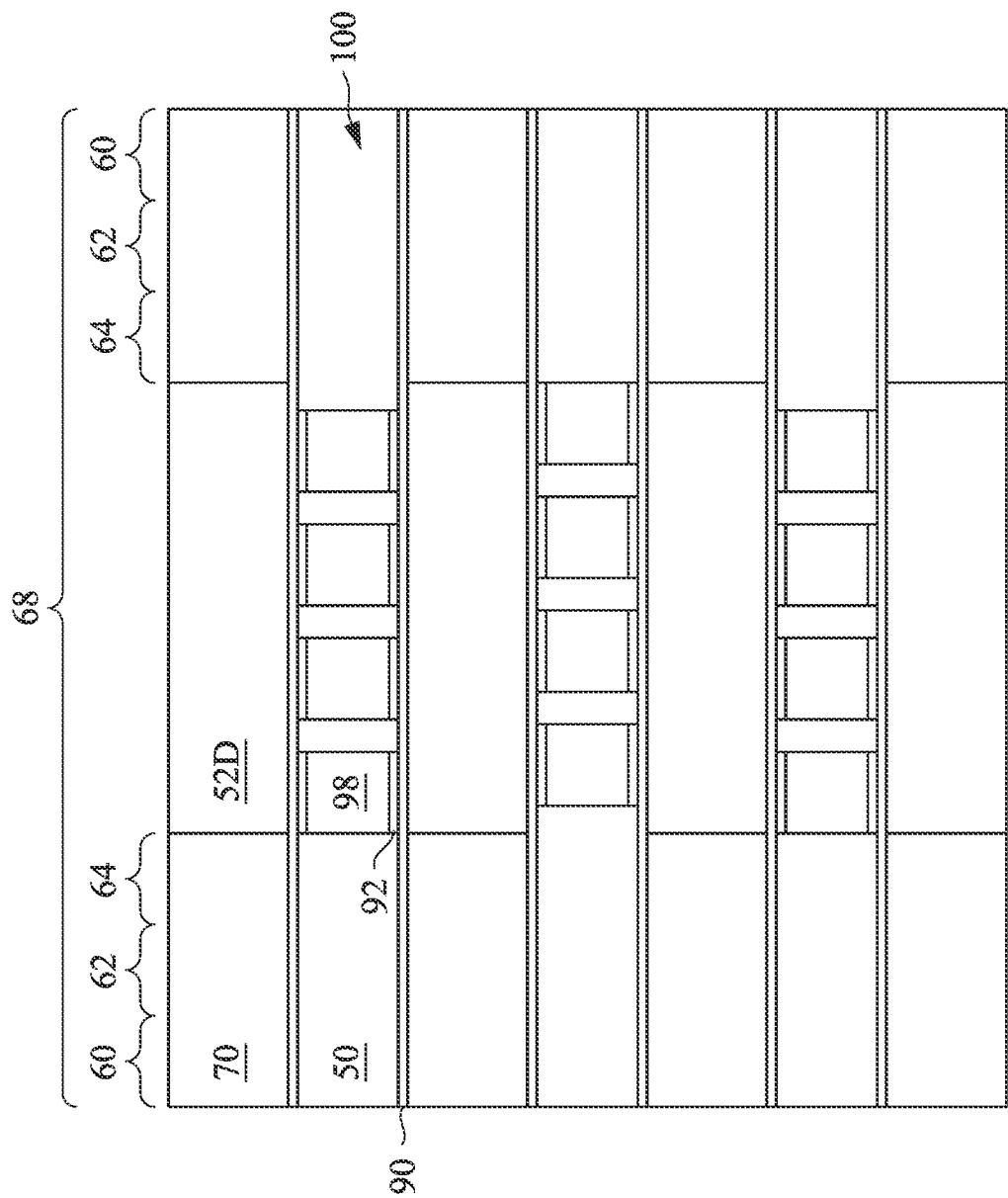
Figure 18B:
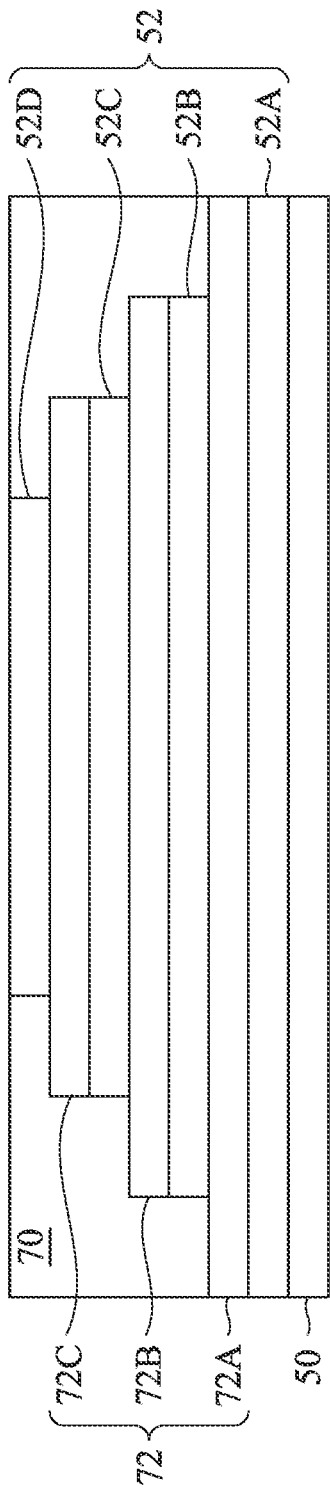
Figure 18C:
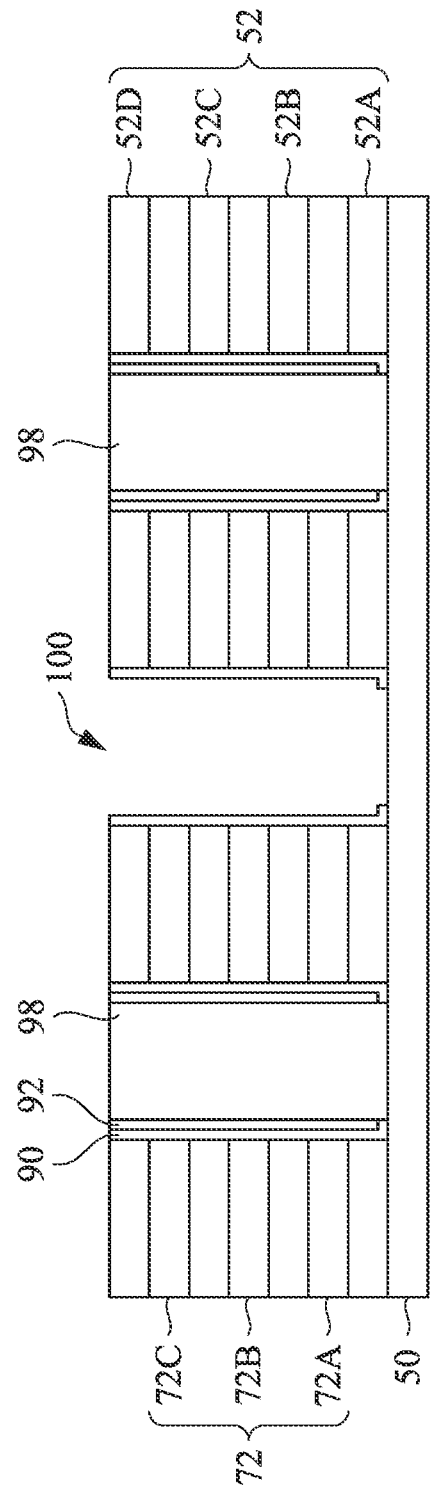

In FIGS. 18A through 18C, trenches 100 are patterned through the dielectric materials 98 and the OS layers 92. The trenches 100 may be patterned in the dielectric materials 98 and the OS layers 92 through a combination of photolithography and etching. The etching may be any acceptable etching processes, such as wet or dry etching, RIE, NBE, the like, or a combination thereof. The etching may be anisotropic. The trenches 100 may be disposed between opposing sidewalls of the memory films 90 and the trenches 100 may physically separate adjacent stacks of the memory cells 202 in the memory array 200 (see FIG. 1A). The dielectric materials 98 and the OS layers 92 may be completely removed in the region 60, the region 62, and the region 64 of the staircase structure 68 adjacent the IMD 70, the conductive lines 72, and the first material layers 52. In some embodiments (not separately illustrated), the trenches 100 may also be patterned through the memory films 90. As such, the trenches 100 may be disposed between opposing sidewalls of the conductive lines 72 and the first material layers 52 and the trenches 100 may physically separate adjacent stacks of the memory cells 202 in the memory array 200 (see FIG. 1A).

Figure 19A:
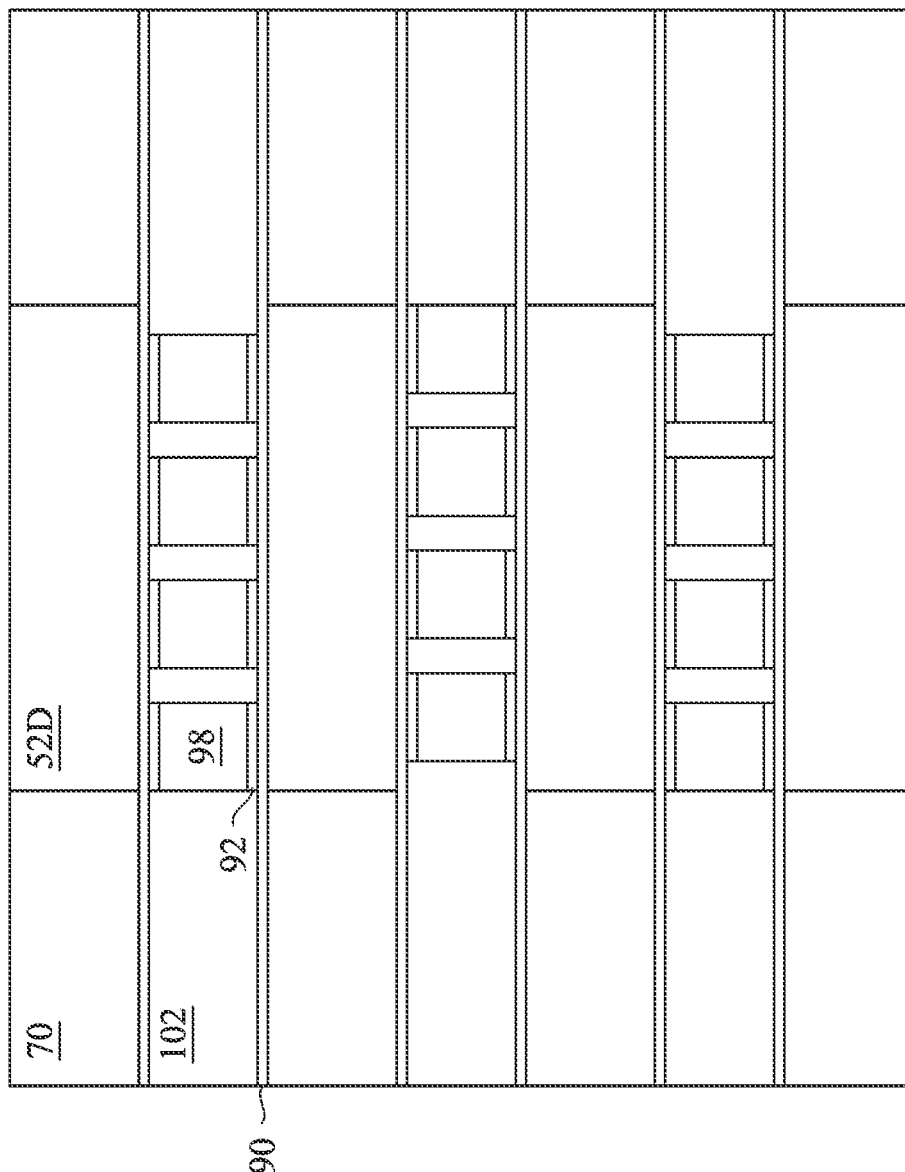
Figure 19B:
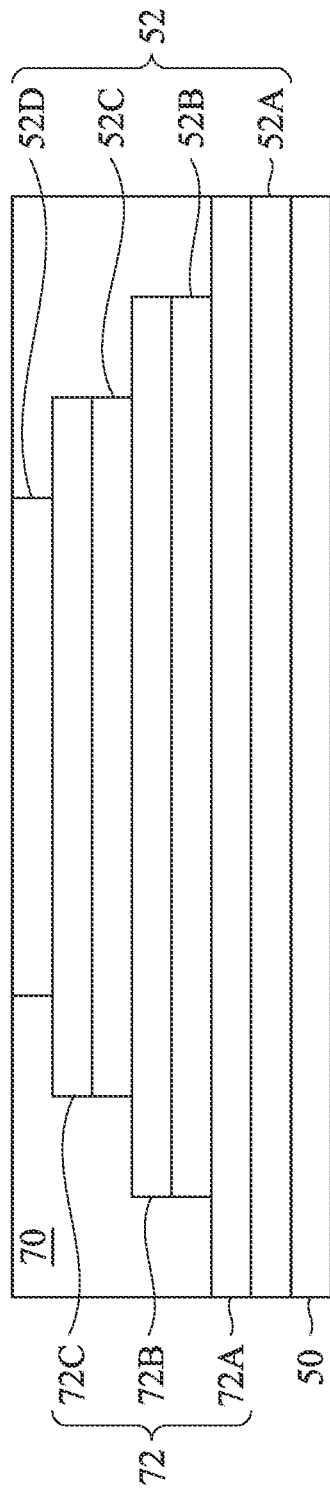
Figure 19C:
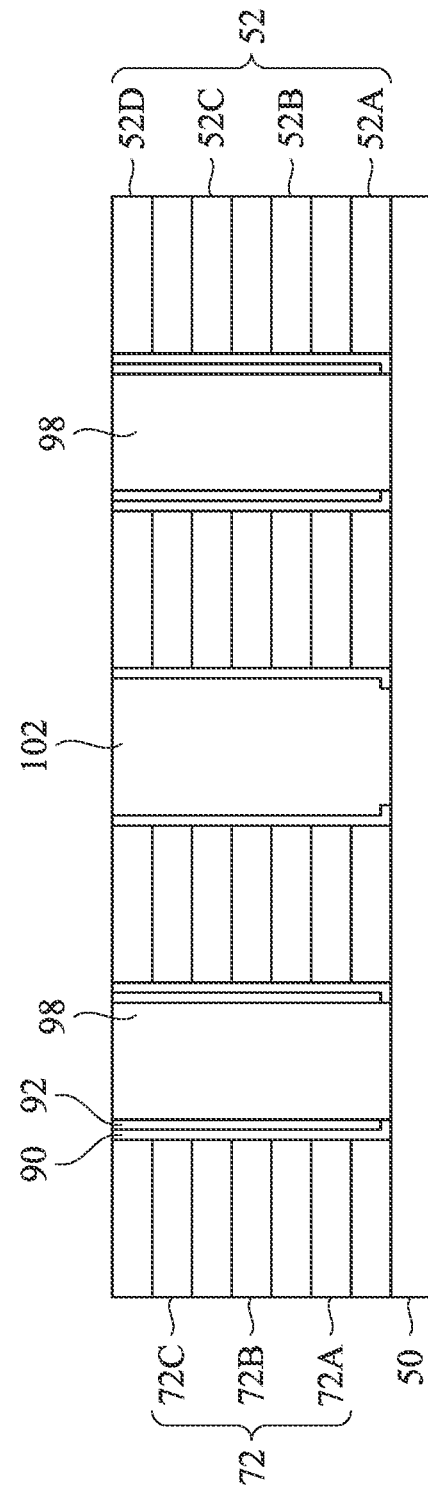

In FIGS. 19A through 19C, dielectric materials 102 are deposited in and fill the trenches 100. The dielectric materials 102 may include, for example, silicon oxide, silicon nitride, silicon oxynitride, or the like, which may be deposited by CVD, PVD, ALD, PECVD, or the like. The dielectric materials 102 may extend along sidewalls and bottom surfaces of the trenches 100 over the memory films 90. After deposition, a planarization process (e.g., a CMP, an etch-back, or the like) may be performed to remove excess portions of the dielectric materials 102. In the resulting structure, top surfaces of the first material layer 52D, the memory films 90, the memory films 90, the IMD 70, the dielectric materials 98, and the dielectric materials 102 may be substantially level (e.g., within process variations) with one another.

In some embodiments, materials of the dielectric materials 98 and the dielectric materials 102 may be selected so that they may be etched selectively relative each other. For example, in some embodiments, the dielectric materials 98 are an oxide and the dielectric materials 102 are a nitride. In some embodiments, the dielectric materials 98 are a nitride and the dielectric materials 102 are an oxide. Other materials are also possible.

Figure 20A:
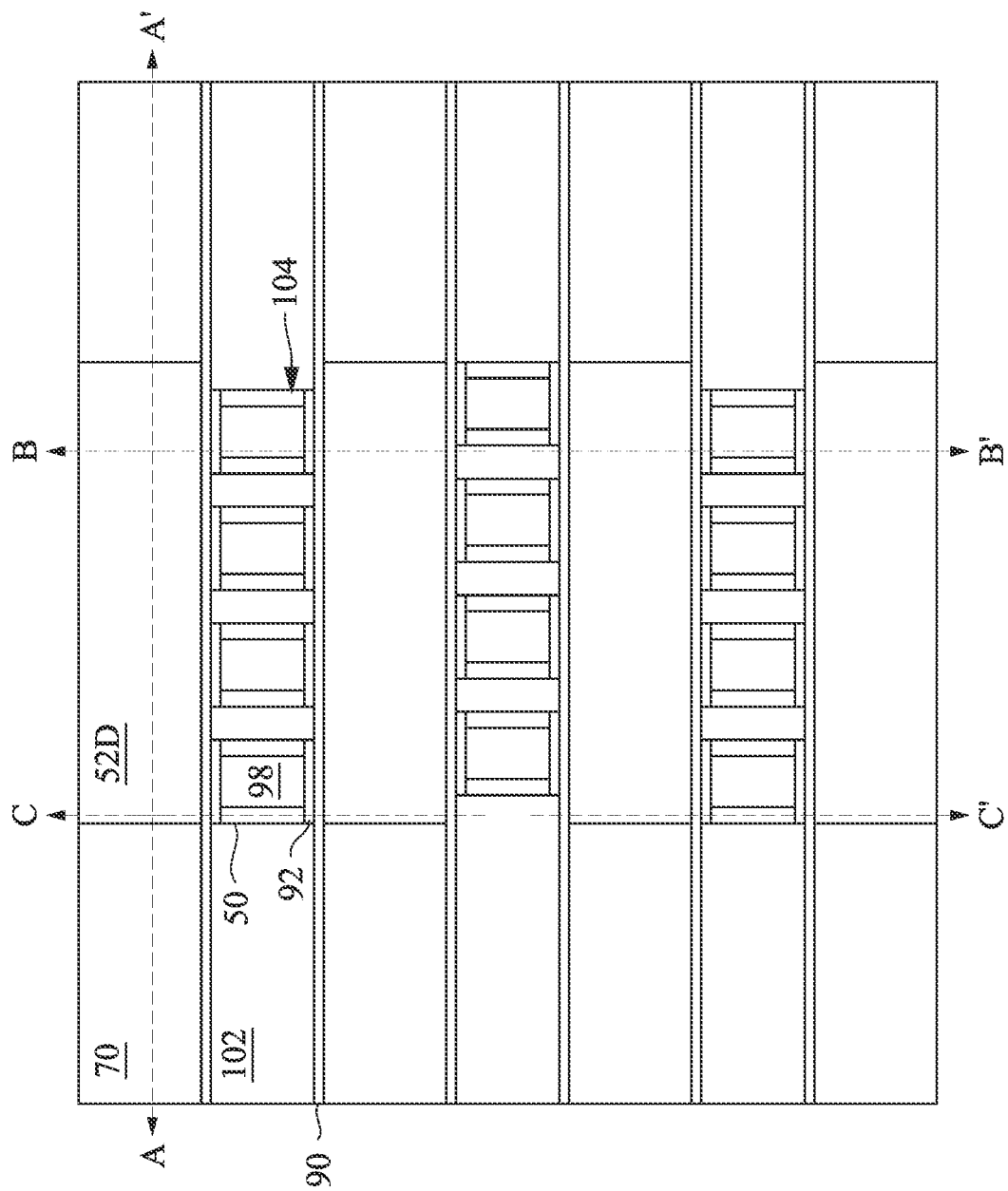
Figure 20B:
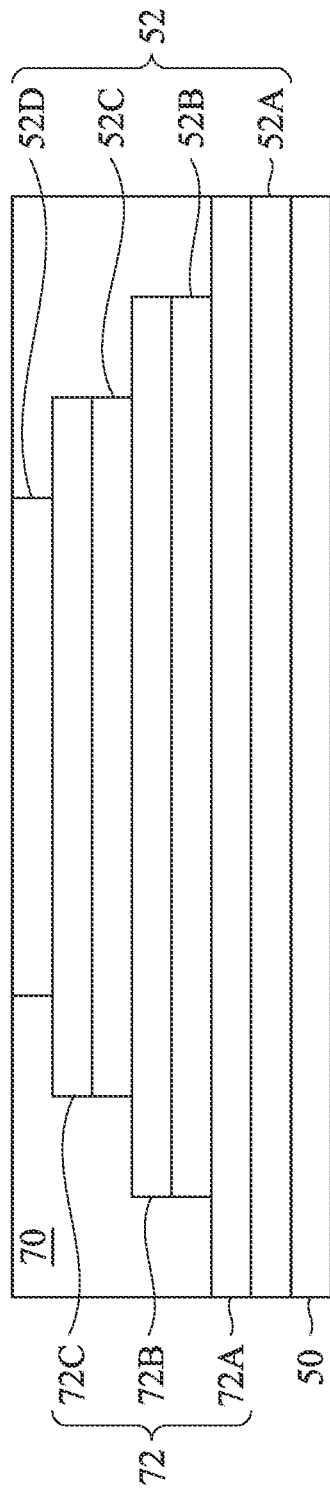
Figure 20C:
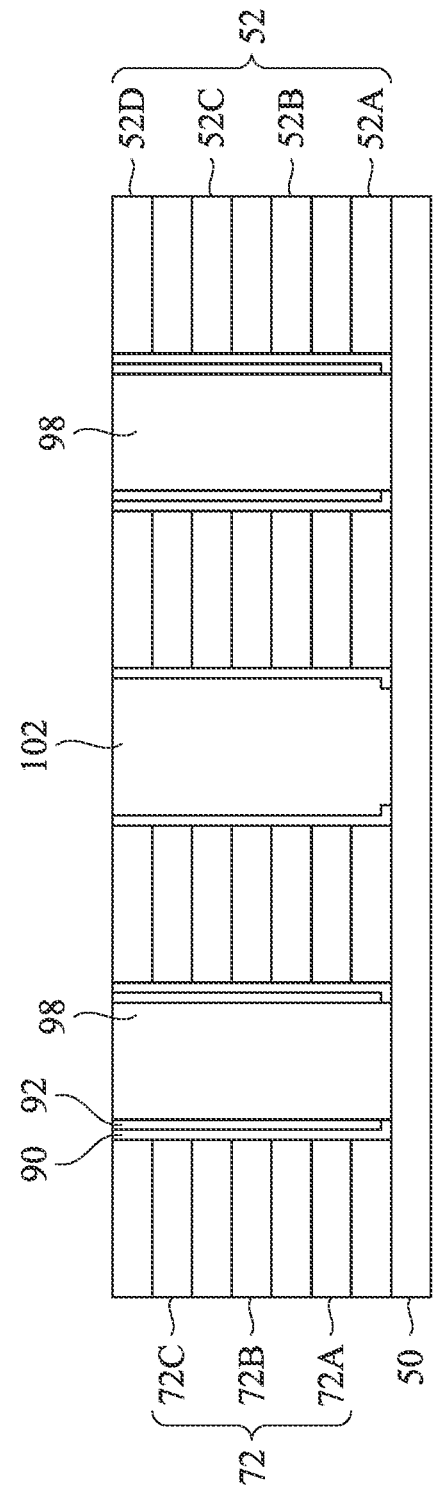
Figure 20D:
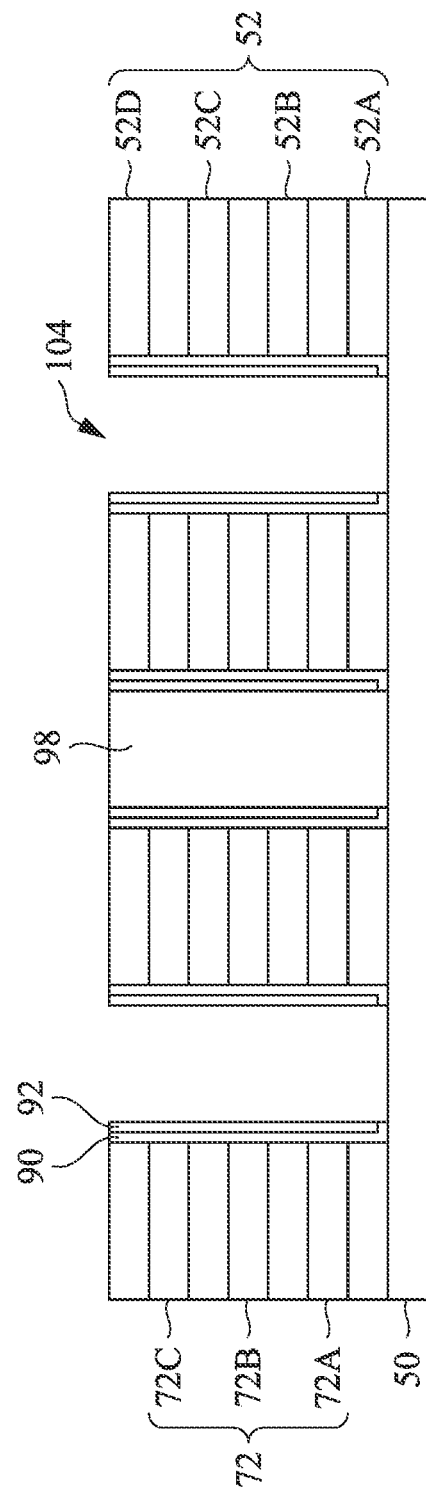
Figure 21A:
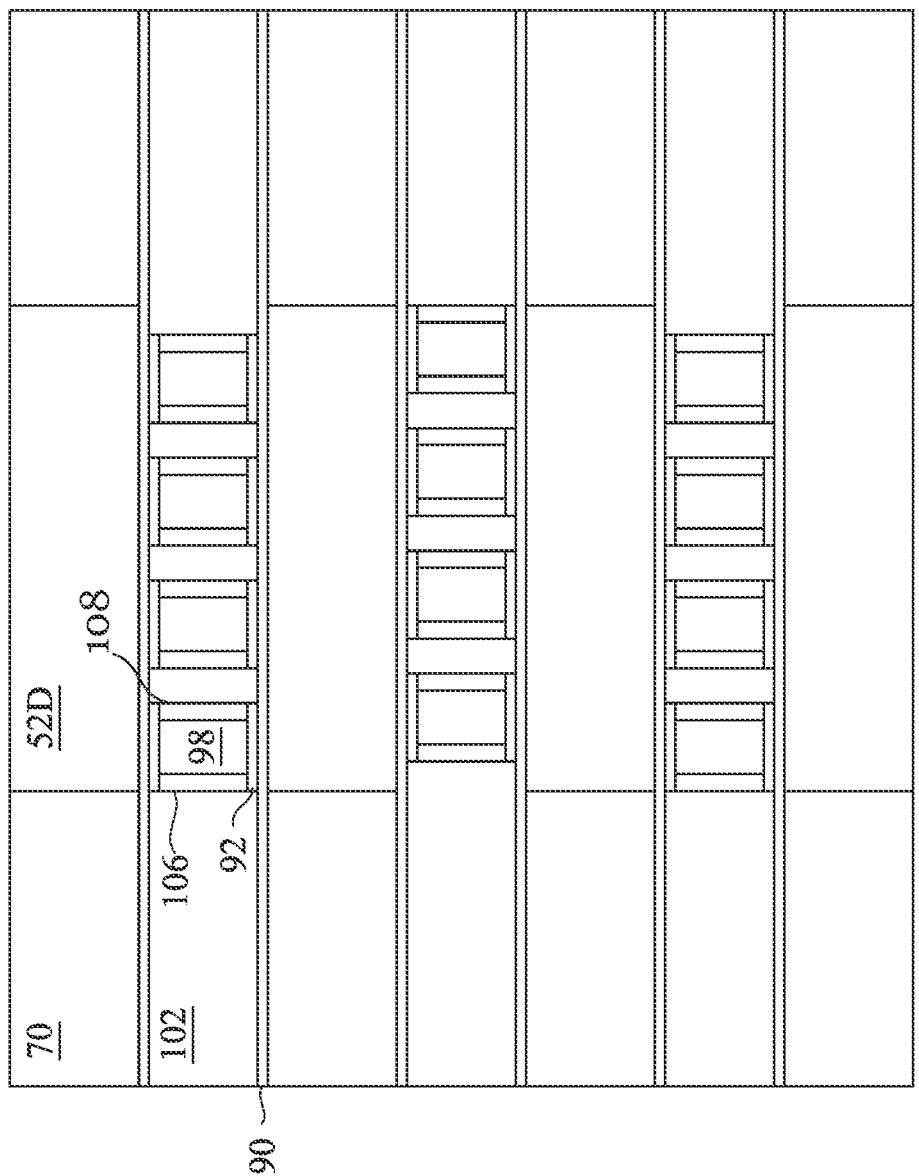
Figure 21B:
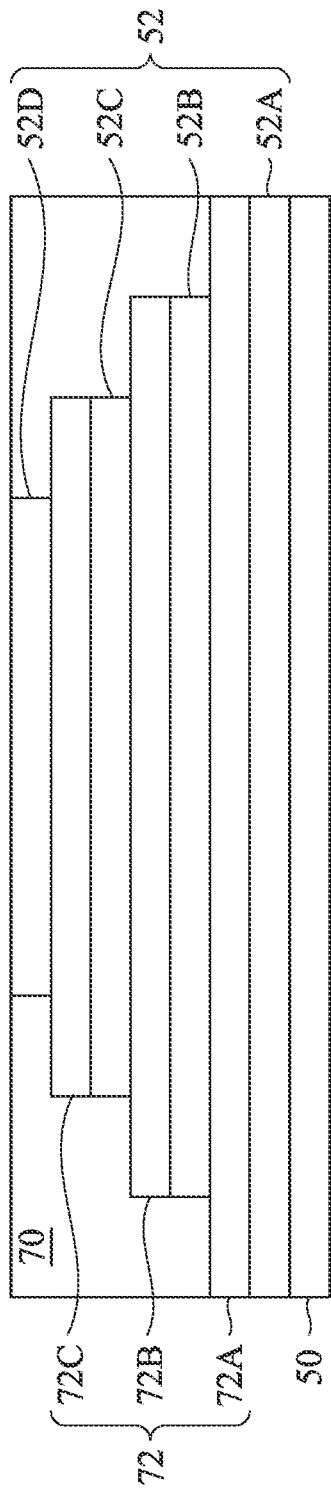
Figure 21C:
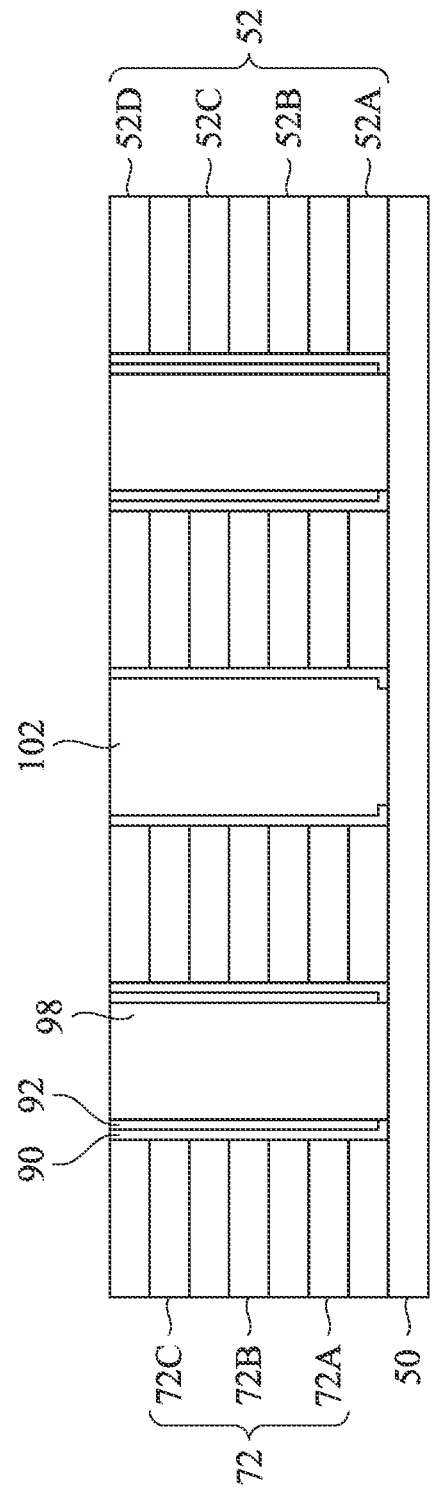
Figure 21D:
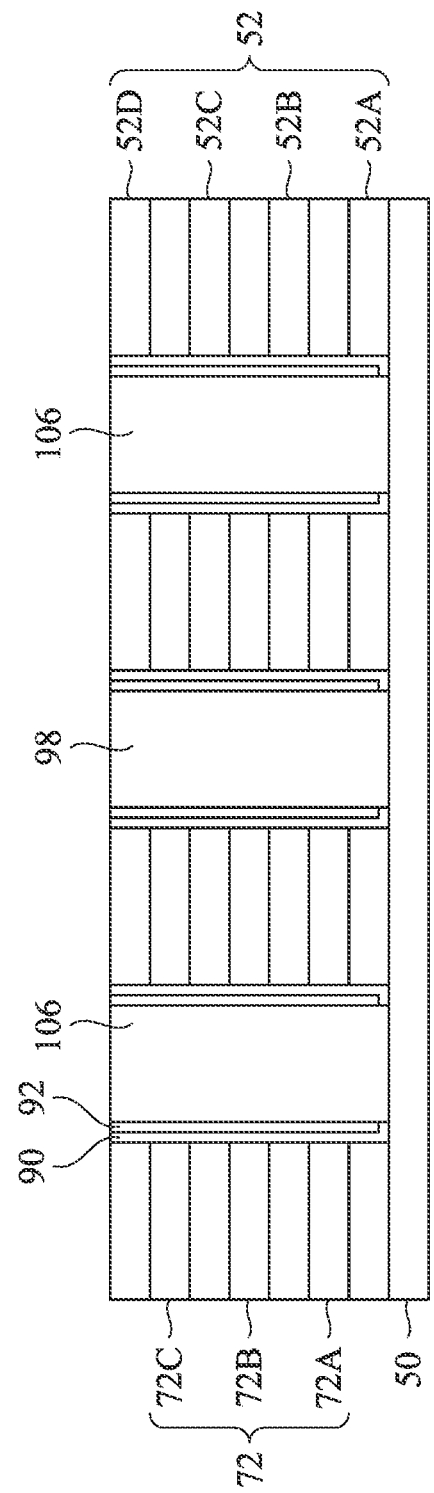

FIG. 20A illustrates reference cross-sections of the memory array 200 that are used in later figures. Cross-section A-A' is along longitudinal axes of conductive lines 72 and in a direction, for example, parallel to the direction of current flow across the OS layers 92 of the transistors 204. Cross-section B-B' is perpendicular to the cross-section A-A' and the longitudinal axes of the conductive lines 72. The cross-section B-B' extends through the dielectric materials 98 and the dielectric materials 102. Cross-section C-C' is parallel to the cross-section B-B' and extends through subsequently formed conductive lines (such as the conductive lines 106, discussed below with respect to FIGS. 21A through 21D). Subsequent figures refer to these reference cross-sections for clarity. In FIGS. 20A through 21D, figures ending in "A" illustrate a top-down view, figures ending in "B" illustrate a cross-sectional view along line A-A' of FIG. 20A, figures ending in "C" illustrate a cross-sectional view along line B-B' of FIG. 20A, and figures ending in "D" illustrate a cross-sectional view along line C-C' of FIG. 20A.

In FIGS. 20A through 20D, trenches 104 are patterned through the dielectric materials 98. The trenches 104 may be subsequently used to form conductive lines. The trenches 104 may be patterned through the dielectric materials 98 using a combination of photolithography and etching. The etching may be any acceptable etch process, such as wet or dry etching, RIE, NBE, the like, or a combination thereof. The etching may be anisotropic. The etching may use etchants that etch the dielectric materials 98 without significantly etching the dielectric materials 102, the OS layers 92, or the memory films 90. A pattern of the trenches 104 may correspond to that of subsequently formed conductive lines (such as the conductive lines 106 and the conductive lines 108, discussed below with respect to FIGS. 21A through 21D). Portions of the dielectric materials 98 may remain between each pair of the trenches 104, and the dielectric materials 102 may be disposed between adjacent pairs of the trenches 104. Further, portions of the OS layers 92 and the memory films 90 may remain adjacent the trenches 104 between the trenches 104 and each of the first material layers 52 and the conductive lines 72. The portions of the OS layers 92 and the memory films 90 may be used as part of subsequently formed transistors 204. In some embodiments, a different etching may be used to pattern the trenches 104 as opposed to the process used to pattern the trenches 100 in order to selectively etch the material of the dielectric materials 98 with respect to the OS layers 92 and the memory films 90.

In FIGS. 21A through 21D, the trenches 104 are filled with a conductive material to form conductive lines 106 and conductive lines 108. Memory cells 202 and transistors 204 are formed, which each include a conductive line 106, a conductive line 108, a conductive line 72 a portion of the memory films 90, and a portion of the OS layers 92. The conductive lines 106 and the conductive lines 108 may each comprise conductive materials such as copper, titanium, titanium nitride, tantalum, tantalum nitride, tungsten, ruthenium, aluminum, combinations thereof, or the like. The conductive lines 106 and the conductive lines 108 may be formed using, for example, CVD, ALD, PVD, PECVD, or the like. After the conductive materials are deposited, a planarization (e.g., a CMP, an etch-back, or the like) may be performed to remove excess portions of the conductive materials, thereby forming the conductive lines 106 and the conductive lines 108. In the resulting structure, top surfaces of the first material layer 52D, the IMD 70, the memory films 90, the OS layers 92, the dielectric materials 98, the dielectric materials 102, the conductive lines 106, and the conductive lines 108 may be substantially level (e.g., within process variations) with one another.

The conductive lines 106 may correspond to bit lines in the memory array 200 and the conductive lines 108 may correspond to source lines in the memory array 200. Further, the conductive lines 106 and the conductive lines 108 may provide source/drain electrodes for the transistors 204 in the memory array 200. Although FIG. 21D illustrates a cross-sectional view that only shows the conductive lines 106, a cross-sectional view of the conductive lines 108 may be similar.

Although the channel regions for the transistors 204, the conductive lines 106, and the conductive lines 108 have been discussed as being formed after forming the staircase structure 68, in some embodiments, the staircase structure 68 may be formed after forming the channel regions for the transistors 204, the conductive lines 106, and the conductive lines 108. For example, the manufacturing steps illustrated in and described with respect to FIGS. 4 through 10 to form the staircase structure 68 may be performed after the manufacturing steps illustrated in and described with respect to Figures nA through 21D. The same or similar processes may be used in staircase-first and staircase-last embodiments.

Figure 22A:
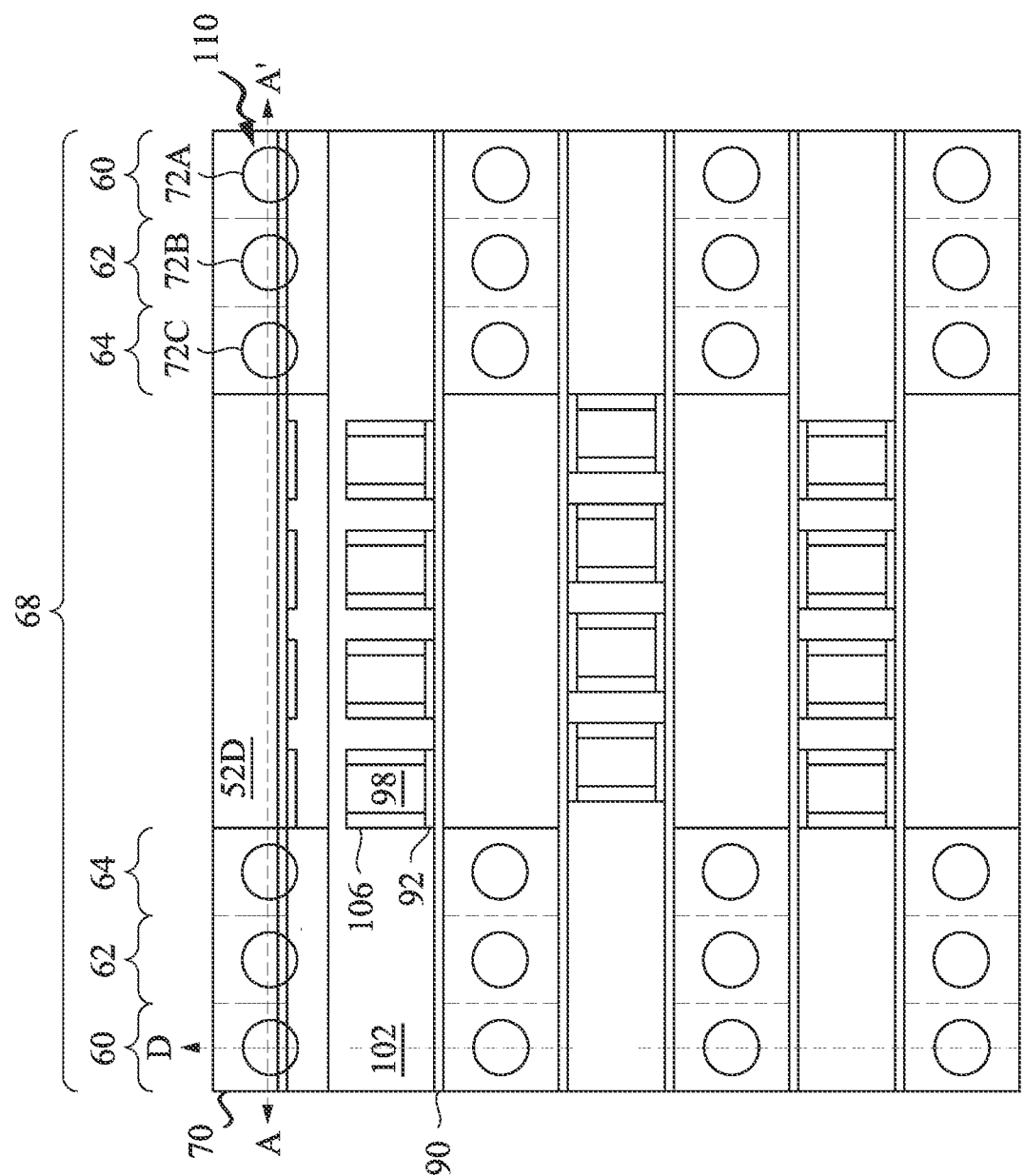

FIG. 22A illustrates reference cross-sections of the memory array 200 that are used in later figures. Cross-section A-A' is along longitudinal axes of conductive lines 72 and in a direction, for example, parallel to the direction of current flow across the OS layers 92 of the transistors 204. Cross-section D-D' is perpendicular to the cross-section A-A' and the longitudinal axes of the conductive lines 72. The cross-section D-D' extends through the region 60 of the staircase structure 68. Subsequent figures refer to these reference cross-sections for clarity. In FIGS. 22A through 24C, figures ending in "A" illustrate a top-down view, figures ending in "B" illustrate a cross-sectional view along line A-A' of FIG. 22A, and figures ending in "C" illustrate a cross-sectional view along line D-D' of FIG. 22A.

Figure 22B:
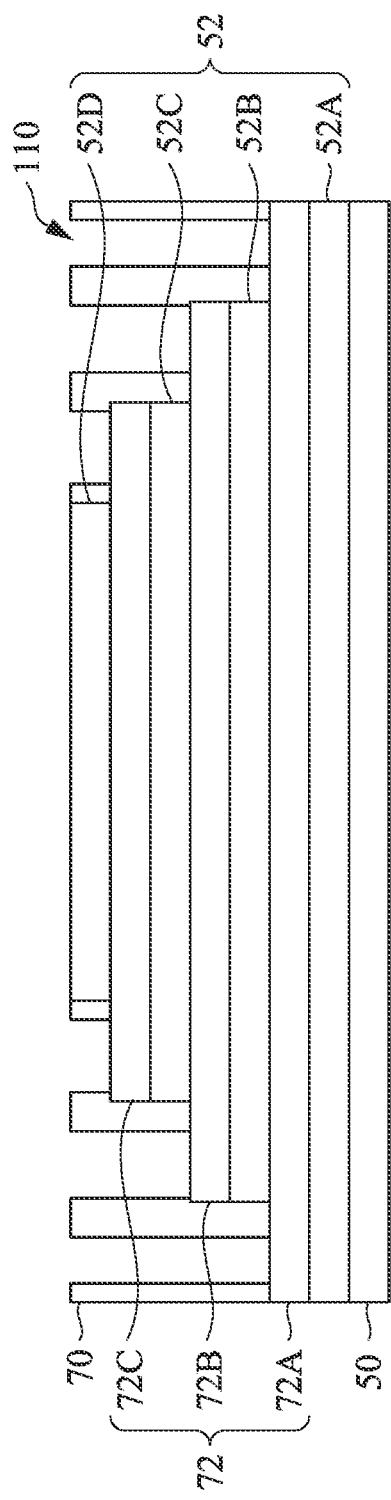
Figure 22C:
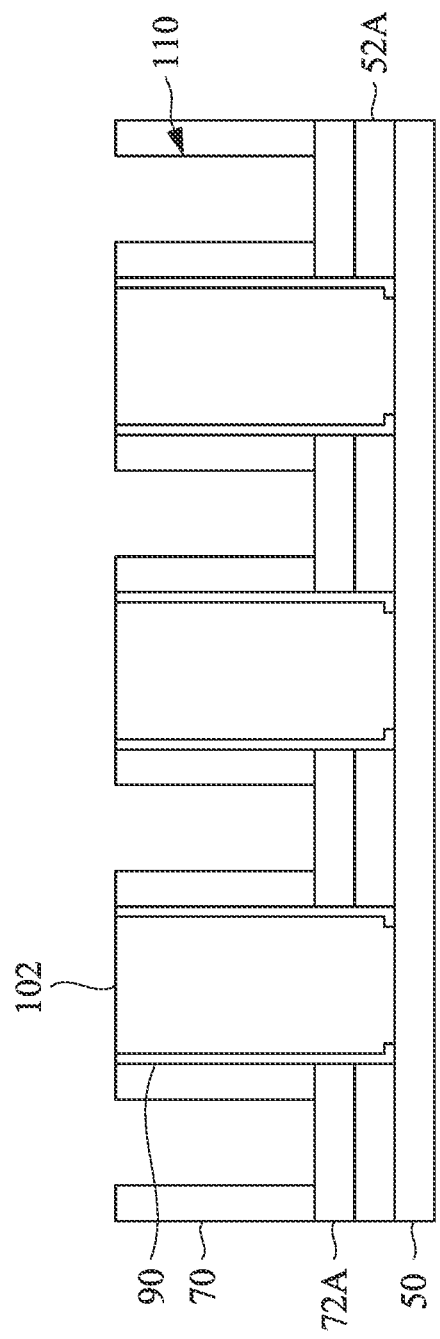

In FIGS. 22A through 22C, trenches 110 are formed in the IMD 70. The trenches 110 may subsequently be used to form conductive contacts. More specifically, the trenches no may be subsequently used to form conductive contacts extending to the conductive lines 72 (e.g., word line contacts, gate contacts, or the like). As illustrated in FIGS. 22A through 22C, the trenches no may extend through the IMD 70 and may expose top surfaces of the conductive lines 72. The staircase shape of the conductive lines 72 provides surfaces on each of the conductive lines 72 to which the trenches no may extend. The trenches no may be formed using a combination of photolithography and etching. The etching may be any acceptable etch process, such as wet or dry etching, RIE, NBE, the like, or a combination thereof. The etching may be anisotropic.

In some embodiments, the trenches 110 in the IMD 70 may be formed by a process having high etch selectivity to materials of the IMD 70. As such, the trenches 110 in the IMD 70 may be formed without significantly removing materials of the conductive lines 72. In some embodiments, openings exposing each of the conductive lines 72A-72C may be formed simultaneously. Because of variations in the thickness of the IMD 70 overlying each of the conductive lines 72A-72C, the conductive lines 72C may be exposed to the etching for a longer duration than the conductive lines 72B, which are exposed to the etching for a longer duration than the conductive lines 72A and so forth, with the conductive lines 72A being exposed to the etching for the shortest duration. Exposure to the etching may cause some material loss, pitting, or other damage in the conductive lines 72 such that the conductive lines 72C are damaged to a greatest extent, the conductive lines 72B are damaged to a decreasing extent, and the conductive lines 72A are damaged to a least extent. Forming the trenches 110 through the IMD 70 and exposing each of the conductive lines 72A-72C saves costs and time associated with performing multiple masking and etching steps. However, some of the trenches 110 may not be sufficiently etched, such that some of the conductive lines 72 are not exposed. As such, a test structure (such as the test structure 120 discussed below with respect to FIGS. 24A through 24D) may be formed over the memory array 200 in order to detect any faulty connections to the conductive lines 72. This reduces device defects.

Figure 23A:
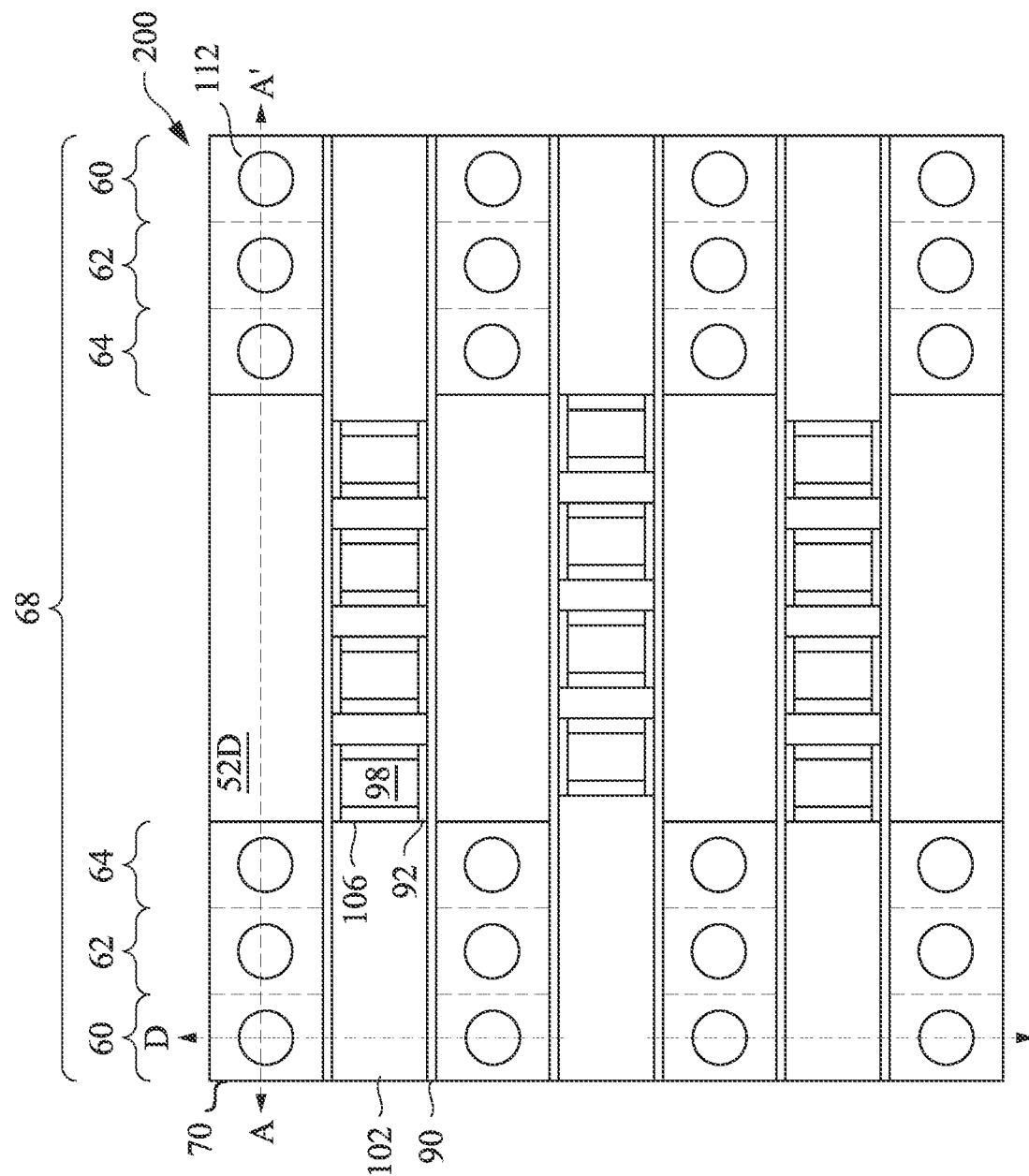
Figure 23B:
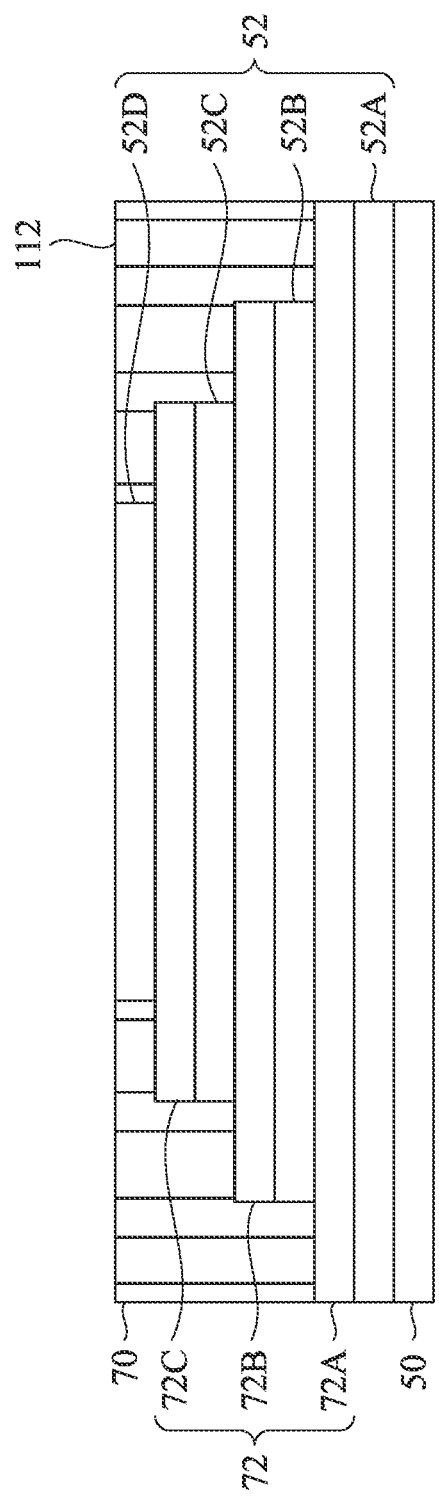
Figure 23C:
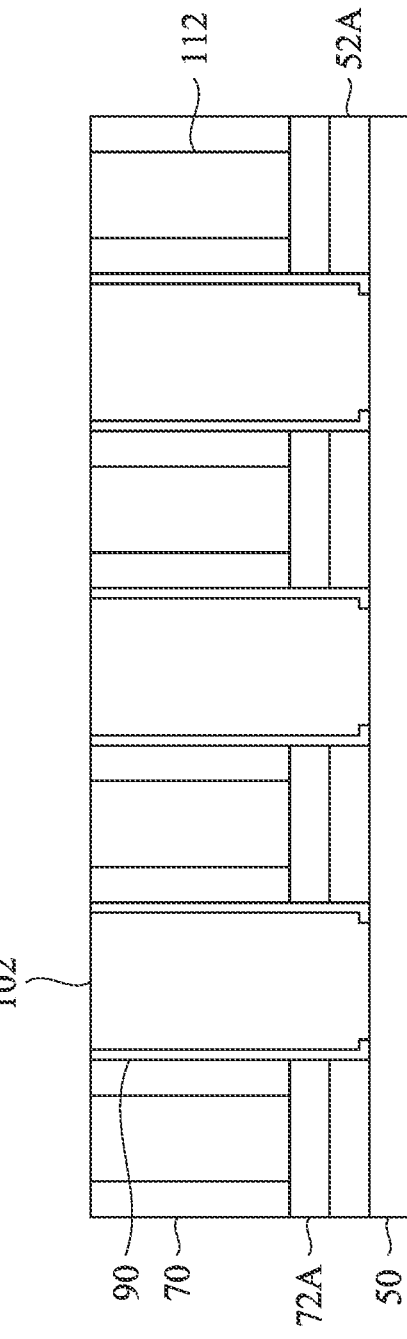
Figure 24A:
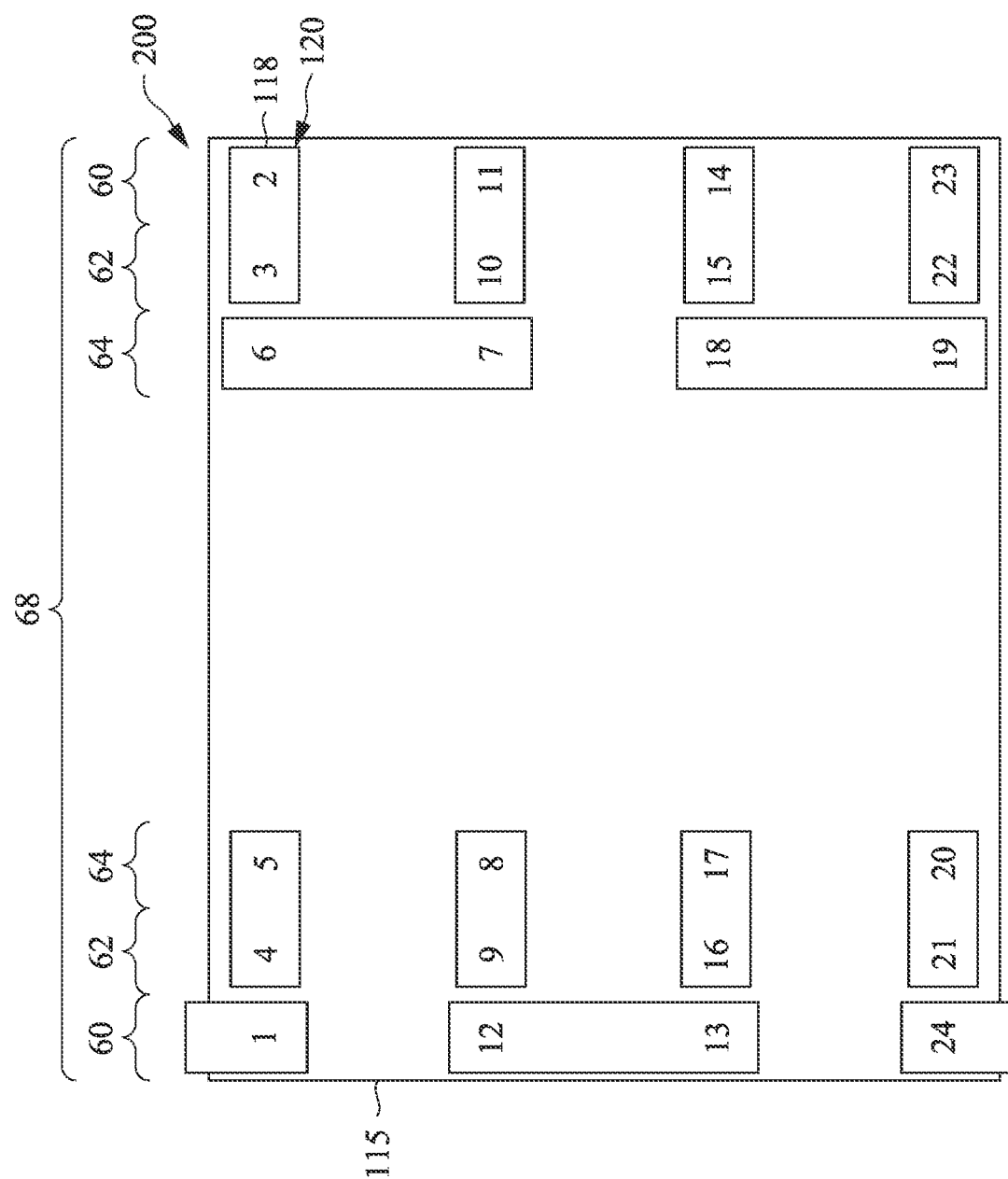
Figure 24B:
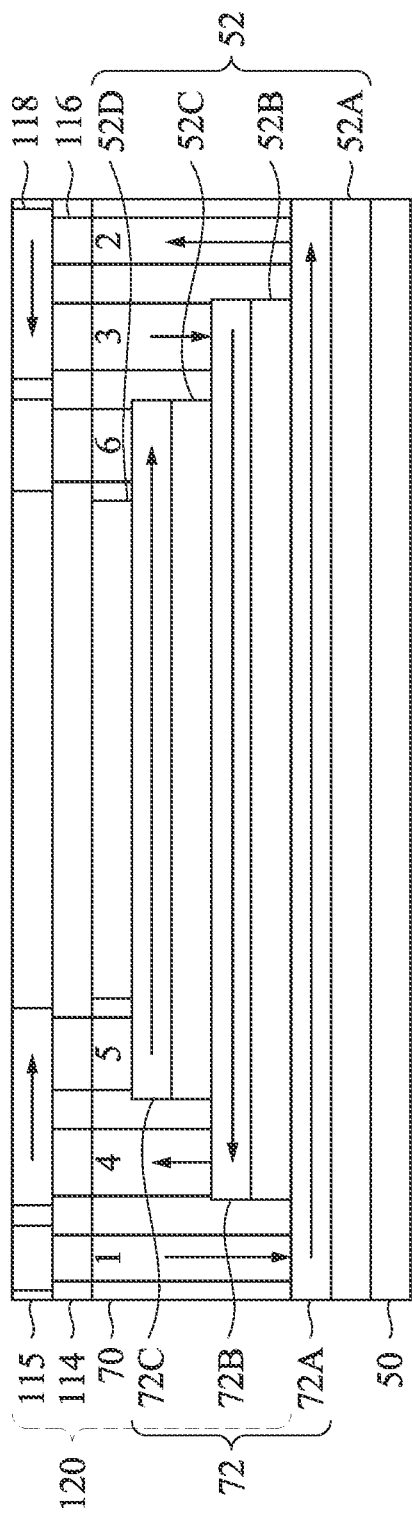
Figure 24C:
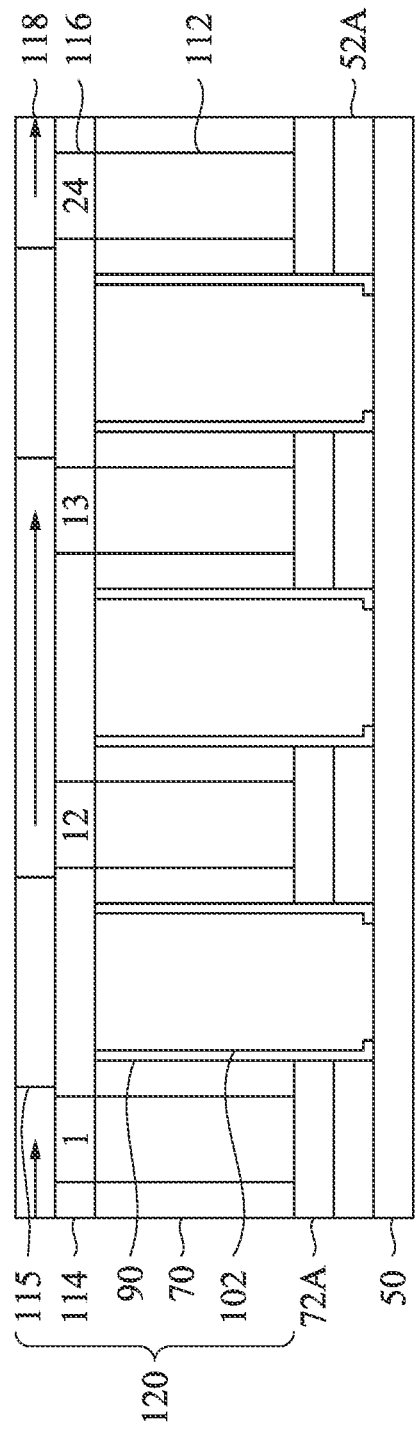
Figure 24D:
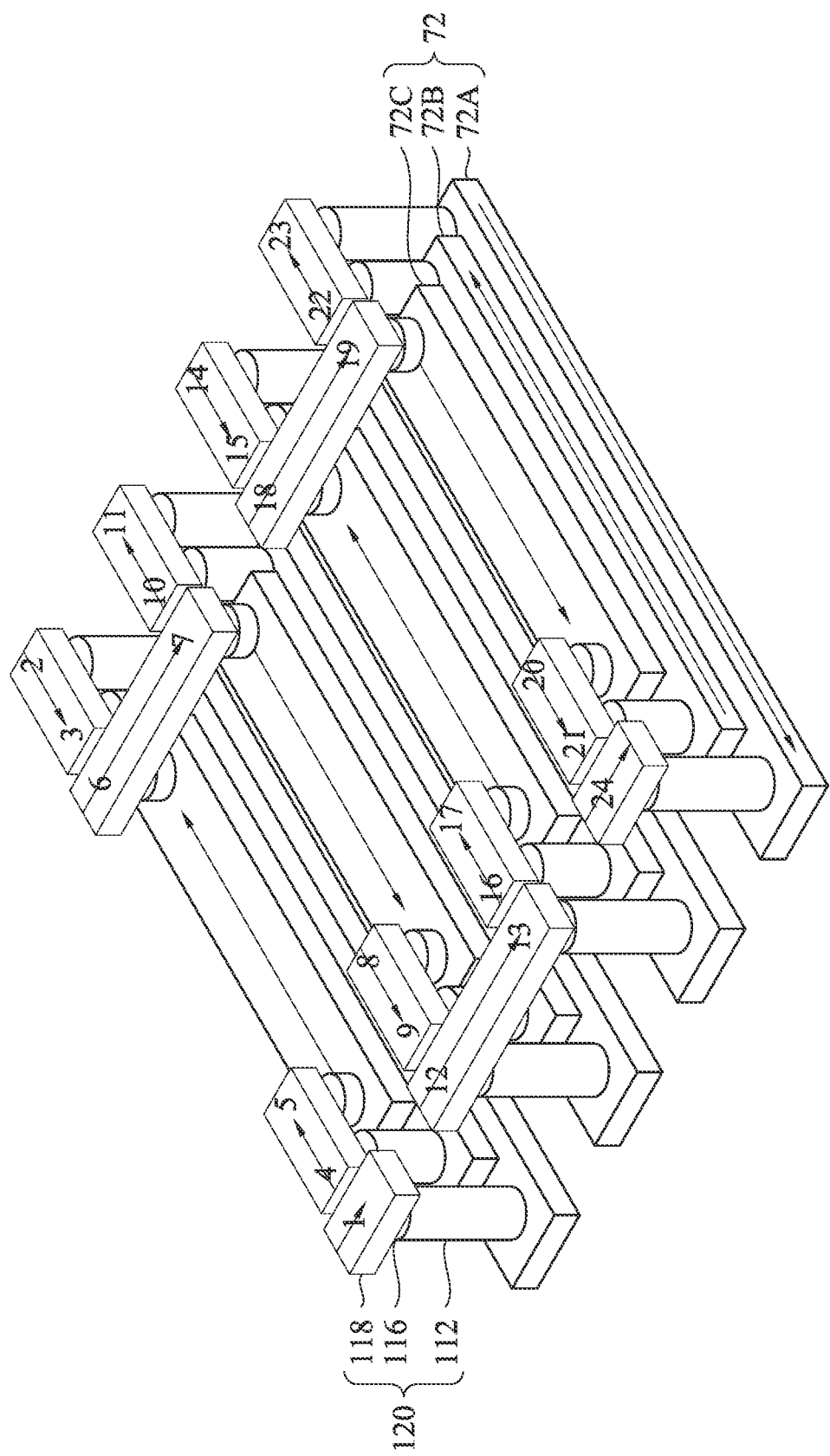

In FIGS. 23A through 23C, conductive contacts 112 are formed in the trenches 11o. The conductive contacts 112 extend through the IMD 70 to each of the conductive lines 72 and may be electrically coupled to the conductive lines 72. In some embodiments, the conductive contacts 112 may be referred to as word line contacts, gate contacts, or the like. The conductive contacts 112 may be formed by forming a liner (not separately illustrated), such as a diffusion barrier layer, an adhesion layer, or the like, and a conductive material in the trenches 110. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the IMD 70. The remaining liner and conductive material form the conductive contacts 112 in the trenches 110. As illustrated in FIGS. 23B and 23C, the conductive contacts 112 may extend to each of the conductive lines 72A-72C.

In FIGS. 24A through 24D, a first dielectric layer 114, conductive contacts 116, a second dielectric layer 115, and conductive lines 118 are formed over the structure of FIGS. 23A through 23C. The conductive contacts 112, the conductive contacts 116, and the conductive lines 118 collectively form a test structure 120. The first dielectric layer 114 and the second dielectric layer 115 may comprise dielectric materials, such as low-k dielectric materials, extra low-k (ELK) dielectric materials, or the like. In some embodiments, the first dielectric layer 114 and the second dielectric layer 115 may comprise insulating materials, such as silicon oxide, silicon nitride, silicon oxynitride, combinations thereof, or the like. The first dielectric layer 114 and the second dielectric layer 115 may be deposited using an appropriate process, such as, CVD, ALD, PVD, PECVD, or the like.

Trenches (not separately illustrated), which may be used to form the conductive contacts 116 and the conductive lines 118, are formed through the second dielectric layer 115 and the first dielectric layer 114. The trenches in the second dielectric layer 115 expose top surfaces of the first dielectric layer 114 and the trenches in the first dielectric layer 114 expose top surfaces of the conductive contacts 112. The trenches may be formed using a combination of photolithography and etching. The etching may be any acceptable etch process, such as wet or dry etching, RIE, NBE, the like, or a combination thereof. The etching may be anisotropic.

The trenches in the second dielectric layer 115 and the first dielectric layer 114 may be formed using multiple etching processes.

The conductive contacts 116 and the conductive lines 118 are then formed in the trenches in the first dielectric layer 114 and the second dielectric layer 115, respectively. The conductive contacts 116 and the conductive lines 118 may be formed by forming liners (not separately illustrated), such as diffusion barrier layers, adhesion layers, or the like, and forming conductive materials over the liners. The conductive contacts 116 and the conductive lines 118 may be formed simultaneously, or separately using one or more deposition processes. The liners may include titanium, titanium nitride, tantalum, tantalum nitride, or the like. The conductive materials may be copper, a copper alloy, silver, gold, tungsten, cobalt, aluminum, nickel, or the like. A planarization process, such as a CMP, may be performed to remove excess material from surfaces of the second dielectric layer 115.

FIG. 24D illustrates a perspective view of the resulting structure, which includes the conductive lines 72, the conductive contacts 112, the conductive contacts 116, and the conductive lines 118, while other structures are omitted, in order to more clearly show relationships between the conductive lines 72, the conductive contacts 112, the conductive contacts 116, and the conductive lines 118. FIGS. 24A through 24D further illustrate a conductive path through the test structure 120. The conductive path may extend from outside of a memory array 200 into the memory array 200 at Point 1. The conductive path extends through a conductive line 118, a conductive contact 116, and a conductive contact 112 to a conductive line 72A. The conductive path then extends through the conductive contacts 112, the conductive contacts 116, and a conductive line 118 through Points 2 and 3 to a conductive line 72B. The conductive path continues through the memory array 200 to the Point 24, which extends outside the memory array 200. Each of the conductive lines 72 is connected to a first vertically adjacent conductive line 72 and either a second vertically adjacent conductive line 72 (e.g., a conductive line 72B is connected to a conductive line 72A and a conductive line 72C), a horizontally adjacent conductive line 72 (e.g., a conductive line 72C is connected to a conductive line 72B and a conductive line 72C), or a connection outside of the memory array 200 (e.g., a conductive line 72A is connected to a conductive line 72B and an outside connection). The conductive lines 118 include conductive lines 118 which extend in a direction parallel to longitudinal axes of the conductive lines 72, and which connect vertically adjacent conductive lines 72. The conductive lines 118 further include conductive lines 118 which extend in a direction perpendicular to the longitudinal axes of the conductive lines 72, and which connect horizontally adjacent conductive lines 72, or which provide connections outside the memory array 200.

The test structure may be used to determine whether any connections between the conductive contacts 116 are faulty. For example, a voltage bias may be applied to the memory array 200 at Point 1 and Point 24. Because the conductive path extends through all of the conductive lines 72, the conductive contacts 112, the conductive contacts 116, and the conductive lines 118 in the memory array 200, a current measurement may be taken in order to determine whether any faulty connections are present. Thus, memory arrays 200 with faulty connections may be screened, and device defects may be avoided. Additionally, as discussed above, the trenches 11o and the conductive contacts 112 connected to each of the conductive lines 72A-72C may be formed simultaneously, which reduces costs, reduces manufacturing time, and increases device throughput.

Figure 25A:
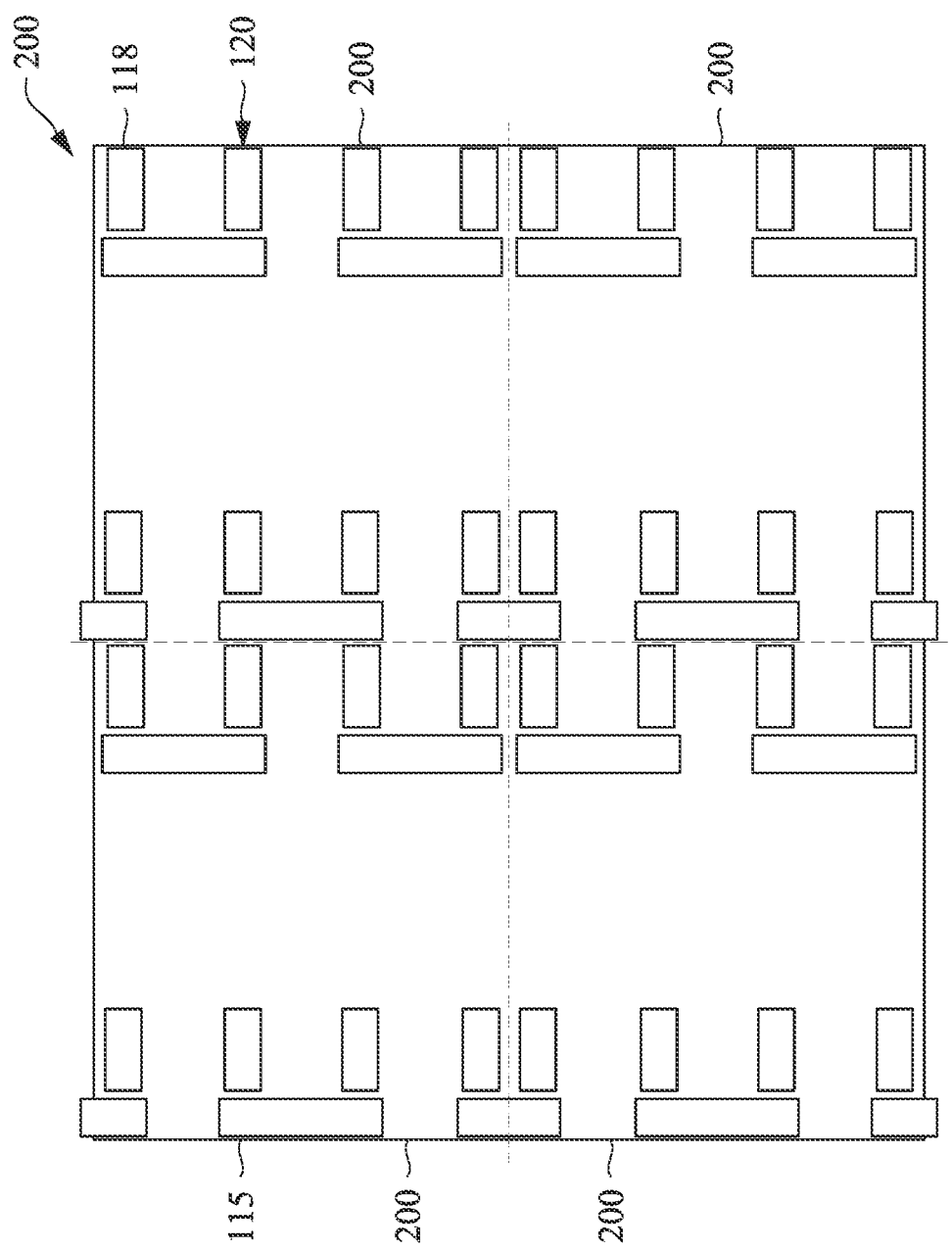
Figure 25B:
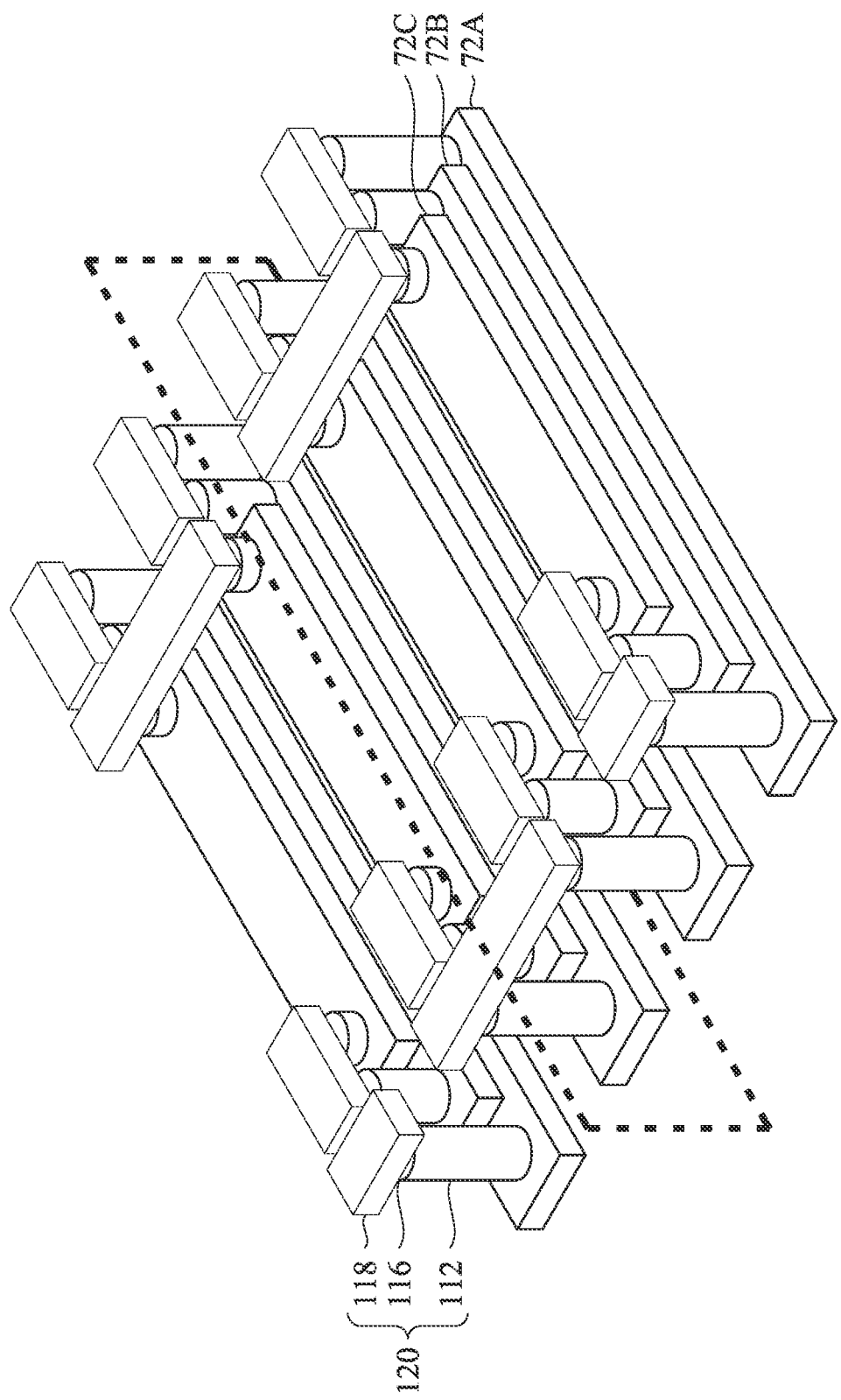
Figure 25C:
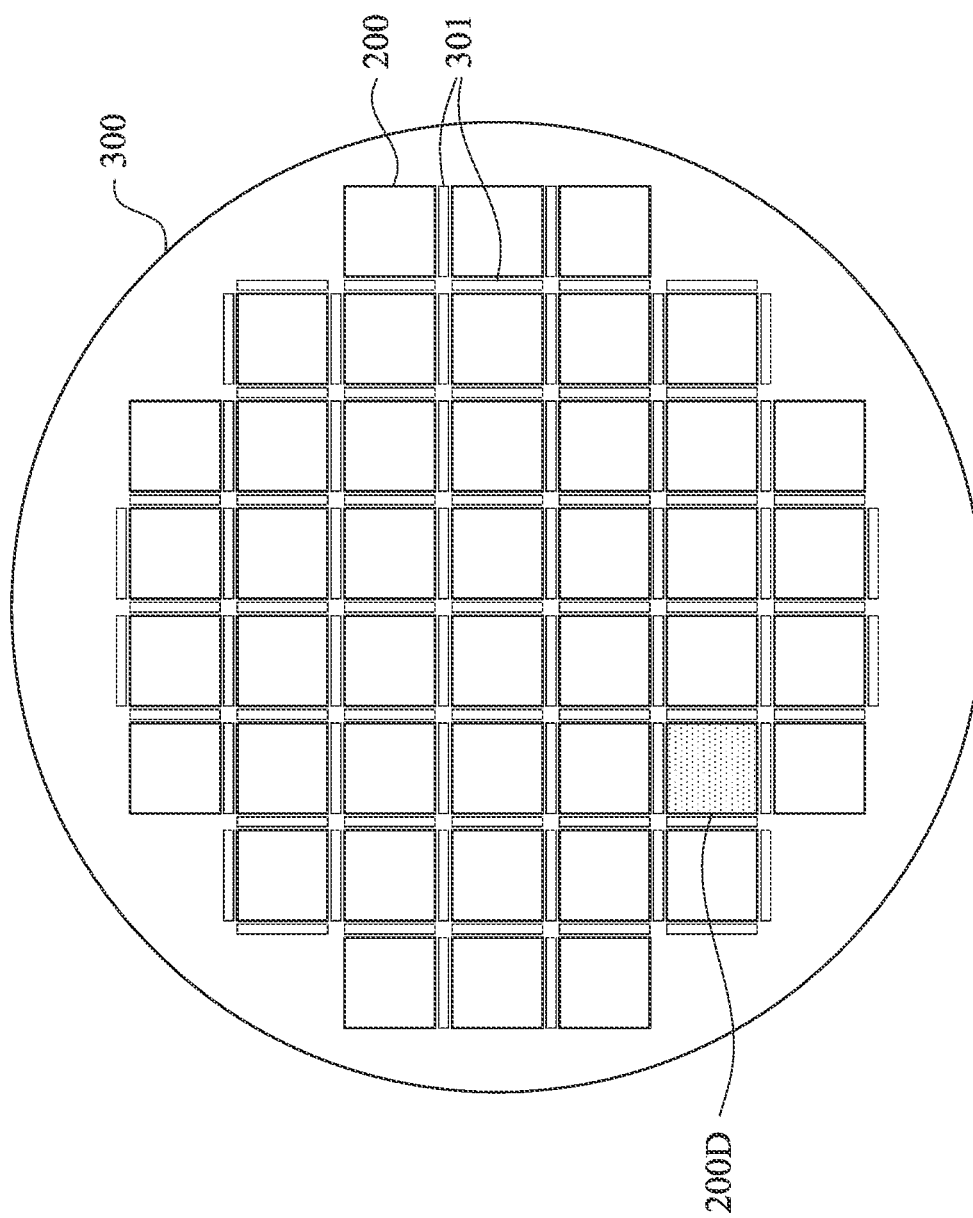

FIGS. 25A through 25C illustrate scribe lines for separating various memory arrays 200. FIG. 25A illustrates a top-down view of four memory arrays 200; FIG. 25B illustrates a perspective view of two memory arrays 200; and FIG. 25C illustrates a top-down view of a wafer 300 including a plurality of memory arrays 200. The memory arrays 200 are laid out in a grid pattern in the wafer 300, which may be centered over the wafer 300. The scribe lines separate individual memory arrays 200, which will be subsequently diced by sawing along the scribe lines. As illustrated in FIGS. 25A and 25B, the scribe lines may extend through at least some of the conductive lines 118 (such as conductive lines 118 extending in the direction perpendicular to longitudinal axes of the conductive lines 72) such that the conductive lines 118 are subsequently bisected. As illustrated in FIG. 25C, the scribe lines may be disposed in areas 301 between adjacent memory arrays 200, which areas 301 are removed by the dicing. At least portions of the test structures 120 may extend over the areas 301 and such portions of the test structures 120 may be removed by the dicing. FIG. 25C further illustrates a defective memory array 200D, which may be detected through a respective test structure 120, and removed. This reduces device defects.

FIGS. 26A through 34C illustrate an embodiment in which both the second material layers 54 comprise sacrificial materials, which are replaced by conductive materials. In FIGS. 26A through 34C, figures ending in "A" illustrate a cross-sectional view along line B-B' of FIG. 1A, figures ending in "B" illustrate a cross-sectional view along line D-D' of FIG. 1A, and figures ending in "C" illustrate a cross-sectional view along line C-C' of FIG. 1A.

Figure 26A:
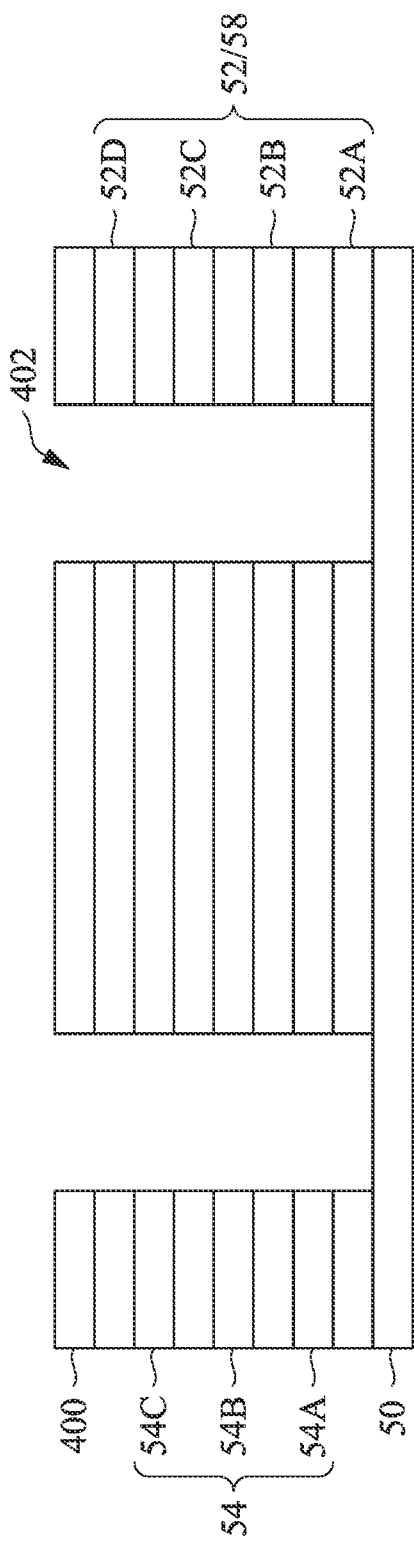
Figure 26B:
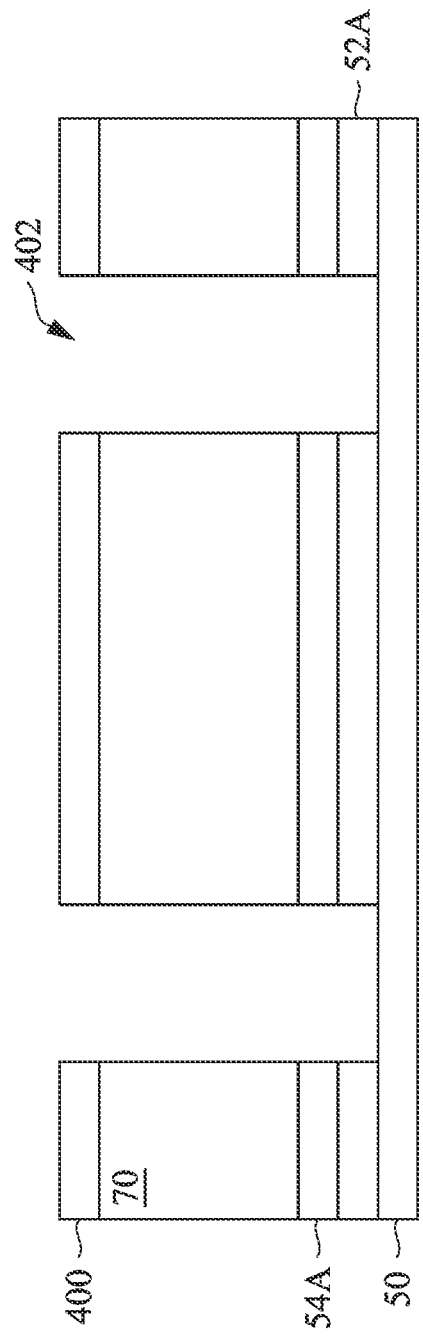

FIGS. 26A and 26B illustrate the multi-layer stack 58 after steps similar to or the same as those illustrated in FIGS. 3 through 10 and discussed above have been performed to form the staircase structure 68 and the IMD 70 over the staircase structure 68. The multi-layer stack 58 includes alternating layers of first material layers 52A-52D (collectively referred to as first material layers 52) and second material layers 54A-54C (collectively referred to as second material layers 54). The second material layers 54 may be replaced with conductive materials in subsequent steps to define conductive lines 422 (e.g., word lines, illustrated in FIGS. 33A through 34C). The second material layers 54 may comprise insulating materials, such as silicon oxide, silicon nitride, silicon oxynitride, combinations thereof, or the like. The first material layers 52 may comprise insulating materials, such as silicon oxide, silicon nitride, silicon oxynitride, combinations thereof, or the like. The first material layers 52 may be formed of a material having high etch selectivity from the etching of the second material layers 54 and the substrate 50 may be formed of a material having high etch selectivity from the etching of both the second material layers 54 and the first material layers 52 in order to aid with subsequent etching steps. In some embodiments, the substrate 50 may be formed of silicon carbide, the first material layers 52 may be formed of an oxide, such as silicon oxide, and the second material layers 54 may be formed of a nitride, such as silicon nitride. The second material layers 54 and the first material layers 52 may each be formed using, for example, CVD, ALD, physical vapor deposition (PVD), plasma enhanced CVD (PECVD), or the like. Although FIGS. 26A and 26B illustrate a particular number of the second material layers 54 and the first material layers 52, other embodiments may include different numbers of the second material layers 54 and the first material layers 52.

Further in FIGS. 26A and 26B, a first patterned photoresist 400 is formed over the multi-layer stack 58 and first trenches 402 are formed extending through the multi-layer stack 58. The first patterned photoresist 400 may be formed by depositing a photosensitive layer over the first material layer 52D using spin-on coating or the like. The photosensitive layer may then be patterned by exposing the photosensitive layer to a patterned energy source (e.g., a patterned light source) and developing the photosensitive layer to remove an exposed or unexposed portion of the photosensitive layer, thereby forming the first patterned photoresist 400.

In the illustrated embodiment, the first trenches 402 extend through the multi-layer stack 58 to expose the substrate 50. In some embodiments, the first trenches 402 extend through some but not all layers of the multi-layer stack 58. The first trenches 402 may be formed using acceptable photolithography and etching techniques, such as with an etching process that is selective to the multi-layer stack 58 (e.g., etches the materials of the first material layers 52 and the second material layers 54 at a faster rate than the material of the substrate 50). The etching may be any acceptable etch process, such as a reactive ion etch (RIE), neutral beam etch (NBE), the like, or a combination thereof. The etching may be anisotropic. In embodiments in which the substrate 50 is formed of silicon carbide, the first material layers 52 are formed of silicon oxide, and the second material layers 54 are formed of silicon nitride, the first trenches 402 may be formed by a dry etch using a fluorine-based gas (e.g., $C_4F_6$) mixed with hydrogen ($H_2$) or oxygen ($O_2$) gas.

Figure 27A:
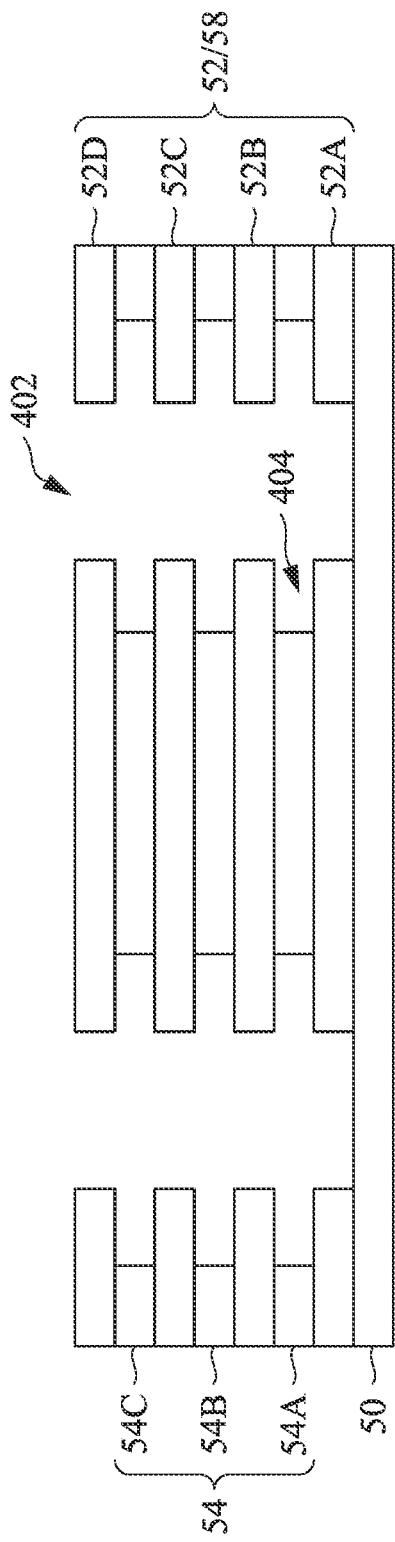
Figure 27B:
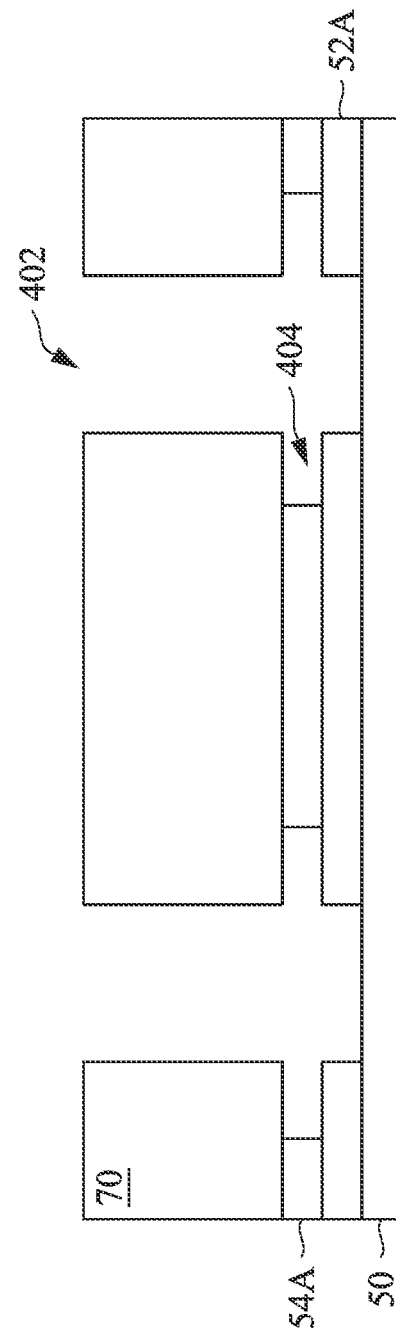

In FIGS. 27A and 27B, the first trenches 402 are expanded to form first sidewall recesses 404. Specifically, portions of the sidewalls of the second material layers 54 exposed by the first trenches 402 are recessed to form the first sidewall recesses 404. Although sidewalls of the second material layers 54 are illustrated as being straight, the sidewalls may be concave or convex. The first sidewall recesses 404 may be formed by an acceptable etching process, such as one that is selective to the material of the second material layers 54 (e.g., selectively etches the material of the second material layers 54 at a faster rate than the materials of the first material layers 52 and the substrate 50). The etching may be isotropic. In embodiments where the substrate 50 is formed of silicon carbide, the first material layers 52 are formed of silicon oxide, and the second material layers 54 are formed of silicon nitride, the first trenches 402 can be expanded by a wet etch using phosphoric acid ($H_3PO_4$). However, any suitable etching process, such as a dry selective etch, may also be utilized. The first patterned photoresist 400 may be removed by an acceptable ashing or wet strip process before or after forming the first sidewall recesses 404.

Figure 28A:
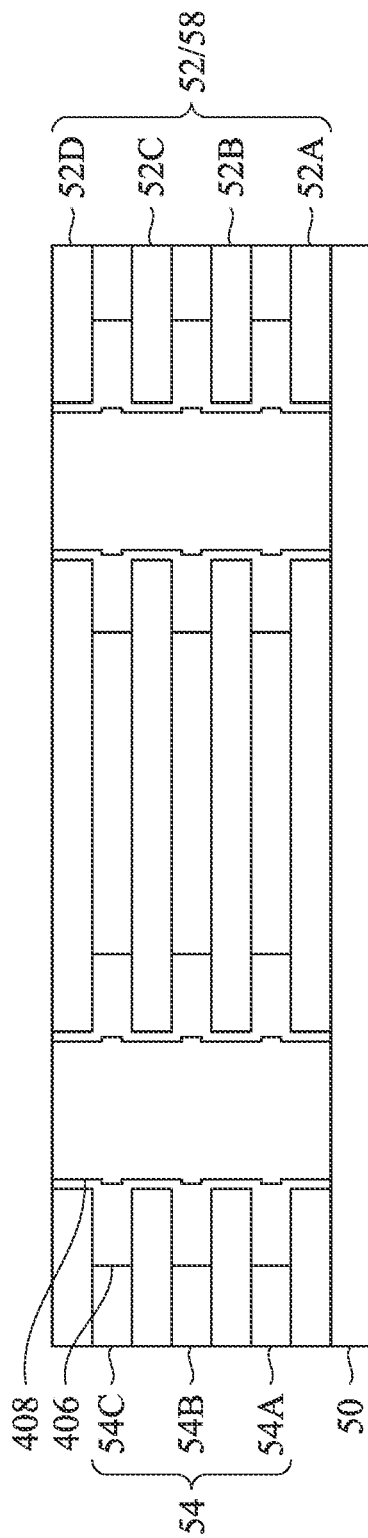
Figure 28B:
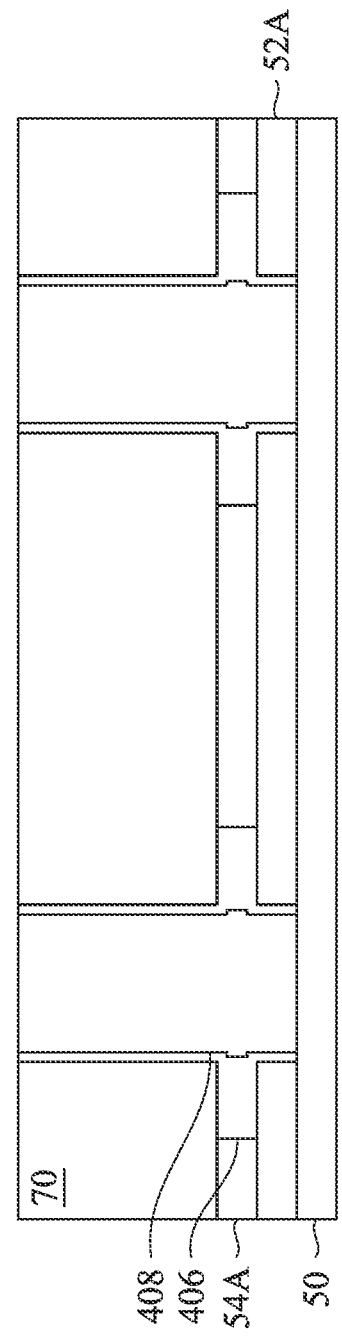

In FIGS. 28A and 28B, a conductive material 406 and a sacrificial material 408 are formed in the first sidewall recesses 404 and to fill and/or overfill the first trenches 402. One or more additional layers, such as seed layers, glue layers, barrier layers, diffusion layers, fill layers, and the like may also be filled in the first trenches 402 and the first sidewall recesses 404. In some embodiments, the sacrificial material 408 may be omitted. In embodiments which include a seed layer, the seed layer may comprise titanium nitride, tantalum nitride, titanium, tantalum, molybdenum, ruthenium, rhodium, hafnium, iridium, niobium, rhenium, tungsten, combinations of these, oxides of these, or the like. The conductive material 406 may be formed of a conductive material, which may be a metal, such as tungsten, cobalt, aluminum, nickel, copper, silver, gold, molybdenum, ruthenium, molybdenum nitride, alloys thereof, or the like. In embodiments in which the first material layers 52 are formed of an oxide such as silicon oxide, the seed layer can be formed of titanium nitride and the conductive material 406 can be formed of tungsten. The sacrificial material 408 may comprise insulating materials, such as silicon oxide, silicon nitride, silicon oxynitride, combinations thereof, or the like. The sacrificial material 408 may include materials having a high etch selectivity to materials of the first material layers 52, the conductive material 406, and the substrate 50 such that the sacrificial material 408 may be subsequently removed without removing or damaging the first material layers 52, the conductive material 406, or the substrate 50. The conductive material 406 and the sacrificial material 408 may each be formed by an acceptable deposition process such as chemical vapor deposition (CVD), atomic layer deposition (ALD), physical vapor deposition (PVD), or the like.

Once the conductive material 406 and the sacrificial material 408 have been deposited in order to fill and/or overfill the first trenches 402, the conductive material 406 and the sacrificial material 408 may be planarized to removed excess material outside of the first trenches 402, such that after the planarizing the conductive material 406 and the sacrificial material 408 completely span a top portion of the first trenches 402. In an embodiment, the conductive material 406 and the sacrificial material 408 may be planarized using, for example, a chemical mechanical planarization (CMP) process. However, any suitable planarization process, such as a grinding process, may also be utilized.

Figure 29A:
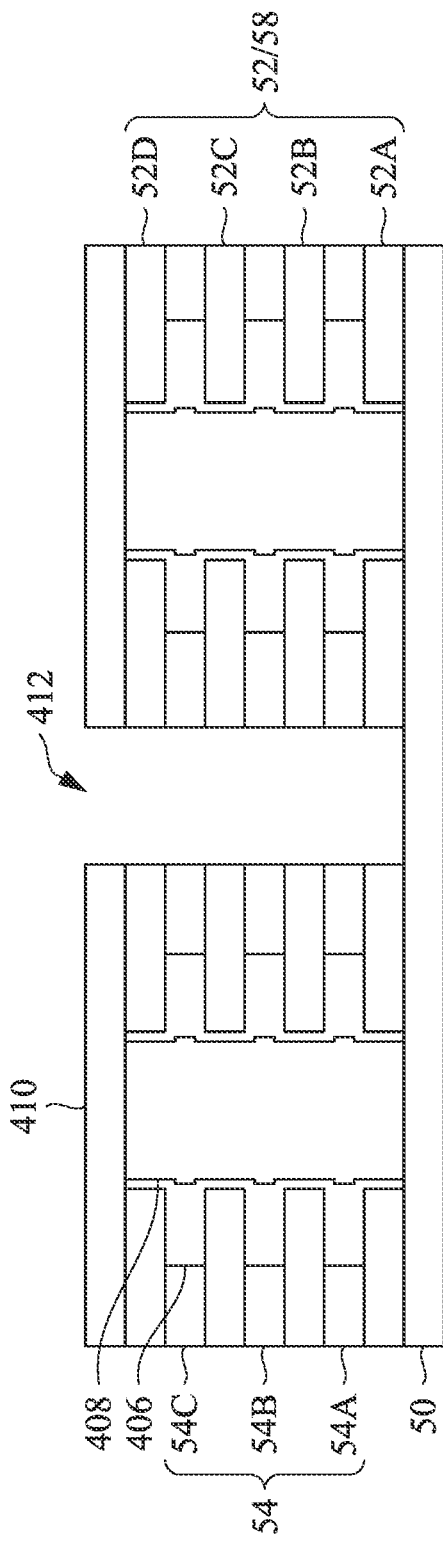
Figure 29B:
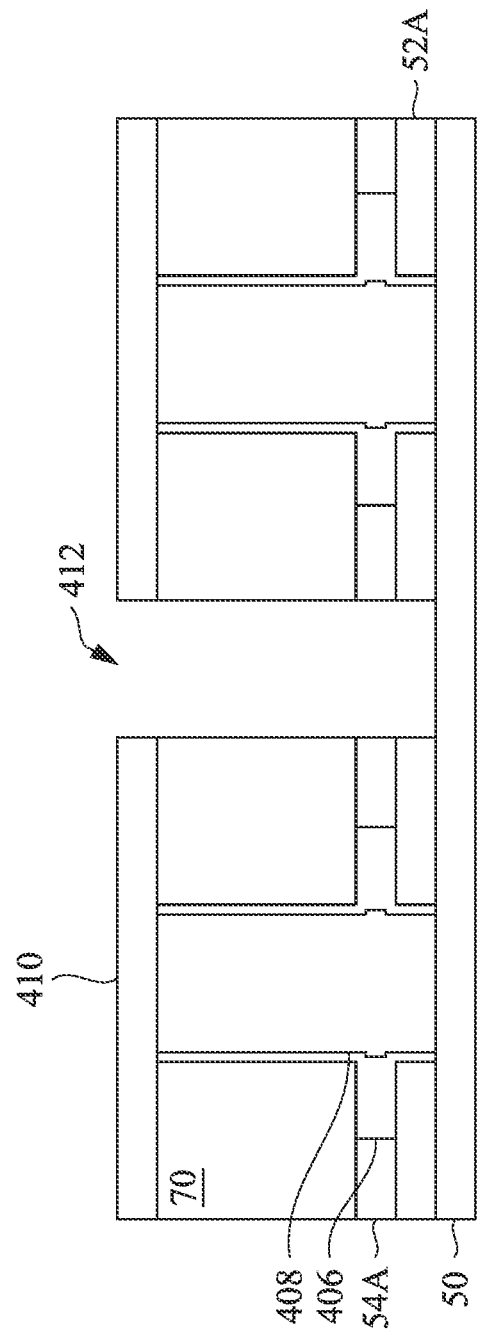

In FIGS. 29A and 29B, a second patterned photoresist 410 is formed over the multi-layer stack 58 and second trenches 412 are formed extending through the multi-layer stack 58. The second patterned photoresist 410 may be formed by depositing a photosensitive layer over the first material layer 52D using spin-on coating or the like. The photosensitive layer may then be patterned by exposing the photosensitive layer to a patterned energy source (e.g., a patterned light source) and developing the photosensitive layer to remove an exposed or unexposed portion of the photosensitive layer, thereby forming the second patterned photoresist 410.

In the illustrated embodiment, the second trenches 412 extend through the multi-layer stack 58 to expose the substrate 50. In some embodiments, the second trenches 412 extend through some but not all layers of the multi-layer stack 58. The second trenches 412 may be formed using acceptable photolithography and etching techniques, such as with an etching process that is selective to the multi-layer stack 58 (e.g., etches the materials of the first material layers 52 and the second material layers 54 at a faster rate than the material of the substrate 50). The etching may be any acceptable etch process, such as a RIE, NBE, the like, or a combination thereof. The etching may be anisotropic. In embodiments in which the substrate 50 is formed of silicon carbide, the first material layers 52 are formed of silicon oxide, and the second material layers 54 are formed of silicon nitride, the second trenches 412 may be formed by a dry etch using a fluorine-based gas (e.g., $C_4F_6$) mixed with hydrogen ($H_2$) or oxygen ($O_2$) gas.

In FIGS. 30A and 30B, the second trenches 412 are expanded to form second sidewall recesses 414. Specifically, the remaining portions of the second material layers 54 are removed to form the second sidewall recesses 414. The second sidewall recesses 414 thus expose portions of the conductive material 406. The second sidewall recesses 414 may be formed by an acceptable etching process, such as one that is selective to the material of the second material layers 54 (e.g., selectively etches the material of the second material layers 54 at a faster rate than the materials of the first material layers 52 and the substrate 50). The etching may be any acceptable etch process, and in some embodiments, may be similar to the etch used to form the first sidewall recesses 404 discussed with respect to FIGS. 27A and 27B. The second patterned photoresist 410 may be removed by an acceptable ashing or wet strip process before or after forming the second sidewall recesses 414.

Figure 31A:
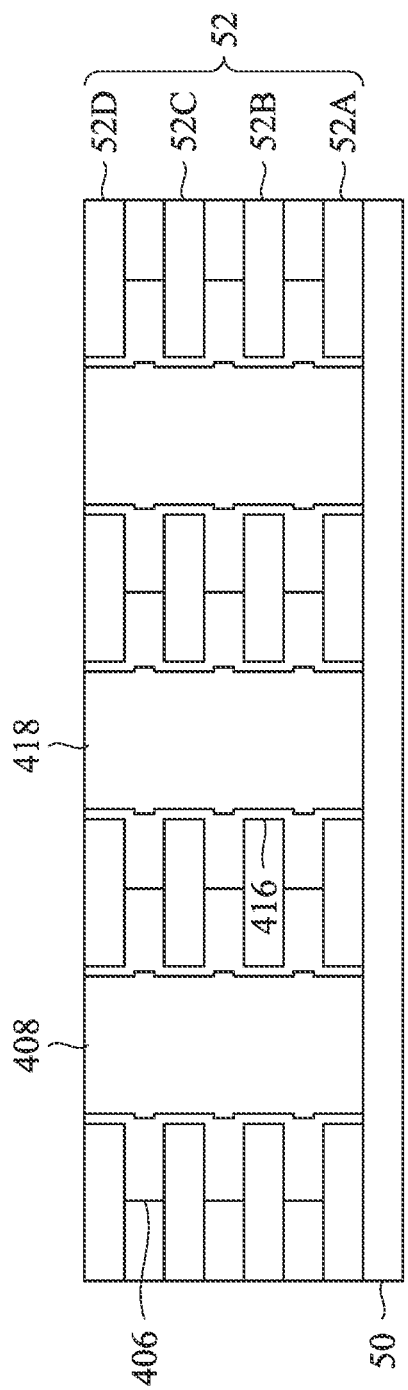
Figure 31B:
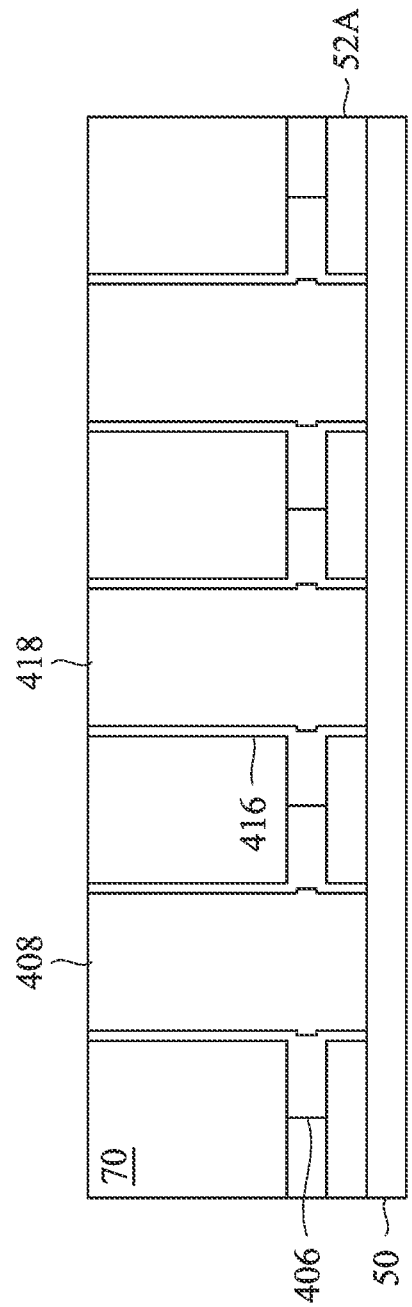

In FIGS. 31A and 31B, a conductive material 416 and a sacrificial material 418 are formed in the second sidewall recesses 414 and to fill and/or overfill the second trenches 412. One or more additional layers, such as seed layers, glue layers, barrier layers, diffusion layers, fill layers, and the like may also be filled in the second trenches 412 and the second sidewall recesses 414. In some embodiments, the sacrificial material 418 may be omitted. In embodiments which include a seed layer, the seed layer may comprise titanium nitride, tantalum nitride, titanium, tantalum, molybdenum, ruthenium, rhodium, hafnium, iridium, niobium, rhenium, tungsten, combinations of these, oxides of these, or the like. The conductive material 416 may be formed of a conductive material, which may be a metal, such as tungsten, cobalt, aluminum, nickel, copper, silver, gold, molybdenum, ruthenium, molybdenum nitride, alloys thereof, or the like. In embodiments in which the first material layers 52 are formed of an oxide such as silicon oxide, the seed layer can be formed of titanium nitride and the conductive material 416 can be formed of tungsten. The sacrificial material 418 may comprise insulating materials, such as silicon oxide, silicon nitride, silicon oxynitride, combinations thereof, or the like. The sacrificial material 418 may include materials having a high etch selectivity to materials of the first material layers 52, the conductive material 416, and the substrate 50 such that the sacrificial material 418 may be subsequently removed without removing or damaging the first material layers 52, the conductive material 416, or the substrate 50. The conductive material 416 and the sacrificial material 418 may each be formed by an acceptable deposition process such as CVD, ALD, PVD, or the like.

Once the conductive material 416 and the sacrificial material 418 have been deposited in order to fill and/or overfill the second trenches 412, the conductive material 416 and the sacrificial material 418 may be planarized to removed excess material outside of the second trenches 412, such that after the planarizing the conductive material 416 and the sacrificial material 418 completely span a top portion of the second trenches 412. In an embodiment, the conductive material 416 and the sacrificial material 418 may be planarized using, for example, a CMP process. However, any suitable planarization process, such as a grinding process, may also be utilized.

In FIGS. 32A and 32B, the sacrificial materials 408 and 418 may be removed by an acceptable process forming third trenches 420. The acceptable process may be a wet etching process, a dry etching process, a combination thereof, or the like. In some embodiments, the sacrificial materials 408 and 418 may be removed by an isotropic etching process, which is selective to the materials of the sacrificial materials 408 and 418. As such, the sacrificial materials 408 and 418 may be removed without removing or damaging the first material layers 52, the conductive material 406, the conductive material 416, or the substrate 50.

Figure 33A:
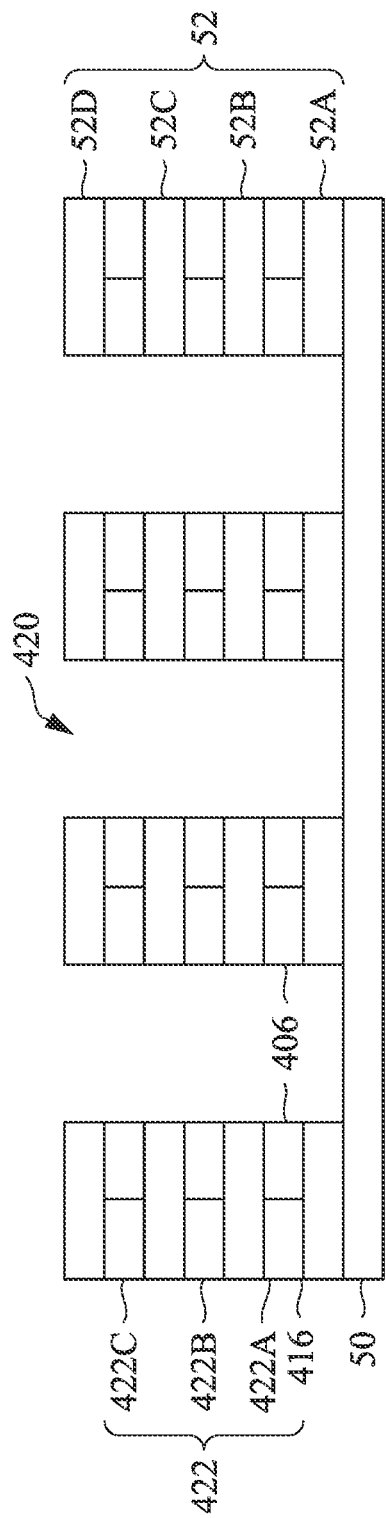
Figure 33B:
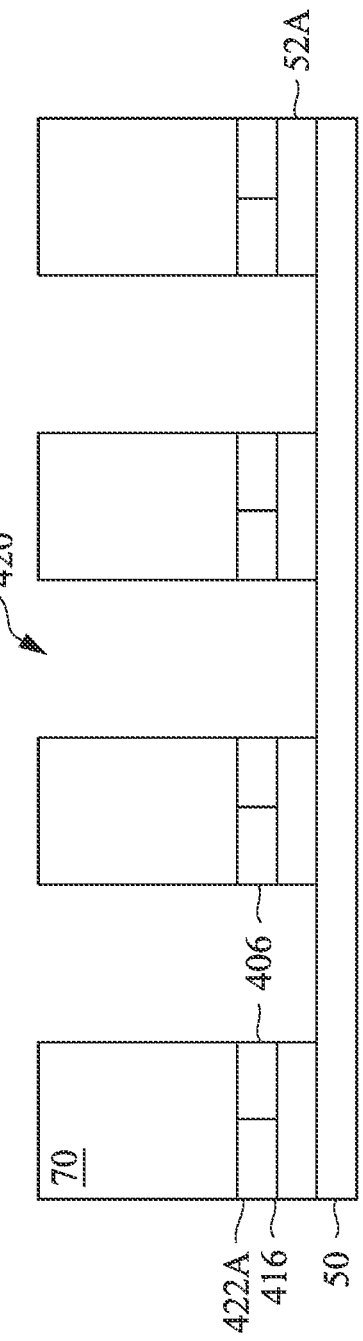

In FIGS. 33A and 33B, the conductive materials 406 and 416 are etched to expand the third trenches 420 and form conductive lines 422A-422C (e.g., word lines, collectively referred to as conductive lines 422) from each respective layer of the conductive materials 406 and 416. The third trenches 420 separate adjacent conductive lines 422 and portions of the first material layers 52 from one another. Because the conductive lines 422 are formed from adjacent portions of the conductive materials 406 and 416, each of the conductive lines 422 may comprise a seam, as illustrated in FIGS. 33A and 33B. Etching the conductive materials 406 and 416 to expand the third trenches 420 may expose sidewalls of the first material layers 52. In some embodiments, the conductive materials 406 and 416 may be etched using, for example, an anisotropic etching process However, any suitable etching process may be utilized. In some embodiments, the etching process is performed until the material of the conductive materials 406 and 416 that extends beyond sidewalls of the first material layers 52 has been removed and sidewalls of the conductive materials 406 and 416 are flush with sidewalls of the first material layers 52. As such, the conductive lines 422 may have widths similar to or the same as the first material layers 52. Although sidewalls of the conductive lines 422 are illustrated as being straight, the sidewalls may be concave or convex.

Forming the conductive lines 422 by forming and replacing the second material layers 54 in the multi-layer stack 58 improves the aspect ratio of columns of the memory array 200, and prevents twisting or collapsing of features during formation. This reduces device defects and improves device performance. The steps performed in FIGS. 26A through 33B may be performed in place of the steps performed in FIGS. 11A through 13C, with the remaining steps for forming the memory array 200 being the same as those discussed above (e.g., the steps performed in FIGS. 3 through 10 are performed, then the steps performed in FIGS. 26A through 33B are performed, and finally, the steps performed in FIGS. 14B through 24D are performed.

Figure 34A:
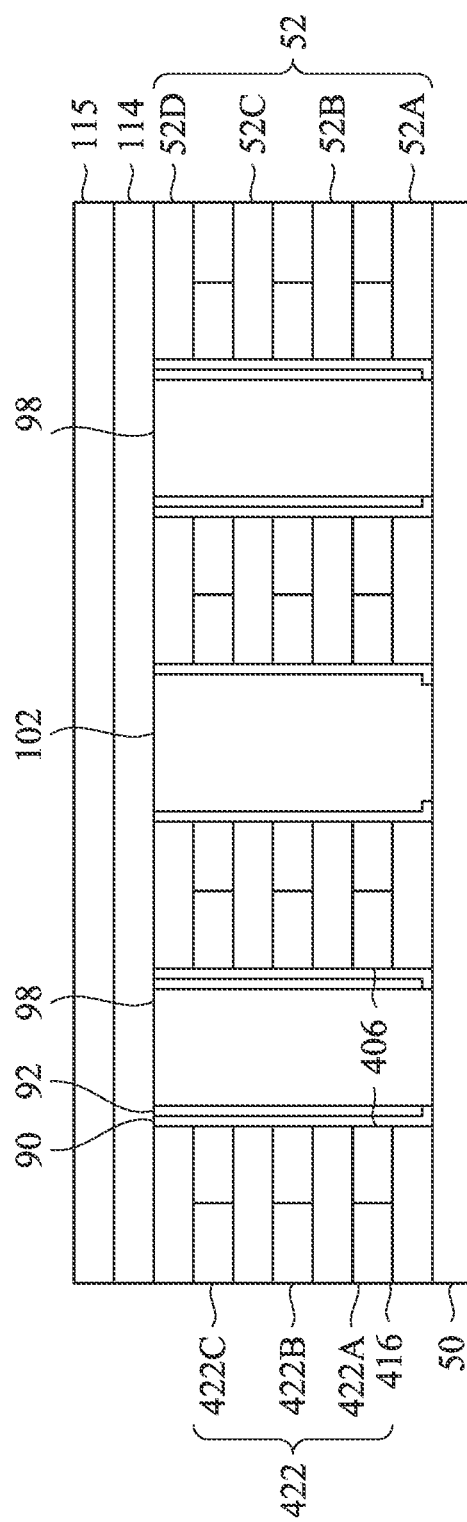
Figure 34B:
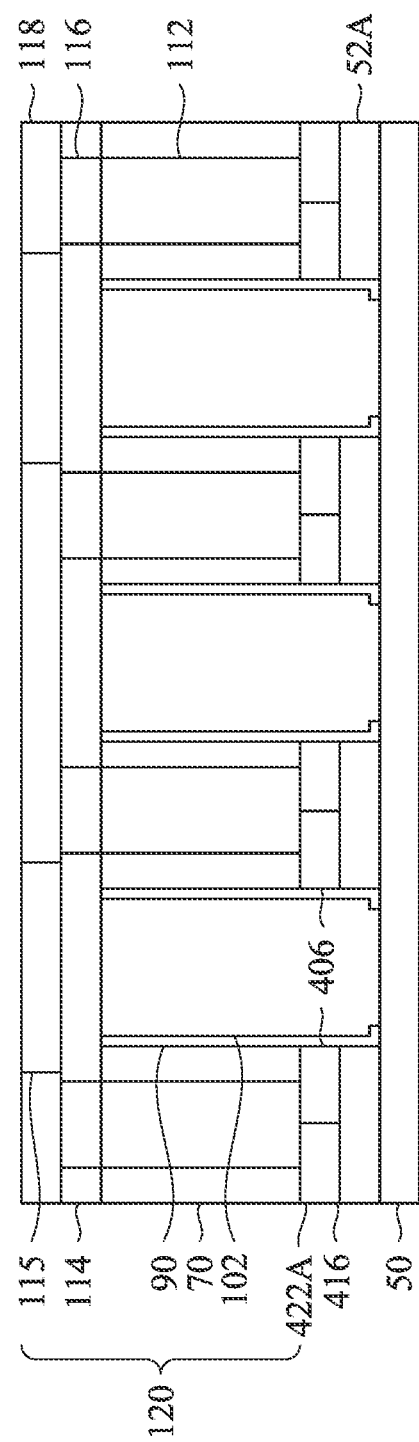
Figure 34C:
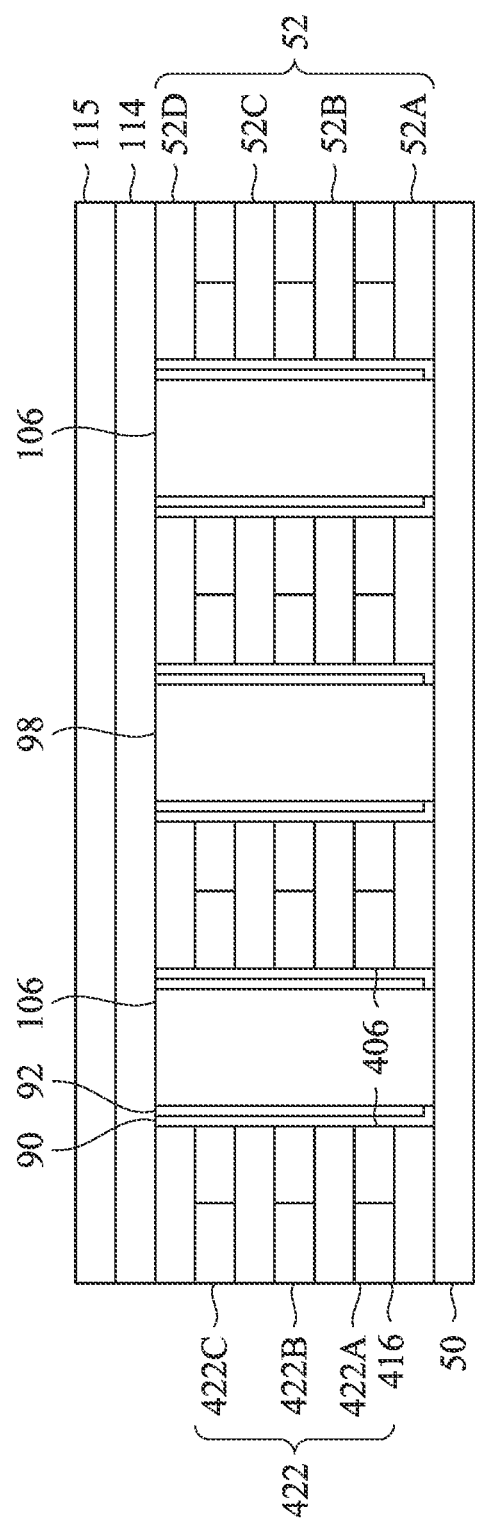

FIGS. 34A through 34C illustrate the embodiment of FIGS. 26A through 33B after the steps of FIGS. 14B through 24D are performed. The structures of FIG. 34B may be similar to those illustrated in FIG. 24C, except that the conductive lines 72 are replaced by the conductive lines 422 formed from the conductive materials 406 and 416.

Embodiments may achieve various advantages. For example, forming the trenches 110 extending to the conductive lines 72A-72C simultaneously and forming the conductive contacts 112 in the trenches 110 simultaneously reduces production time, reduces costs associated with additional patterning process, and increases throughput. The test structures 120 may be formed over the memory arrays 200 in order to check for faulty connections. As such, defective memory arrays 200 may be removed and device defects may be reduced.

In accordance with an embodiment, a memory array includes a first word line over a semiconductor substrate, a longitudinal axis of the first word line extending in a first direction; a second word line over the first word line in a second direction perpendicular to a major surface of the semiconductor substrate, a longitudinal axis of the second word line extending in the first direction; a memory film contacting the first word line and the second word line; an oxide semiconductor (OS) layer contacting a first source line and a first bit line, the memory film being between the OS layer and each of the first word line and the second word line; and a test structure over the first word line and the second word line, the test structure including a first conductive line electrically coupling the first word line to the second word line, a longitudinal axis of the first conductive line extending in the first direction. In an embodiment, the first word line has a first length greater than a second length of the second word line. In an embodiment, the test structure further includes a second conductive line, the second conductive line is electrically coupled to the first word line, the second conductive line extends to a boundary of the memory array, and a longitudinal axis of the second conductive line extends in the first direction. In an embodiment, the memory array further includes a third word line adjacent the first word line in a third direction perpendicular to the first direction, the memory film and the OS layer being between the first word line and the third word line in the third direction, the test structure further includes a second conductive line, the second conductive line electrically coupling the first word line to the third word line, and a longitudinal axis of the second conductive line extending in the third direction. In an embodiment, the first word line includes a seam between a first conductive material and a second conductive material. In an embodiment, the memory array further includes a third word line below the first word line in the second direction, a longitudinal axis of the third word line extending in the first direction, the test structure further includes a second conductive line electrically coupling the first word line to the third word line, a longitudinal axis of the second conductive line extending in the first direction. In an embodiment, the first word line has a first length greater than a second length of the second word line, and the third word line has a third length greater than the first length.

In accordance with another embodiment, a device includes a first word line over a semiconductor substrate, the first word line having a first length in a first direction; a second word line over the semiconductor substrate, the second word line having a second length in the first direction, the second length being equal to the first length; a first inter-metal dielectric (IMD) over the first word line; a first memory film in contact with the first word line and the first IMD; a first oxide semiconductor (OS) layer over the first memory film, the first OS layer contacting a source line and a bit line; a first conductive contact extending through the first IMD and electrically coupled to the first word line; a second conductive contact electrically coupled to the second word line; and a first conductive line extending over the first IMD and electrically coupling the first conductive contact to the second conductive contact, the first conductive line extending in a second direction perpendicular to the first direction. In an embodiment, a first distance between the first word line and the semiconductor substrate in a third direction perpendicular to a major surface of the semiconductor substrate is equal to a second distance between the second word line and the semiconductor substrate in the third direction. In an embodiment, the IMD has a staircase structure in a cross-sectional view. In an embodiment, the device further includes a second memory film in contact with the second word line; a second OS layer over the second memory film, the second OS layer contacting the source line and the bit line; and a first dielectric material separating the first OS layer from the second OS layer. In an embodiment, the device further includes a second IMD over the second word line, the second memory film being in contact with the second IMD; and a second dielectric material separating the first IMD from the second IMD, the second dielectric material including a different material from the first dielectric material. In an embodiment, the device further includes a third word line over the semiconductor substrate, the third word line having a third length in the first direction, the third length being different from the first length and the second length; a third conductive contact electrically coupled to the first word line; a fourth conductive contact electrically coupled to the third word line; and a second conductive line electrically coupling the third conductive contact to the fourth conductive contact, the second conductive line extending in the first direction. In an embodiment, the first OS layer is between the first conductive contact and the third conductive contact in the first direction.

In accordance with yet another embodiment, a method includes depositing a multi-layer stack over a semiconductor substrate, the multi-layer stack including alternating layers of a first material and a second material; patterning the multi-layer stack such that the multi-layer stack includes a staircase structure in a cross-sectional view; forming an inter-metal dielectric (IMD) over the staircase structure of the multi-layer stack; forming a plurality of word lines in the multi-layer stack; depositing a memory film in the multi-layer stack adjacent the plurality of word lines; depositing an oxide semiconductor (OS) layer over the memory film; etching the IMD to form a first opening exposing a first word line of the plurality of word lines and a second opening exposing a second word line of the plurality of word lines, the first opening extending to a first depth, and the second opening extending to a second depth different from the first depth; forming a first conductive contact in the first opening and electrically coupled to the first word line and a second conductive contact in the second opening and electrically coupled to the second word line; and forming a first conductive line over the IMD, the first conductive contact, and the second conductive contact, the first conductive line electrically coupling the first conductive contact to the second conductive contact. In an embodiment, the first conductive line, the first word line, and the second word line extend in a first direction. In an embodiment, the method further includes etching the IMD to form a third opening exposing the first word line and a fourth opening exposing a third word line of the plurality of word lines, the third opening and the fourth opening extending to the first depth; forming a third conductive contact in the third opening and electrically coupled to the first word line and a fourth conductive contact in the fourth opening and electrically coupled to the third word line; and forming a second conductive line over the IMD, the third conductive contact, and the fourth conductive contact, the second conductive line electrically coupling the third conductive contact to the fourth conductive contact. In an embodiment, the first word line and the second word line extend in a first direction, and the second conductive line extends in a second direction perpendicular to the first direction. In an embodiment, the first material includes a dielectric material, the second material includes a conductive material, and forming the plurality of word lines in the multi-layer stack includes patterning the multi-layer stack to separate adjacent word lines formed of the second material. In an embodiment, the first material includes an oxide, the second material includes a nitride, forming the plurality of word lines in the multi-layer stack includes patterning the multi-layer stack and replacing the second material with a conductive material.

One general aspect of embodiments disclosed herein includes a first word line over a semiconductor substrate, the first word line having a first length in a first direction. The device also includes a second word line over the semiconductor substrate, the second word line having a second length in the first direction, where the second length is equal to the first length. The device also includes a first inter-metal dielectric (IMD) over the first word line. The device also includes a first memory film in contact with the first word line and the first IMD. The device also includes a first oxide semiconductor (OS) layer over the first memory film, the first OS layer contacting a source line and a bit line. The device also includes a first conductive contact extending through the first IMD and electrically coupled to the first word line. The device also includes a second conductive contact electrically coupled to the second word line. The device also includes and a first conductive line extending over the first IMD and electrically coupling the first conductive contact to the second conductive contact, where the first conductive line extends in a second direction perpendicular to the first direction.

Another general aspect of embodiments disclosed herein includes depositing a multi-layer stack over a semiconductor substrate, the multi-layer stack may include alternating layers of a first material and a second material. The method also includes patterning the multi-layer stack such that the multi-layer stack may include a staircase structure in a cross-sectional view. The method also includes forming an inter-metal dielectric (IMD) over the staircase structure of the multi-layer stack. The method also includes forming a plurality of word lines in the multi-layer stack. The method also includes depositing a memory film in the multi-layer stack adjacent the plurality of word lines. The method also includes depositing an oxide semiconductor (OS) layer over the memory film. The method also includes etching the IMD to form a first opening exposing a first word line of the plurality of word lines and a second opening exposing a second word line of the plurality of word lines, where the first opening extends to a first depth, and where the second opening extends to a second depth different from the first depth. The method also includes forming a first conductive contact in the first opening and electrically coupled to the first word line and a second conductive contact in the second opening and electrically coupled to the second word line. The method also includes and forming a first conductive line over the IMD, the first conductive contact, and the second conductive contact, where the first conductive line electrically couples the first conductive contact to the second conductive contact.

A further general aspect of embodiments disclosed herein includes multi-layer stack over a semiconductor substrate, the multi-layer stack may include alternating layers of a first material and a second material, a first layer of the multi-layer stack extending a first length in a first direction, each next layer in the multi-layer stack, preceding from a top of the multi-layer stack to a bottom of the multi-layer stack, extending a next length in the first direction, the next length being greater than the length of the immediately preceding layer of the multi-layer stack. The device also includes an inter-metal dielectric (IMD) over the multi-layer stack. The device also includes a plurality of word lines in the multi-layer stack. The device also includes a memory film in the multi-layer stack adjacent the plurality of word lines. The device also includes a first oxide semiconductor (OS) layer over the memory film. The device also includes a first conductive contact extending to a first depth in the multi-layer stack and electrically contacting a first word line. The device also includes a second conductive contact extending a second depth into the multi-layer stack and electrically contacting a second word line. The device also includes and a first conductive line over the IMD, the first conductive contact, and the second conductive contact, where the first conductive line electrically couples the first conductive contact to the second conductive contact.

Some embodiment disclosed herein provide for a device, having a memory array, and including N horizontal planes of memory cells, where n is two or greater, each nth plane being vertically above the (N−1) plane, each horizontal plane including a plurality of word lines, each word line of each horizontal plane having a first end and a second end separated from the first end by a distance in a first horizontal direction, where the distance in an Nth horizontal plane is less is less than the distance in the (N−1) horizontal plane. The device also includes at first transistor in each of the n horizontal planes, each first transistor being between adjacent ones of the word lines in the same horizontal plane, each first transistor in the Nth plane being vertically stacked above a respective first transistor in the (N−1) horizontal plane. The device also includes a second transistor in each of the n horizontal planes, each second transistor being between adjacent ones of the word lines in the same horizontal plane, each second transistor in an Nth plane being vertically stacked above a respective second transistor in the (N−1) plane, each second transistor being electrically isolated from a respective first transistor by a vertically extending dielectric feature. The device also includes a first source line electrically connecting respective sources of the respective first transistors in the n horizontal planes, and a vertically extending second source line electrically connecting respective sources of the respective second transistors in the n horizontal planes. The device also includes and an interconnect structure, including N sets of first conductive vias, respective first conductive vias of the Nth set contacting respective first ends of respective word lines of the Nth horizontal plane of the memory array. The device also includes and N sets of second conductive vias, respective second conductive vias of the Nth set contacting respective second ends of respective word lines of the Nth horizontal plane of the memory array.

Other embodiments disclosed herein provide for a memory array including a first word line in a first layer of the memory array, a second word line in a second layer of the memory array, the second layer vertically atop the first layer, and a third word line in a third layer of the memory array, the third layer being vertically atop the second layer, the first word line, the second word line, and the third word line extending in a first horizontal direction by a first length, by a second length less than the first length, and by a third length less than the second length, respectively. The device also includes first memory films extending, respectively, along a first inner sidewall of the first word line, a second inner sidewall of the second word line, and a third inner sidewall of the third word line. The device also includes a first channel region extending horizontally down the first, second, and third inner sidewalls, where respective first memory films are interjacent the first channel region and the first inner sidewall, the first channel region and the second inner sidewall, and the first channel region and the third inner sidewall. The device also includes a first source line extending vertically through the memory array and contacting a first end of the first channel region. The device also includes and a first bit line extending vertically through the memory array and contacting a second end of the first channel region, opposite the first end of the first channel region. The device also includes an interconnection structure including a first contact, a second contact, and a third contact each extending vertically from a top of the memory array, and respectively contacting the first word line, the second word line, and the third word line.

Yet other embodiments disclosed herein provide for a device with a three-dimensional memory array that may include a stack of layers, each layer including a plurality of parallel word lines and a plurality of memory cell between adjacent words, each word line in a layer of the stack of layers having the same length and each word line in a layer of the stack of layers having a length that is less than the length of each word line in a lower layer of the stack of layers. The device also includes a plurality of vertically extending conductive vias, each vertically extending conductive via of the plurality of vertically extending conductive vias landing on one end of a respective word line of the plurality of parallel word lines of the stack of layers. The device also includes a test structure overlying the three-dimensional memory array, the test structure including first conductors electrically connecting respective word lines of a same layer of the stack of layers, and second conductors electrically connecting respective word lines in different layers of the stack of layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a memory array, including:
        N horizontal planes of memory cells, where N is two or greater, each Nth plane being vertically above the (N−1) plane, each horizontal plane including a plurality of word lines, each word line of each horizontal plane having a first end and a second end separated from the first end by a distance in a first horizontal direction, wherein the distance in an Nth horizontal plane is less is less than the distance in the (N−1) horizontal plane;
    at first transistor in each of the N horizontal planes, each first transistor being between adjacent ones of the word lines in the same horizontal plane, each first transistor in the Nth plane being vertically stacked above a respective first transistor in the (N−1) horizontal plane;
    a second transistor in each of the N horizontal planes, each second transistor being between adjacent ones of the word lines in the same horizontal plane, each second transistor in an Nth plane being vertically stacked above a respective second transistor in the (N−1) plane, each second transistor being electrically isolated from a respective first transistor by a vertically extending dielectric feature;
    a first source line electrically connecting respective sources of the respective first transistors in the N horizontal planes, and a vertically extending second source line electrically connecting respective sources of the respective second transistors in the N horizontal planes; and
    an interconnect structure, including:
        N sets of first conductive vias, respective first conductive vias of the Nth set contacting respective first ends of respective word lines of the Nth horizontal plane of the memory array; and
        N sets of second conductive vias, respective second conductive vias of the Nth set contacting respective second ends of respective word lines of the Nth horizontal plane of the memory array.

2. The device of claim 1, wherein:
    each first conductive via of the Nth set has the same vertical length and wherein each first conductive via of the Nth set has a vertical length less than a vertical length of each first conductive via of the (N−1) set; and
    each second conductive via of the Nth set has the same vertical length and wherein each second conductive via of the Nth set has a vertical length less than a vertical length of each second conductive via of the (N−1) set.

3. The device of claim 1, wherein the interconnect structure further comprises a test structure including:
    a plurality of first conductive lines extending in a first direction and electrically connecting respective ones of the Nth set of first conductive vias to respective ones of the (N−1) set if first conductive vias; and
    a plurality of second conductive lines extending in a second direction, perpendicular to the first direction, and electrically contacting respective first conductive vias of the Nth set of first conductive vias to respective other first conductive vias of the Nth set of first conductive vias.

4. The device of claim 3, wherein the test structure connects a plurality of word lines of the memory array into a series circuit.

5. The device of claim 1, further comprising:
    a memory film extending along respective sidewalls of respective word lines of the memory array.

6. The device of claim 5, wherein the memory film comprises a ferroelectric material selected from the group consisting of hafnium oxide, hafnium zirconium oxide, and silicon-doped hafnium oxide.

7. The device of claim 1, wherein the memory array further includes a first vertically extending oxide semiconductor region forming respective channel regions for respective first transistors, and a second vertically extending second oxide semiconductor region forming respective channel regions for respective second transistors.

8. A device comprising:
    a memory array including:
        a first word line in a first layer of the memory array, a second word line in a second layer of the memory array, the second layer vertically atop the first layer, and a third word line in a third layer of the memory array, the third layer being vertically atop the second layer, the first word line, the second word line, and the third word line extending in a first horizontal direction by a first length, by a second length less than the first length, and by a third length less than the second length, respectively;
        first memory films extending, respectively, along a first inner sidewall of the first word line, a second inner sidewall of the second word line, and a third inner sidewall of the third word line;
        a first channel region extending horizontally down the first, second, and third inner sidewalls, wherein respective first memory films are interjacent the first channel region and the first inner sidewall, the first channel region and the second inner sidewall, and the first channel region and the third inner sidewall;
        a first source line extending vertically through the memory array and contacting a first end of the first channel region; and a first bit line extending vertically through the memory array and contacting a second end of the first channel region, opposite the first end of the first channel region; and an interconnection structure including:

a first contact, a second contact, and a third contact each extending vertically from a top of the memory array, and respectively contacting the first word line, the second word line, and the third word line.

9. The device of claim 8, wherein the memory array further comprises:

a fourth word line in the first layer of the memory array, a fifth word line in the second layer of the memory array, and a sixth word line in the third layer of the memory array, the fourth word line, the fifth word line, and the sixth word line extending in the first horizontal direction by the first length, by the second length, and by the third length, respectively;

second memory films extending, respectively, along a fourth inner sidewall of the fourth word line, a fifth inner sidewall of the fifth word line, and a sixth inner sidewall of the sixth word line;

a second channel region extending horizontally down the fourth, fifth, and sixth inner sidewalls, wherein respective second memory films are interjacent the second channel region and the fourth inner sidewall, the first channel region and the fifth inner sidewall, and the first channel region and the sixth inner sidewall; and wherein the first source line contacts a first end of the second channel region; and wherein the first bit line contacts a second end of the second channel region, opposite the first end of the first channel region.

10. The device of claim 8, wherein the interconnect structure further includes a test structure, the test structure comprising a conductive line electrically connecting the third contact and the second contact, the conductive line extending in the first horizontal direction.

11. The device of claim 9, wherein the interconnect structure further includes a test structure, the test structure comprising a conductive line electrically connecting the first contact and a fourth contact, the conductive line extending in a second horizontal direction perpendicular to the first horizontal direction.

12. The device of claim 9, wherein the interconnect structure further includes a test structure, the test structure comprising:

a plurality of first conductive lines extending in the first horizontal direction, respective first conductive lines electrically connecting respective word lines in different layers of the memory array; and a plurality of second conductive lines extending perpendicular to the first horizontal direction, respective second conductive lines electrically connecting respective word lines in the same layer of the memory array.

13. The device of claim 11, wherein the test structure connects a plurality of word lines of the memory array into a series circuit.

14. The device of claim 8, wherein the first memory films are ferroelectric materials.

15. The device of claim 14, wherein the ferroelectric materials are selected from the group consisting of hafnium oxide, hafnium zirconium oxide, and silicon-doped hafnium oxide.

16. The device of claim 8, further comprising a dielectric layer covering the first word line, the second word line, and the third word line, and wherein an interface between the dielectric layer and the first word line, the second word line, and the third word line forms a staircase structure.

17. A device, comprising:

a three-dimensional memory array comprising a stack of layers, each layer including a plurality of parallel word lines and a plurality of memory cell between adjacent words, each word line in a layer of the stack of layers having the same length and each word line in a layer of the stack of layers having a length that is less than the length of each word line in a lower layer of the stack of layers;

a plurality of vertically extending conductive vias, each vertically extending conductive via of the plurality of vertically extending conductive vias landing on one end of a respective word line of the plurality of parallel word lines of the stack of layers; and a test structure overlying the three-dimensional memory array, the test structure including first conductors electrically connecting respective word lines of a same layer of the stack of layers, and second conductors electrically connecting respective word lines in different layers of the stack of layers.

18. The device of claim 17, wherein the test structure electrically connects all the word lines of the three-dimensional memory array in series.

19. The device of claim 17, wherein at least one first conductor or at least one second conductor of the test structure extends to a boundary of the three-dimensional memory array.

20. The device of claim 17, wherein all first conductors and all second conductors are formed in a same metallization layer.

* * * * *